(12) United States Patent
Takada et al.

(10) Patent No.: US 11,584,810 B2
(45) Date of Patent: Feb. 21, 2023

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD OF MANUFACTURING ELECTRONIC DEVICE, COMPOUND, AND RESIN

(71) Applicant: FUJIFILM Corporation, Tokyo (JP)

(72) Inventors: Akira Takada, Haibara-gun (JP); Ryo Nishio, Haibara-gun (JP); Akiyoshi Goto, Haibara-gun (JP); Michihiro Shirakawa, Haibara-gun (JP); Naohiro Tango, Haibara-gun (JP); Kazuhiro Marumo, Haibara-gun (JP); Kyohei Sakita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 414 days.

(21) Appl. No.: 16/266,719

(22) Filed: Feb. 4, 2019

(65) Prior Publication Data

US 2019/0171104 A1   Jun. 6, 2019

Related U.S. Application Data

(63) Continuation of application No. PCT/JP2017/025775, filed on Jul. 14, 2017.

(30) Foreign Application Priority Data

Aug. 26, 2016 (JP) .............................. JP2016-166257
Sep. 9, 2016 (JP) .............................. JP2016-177099
Dec. 22, 2016 (JP) .............................. JP2016-250131
Feb. 20, 2017 (JP) .............................. JP2017-029397

(51) Int. Cl.

| $G03F 7/039$ | (2006.01) |
|---|---|
| $G03F 7/20$ | (2006.01) |
| $C08F 20/24$ | (2006.01) |
| $G03F 7/004$ | (2006.01) |
| $G03F 7/32$ | (2006.01) |
| $C08F 20/26$ | (2006.01) |
| $G03F 7/11$ | (2006.01) |
| $C08F 220/18$ | (2006.01) |
| $C08L 33/14$ | (2006.01) |

(52) U.S. Cl.

CPC .............. *C08F 20/24* (2013.01); *C08F 20/26* (2013.01); *C08F 220/1818* (2020.02); *C08L 33/14* (2013.01); *G03F 7/0046* (2013.01); *G03F 7/039* (2013.01); *G03F 7/0397* (2013.01); *G03F 7/11* (2013.01); *G03F 7/2002* (2013.01); *G03F 7/2041* (2013.01); *G03F 7/32* (2013.01); *G03F 7/322* (2013.01)

(58) Field of Classification Search

CPC ........ G03F 7/039; G03F 7/0392; G03F 7/038; G03F 7/0045; G03F 7/0046; G03F 7/2004

See application file for complete search history.

(56) References Cited

U.S. PATENT DOCUMENTS

| 2003/0003392 A1 | 1/2003 | Niwa et al. |
|---|---|---|
| 2011/0255061 A1 | 10/2011 | Wang et al. |
| 2012/0270155 A1 | 10/2012 | Komuro et al. |
| 2012/0328982 A1 | 12/2012 | Iwasawa et al. |
| 2015/0093691 A1 | 4/2015 | Shibuya |

(Continued)

FOREIGN PATENT DOCUMENTS

| CN | 104364714 A | 2/2015 |
|---|---|---|
| CN | 105103051 A | 11/2015 |
| CN | 105122138 A | 12/2015 |

(Continued)

OTHER PUBLICATIONS

Office Action dated Mar. 19, 2021 from the Taiwanese Intellectual Property Office in TW Application No. 106124207.

(Continued)

*Primary Examiner* — Daborah Chacko-Davis
(74) *Attorney, Agent, or Firm* — Sughrue Mion, PLLC

(57) ABSTRACT

An actinic ray-sensitive or radiation-sensitive resin composition contains a resin (C) having a repeating unit represented by Formula (1). A pattern forming method includes a step of forming a film with the actinic ray-sensitive or radiation-sensitive resin composition, and a method of manufacturing an electronic device includes the pattern forming method.

(1)

in Formula (1), Z represents a halogen atom, a group represented by $R_{11}OCH_2$—, or a group represented by $R_{12}OC(=O)CH_2$—. $R_{11}$ and $R_{12}$ each represent a monovalent substituent. X represents an oxygen atom or a sulfur atom. L represents a (n+1)-valent linking group. R represents a group having a group that is decomposed due to the action of an alkali developer to increase solubility in an alkali developer, n represents a positive integer.

16 Claims, No Drawings

(56) References Cited

U.S. PATENT DOCUMENTS

| | | | |
|---|---|---|---|
| 2016/0011517 A1 | 1/2016 | Takizawa et al. | |
| 2016/0041465 A1 | 2/2016 | Takizawa et al. | |

FOREIGN PATENT DOCUMENTS

| | | | |
|---|---|---|---|
| JP | 2001-226432 A | 8/2001 |
| JP | 2011-002805 A | 1/2011 |
| JP | 2012-224586 A | 11/2012 |
| JP | 2012-242800 A | 12/2012 |
| JP | 2013-513827 A | 4/2013 |
| JP | 2014-052547 A | 3/2014 |
| JP | 2016-170230 A | 9/2016 |
| KR | 2002-0071842 A | 9/2002 |
| KR | 10-2012-0120981 A | 11/2012 |
| TW | 201302815 A | 1/2013 |
| WO | 01/98833 A1 | 12/2001 |

OTHER PUBLICATIONS

Communication dated Sep. 28, 2020, issued by the Taiwanese Patent Office in application No. 106124207.

Notification of Reason for Refusal dated Jul. 2, 2020, from the Korean Intellectual Property Office in Application No. 10-2019-7003926.

Notice of Reasons for Refusal dated Mar. 24, 2020 from the Japanese Patent Office in application No. 2018-535521.

International Search Report dated Oct. 10, 2017 in International Application No. PCT/JP2017/025775.

Written Opinion of the International Searching Authority dated Oct. 10, 2017 in International Application No. PCT/JP2017/025775.

International Preliminary Report on Patentability dated Feb. 26, 2019 in International Application No. PCT/JP2017/025775.

Office Action dated Sep. 17, 2021 in Chinese Application No. 201780052378.8.

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD OF MANUFACTURING ELECTRONIC DEVICE, COMPOUND, AND RESIN

CROSS-REFERENCE TO RELATED APPLICATIONS

This application is a Continuation of PCT International Application No. PCT/JP2017/025775 filed on Jul. 14, 2017, which claims priority under 35 U.S.C § 119(a) to Japanese Patent Application No. 2016-166257 filed on Aug. 26, 2016, Japanese Patent Application No. 2016-177099 filed on Sep. 9, 2016, Japanese Patent Application No. 2016-250131 filed on Dec. 22, 2016, and Japanese Patent Application No. 2017-029397 filed on Feb. 20, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, an actinic ray-sensitive or radiation-sensitive film, a pattern forming method, a method of manufacturing an electronic device, a compound, and a resin.

2. Description of the Related Art

A pattern forming method using chemical amplification is used in order to compensate for sensitivity reduction due to light absorption after a resist for KrF excimer laser (248 nm). For example, in a positive chemical amplification method, first, a photoacid generator included in an exposed portion is decomposed by light irradiation to generate an acid. In the baking (Post Exposure Bake: PEB) process after exposure or the like, due to the catalytic action of the generated acid, the alkali-insoluble group included in the photosensitive composition is changed to an alkali-soluble group. Thereafter, development is performed, for example, with an alkali solution. Accordingly, the exposed portion is removed so as to obtain a desired pattern.

In the method, as the alkali developer, various alkali developers are suggested. For example, as the alkali developer, an aqueous alkali developer of a 2.38 mass % tetramethyl ammonium hydroxide aqueous solution (TMAH) is widely used.

In order to miniaturize a semiconductor element, the wavelength of the exposure light source has been shortened and the numerical aperture (NA) of the projection lens has been increased, and at the present time, an exposure machine using an ArF excimer laser having a wavelength of 193 nm as a light source has been developed. As a technique for further improving the resolving power, a method (that is, an immersion method) of filling a liquid (hereinafter also referred to as an "immersion liquid") having a high refractive index between the projection lens and the sample has been proposed (for example, see JP2011-002805A, JP2012-242800A, and JP2013-513827A).

SUMMARY OF THE INVENTION

Recently, on demand for improving the productivity of various electronic apparatus, it has been required to form an intended resist pattern in a shorter time even in the formation of a resist pattern.

In view of this, the present inventors have studied to improve the scanning speed in an exposure step using an immersion exposure device as a method of shortening the time for forming a resist pattern, and as a result, have found that, in a case where a scanning speed of the exposure is set to be ultrahigh, it is extremely difficult to suppress various kinds of defects while high followability of the immersion liquid with respect to the exposure device is maintained.

Here, the present invention is to provide an actinic ray-sensitive or radiation-sensitive resin composition having high followability of the immersion liquid with respect to the exposure device even in a case where a scanning speed of the exposure is set to be ultrahigh (for example, 700 mm/sec or faster) and capable of suppressing both scum (immersion defects) and development defects, and an actinic ray-sensitive or radiation-sensitive film, a pattern forming method, and a method of manufacturing an electronic device which use the composition.

The present invention is to provide a compound and a resin suitably used in the preparation of an actinic ray-sensitive or radiation-sensitive resin composition.

That is, the present inventors have found that the above problems can be solved by the following configurations.

[1] An actinic ray-sensitive or radiation-sensitive resin composition comprising: a resin (C) having a repeating unit represented by Formula (1),

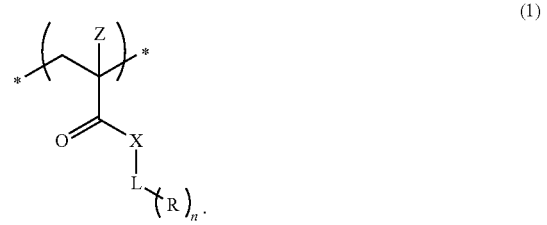

in Formula (I), Z represents a halogen atom, a group represented by $R_{11}OCH_2$—, or a group represented by $R_{12}OC(=O)CH_2$—, $R_{11}$ and $R_{12}$ each independently represent a monovalent substituent, X represents an oxygen atom or a sulfur atom, L represents a (n+1)-valent linking group, R represents a group having a group that is decomposed due to the action of an alkali developer to increase solubility in an alkali developer, n represents a positive integer, and in a case where n is 2 or more, a plurality of R's may be identical to or different from each other.

[2] The actinic ray-sensitive or radiation-sensitive resin composition according to [1], in which the repeating unit represented by Formula (1) is a repeating unit represented by Formula (2) or (3),

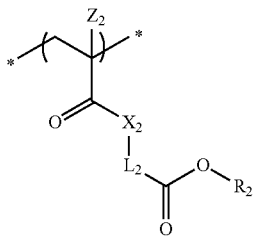
(2)

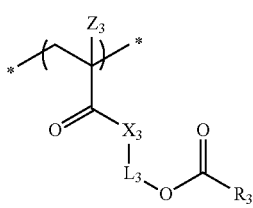
(3)

in Formula (2), $R_2$ represents an electron withdrawing group, $L_2$ represents a divalent linking group, $X_2$ represents an oxygen atom or a sulfur atom, and $Z_2$ represents a halogen atom.

in Formula (3), $R_3$ represents an electron withdrawing group, $L_3$ represents a divalent linking group, $X_3$ represents an oxygen atom or a sulfur atom, and $Z_3$ represents a halogen atom.

[3] The actinic ray-sensitive or radiation-sensitive resin composition according to [1], in which the repeating unit represented by Formula (I) is a repeating unit represented by Formula (4),

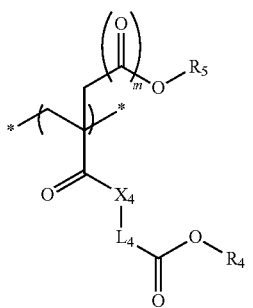
(4)

in Formula (4), $R_4$ represents an electron withdrawing group, R represents a hydrogen atom, an alkyl group, or an aryl group, $L_4$ represents a divalent linking group, $X_4$ represents an oxygen atom or a sulfur atom, and m represents 1 or 1.

[4] The actinic ray-sensitive or radiation-sensitive resin composition according to [1], in which the repeating unit represented by Formula (1) is a repeating unit represented by Formula (5),

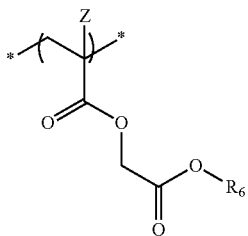
(5)

in Formula (5), Z represents a halogen atom, a group represented by $R_{11}OCH_2-$, or a group represented by $R_{12}OC(=O)CH_2-$, $R_{11}$ and $R_{12}$ each independently represent a monovalent substituent, and $R_6$ represents an electron withdrawing group.

[5] The actinic ray-sensitive or radiation-sensitive resin composition according to any one of [1] to [4], in which, in a case where an actinic ray-sensitive or radiation-sensitive film is formed, a receding contact angle of water on the actinic ray-sensitive or radiation-sensitive film is 75° or more.

[6] An actinic ray-sensitive or radiation-sensitive film formed of the actinic ray-sensitive or radiation-sensitive resin composition according to any one of [1] to [5].

[7] A pattern forming method comprising: (i) forming an actinic ray-sensitive or radiation-sensitive film with the actinic ray-sensitive or radiation-sensitive resin composition according to any one of [1] to [5]; (ii) irradiating the actinic ray-sensitive or radiation-sensitive film with actinic rays or radiation; and (iii) developing the actinic ray-sensitive or radiation-sensitive film irradiated with actinic ray or radiation with a developer.

[8] The pattern forming method according to [7], in which the developer is an alkali developer.

[9] A method of manufacturing an electronic device, comprising: the pattern forming method according to [7] or [8].

[10] A compound represented by Formula (1M),

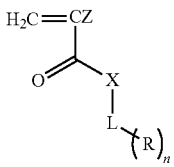
(1M)

in Formula (1M), Z represents a halogen atom, a group represented by $R_{11}OCH_2-$, or a group represented by $R_{12}OC(=O)CH_2-$, $R_{11}$ and $R_{12}$ each independently represent a monovalent substituent, X represents an oxygen atom or a sulfur atom, L represents a (n+1)-valent linking group, R represents a group having a group that is decomposed due to the action of an alkali developer to increase solubility in an alkali developer, n represents a positive integer, and in a case where n is 2 or more, a plurality of R's may be identical to or different from each other.

[11] A resin having: a repeating unit represented by Formula (1),

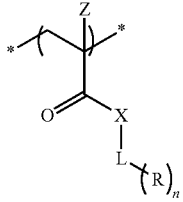

(1)

in Formula (1), Z represents a halogen atom, a group represented by $R_{11}OCH_2-$, or a group represented by $R_{12}OC(=O)CH_2-$, $R_{11}$ and $R_{12}$ each independently represent a monovalent substituent, X represents an oxygen atom or a sulfur atom, L represents a (n 1)-valent linking group, R represents a group having a group that is decomposed due to the action of an alkali developer to increase solubility in an alkali developer, n represents a positive integer, and in a case where n is 2 or more, a plurality of R's may be identical to or different from each other.

According to the present invention, it is possible to provide an actinic ray-sensitive or radiation-sensitive resin composition having high followability of an immersion liquid with respect to an exposure device even in a case where a scanning speed of exposure is set to be ultrahigh (for example, 700 mm/sec or faster) and capable of suppressing both scum (immersion defects) and development defects, and an actinic ray-sensitive or radiation-sensitive film, a pattern forming method, and a method of manufacturing an electronic device, which use the composition.

According to the present invention, it is possible to provide a compound and a resin that can be suitably used in the preparation of the actinic ray-sensitive or radiation-sensitive resin composition.

DESCRIPTION OF THE PREFERRED EMBODIMENTS

Hereinafter, the present invention is specifically described.

The following description of constituent elements may be made based on a representative embodiment of the present invention, but the present invention is not limited to the embodiment.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

An "actinic ray" or a "radiation" in the present specification, for example, means a bright line spectrum of a mercury lamp, a far ultraviolet ray represented by an excimer laser, an extreme ultraviolet ray (EUV ray), an X-ray, and an electron beam (EB). In the present invention, the light means actinic rays or radiation.

Unless described otherwise, the "exposure" in the present specification include not only exposure to a bright line spectrum of a mercury lamp, a far ultraviolet ray represented by an excimer laser, an extreme ultraviolet ray (EUV), and an X-ray but also drawing by a particle ray such as an electron beam and an ion beam.

In the present specification, "to" is used to mean that the numerical values listed before and after "to" are a lower limit and an upper limit respectively.

In the present specification, "(meth)acrylate" represents acrylate and methacrylate, and "(meth)acryl" means acryl and methactyl.

In the present specification, a weight-average molecular weight (Mw), a number-average molecular weight (Mn), and a dispersion degree (Mw/Mn) of the resin are defined as values in terms of polystyrene by GPC measurement (solvent: tetrahydrofuran, flow rate (sample injection amount): 10 µl, column: TSK gel Multipore HXL-M (×4 items) manufactured by Tosoh Corporation, Column temperature: 40° C., Flow rate: 1.0 ml/min, Detector: differential refractive index (RI) detector) with a Gel Permeation Chromatography (GPC) device (HLC-8120 GPC manufactured by Tosoh Corporation).

[Actinic Ray-Sensitive or Radiation-Sensitive Resin Composition]

As described above, the actinic ray-sensitive or radiation-sensitive resin composition according to the embodiment of the present invention contains a resin (C) having a repeating unit represented by Formula (1),

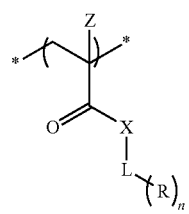

(1)

In Formula 1), Z represents a halogen atom, a group represented by $R_{11}OCH_2-$, or a group represented by $R_{12}OC(=O)CH_2-$. $R_{11}$ and $R_{12}$ each independently represent a monovalent substituent. X represents an oxygen atom or a sulfur atom. L represents a (n+1)-valent linking group. R represents a group having a group that is decomposed due to the action of an alkali developer such that solubility increases in an alkali developer. n represents a positive integer. In a case where n is 2 or more, a plurality of R's may be identical to or different from each other.

Since the present invention has the above configuration, in the high speed scanning of exposure, followability of an immersion liquid is high, and both of scum (immersion defect) and development defects can be reduced.

The reason is not clear, but it is assumed as follows.

First, in the immersion exposure step, an exposure device (specifically, exposure head) scans a wafer at a high speed to form an exposure pattern, and an immersion liquid is required to move on the wafer following the movement of the formation of the exposure pattern. Therefore, it is considered that a contact angle of an immersion liquid with respect to the actinic ray-sensitive or radiation-sensitive film in a dynamic state becomes important, and thus a performance of following scanning of an exposure head at a high speed without remaining liquid droplets is required in the actinic ray-sensitive or radiation-sensitive film.

The resin (C) has a halogen atom, a group represented by $R_{11}OCH_2-$, or a group represented by $R_{12}OC(=O)CH_2-$ as Z that is bonded to a main chain of a resin.

Here, it is considered that, in a case Where Z is a halogen atom, particularly a fluorine atom, hydrophobicity of the resin (C) becomes high, and in a case where the actinic ray-sensitive or radiation-sensitive film is formed with the composition according to the embodiment of the present invention, a receding contact angle of water on the actinic ray-sensitive or radiation-sensitive film becomes extremely high.

Also in a case where Z is a halogen atom other than fluorine, as a result of the research by the present inventors, it has been found that, though the reason thereof is not clear, the receding contact angle of water on the actinic ray-sensitive or radiation-sensitive film can be caused to be extremely high.

It is considered that, in a case where Z is a group represented by $R_{11}OCH_2$— or a group represented by $R_{11}OC(=O)CH_2$—, since these groups are bonded to a main chain of the resin, the steric hindrance by a side chain near the main chain of the resin increases. Accordingly, since the rigidity of a main chain skeleton of the resin increases, in Formula (1), a group R which is present at a position distant from the main chain by being bonded via a linking group L to the main chain and typically, has high hydrophobicity tends to be outwardly present in the random coil of the resin. As a result, it is considered that the hydrophobicity of the resin (C) increases, in a case where the actinic ray-sensitive or radiation-sensitive film is formed of the composition according to the embodiment of the present invention, a receding contact angle of water becomes extremely high on the actinic ray-sensitive or radiation-sensitive film.

As described above, according to the present invention, first, it is considered that, since, in a case where the actinic ray-sensitive or radiation-sensitive film is formed of the composition, the receding contact angle of water on the actinic ray-sensitive or radiation-sensitive film becomes extremely high, even in a case where the scanning speed of the exposure becomes ultrahigh (for example, 700 mm/sec or faster), followability of the immersion liquid with respect to the exposure device can be sufficiently obtained, and thus scum (immersion defect) can be reduced.

The resin (C) has a group R in the repeating unit represented by Formula (1), as a group having a group that is decomposed due to an action of the alkali developer and of which the solubility in the alkali developer increases. Accordingly, as described above, it is considered that since the actinic ray-sensitive or radiation-sensitive film that can be obtained from the composition containing the resin (C) is in a state in which a receding contact angle of water is high before exposure and is in a state in which solubility to the alkali developer becomes extremely high after exposure development, development defects was able to be sufficiently decreased.

The actinic ray-sensitive or radiation-sensitive resin composition according to the embodiment of the present invention is preferably a resist composition and may be a positive resist composition or a negative resist composition, but a positive resist composition is preferable.

The resist composition of the present invention may be a resist composition for alkali development and a resist composition for developing an organic solvent, but is preferably a resist composition for alkali development.

The resist composition of the present invention is typically a chemically amplified resist composition.

Hereinafter, components included in the actinic ray-sensitive or radiation-sensitive resin composition (resist composition of the embodiment of the present invention) of the embodiment of the present invention are described.

<Resin (A)>

The actinic ray-sensitive or radiation-sensitive resin composition according to the embodiment of the present invention can contain a resin (hereinafter, referred to as an "acid-decomposable resin" or a "resin (A)") that is decomposed due to an action of an acid and of which solubility increases in an alkali developer.

The acid-decomposable resin has a group (hereinafter, referred to as an "acid-decomposable group") that is decomposed due to an action of an acid and produces an alkali-soluble group in a main chain, a side chain, or both of the main chain and the side chain of the resin.

The resin (A) is preferably insoluble or poorly soluble in an alkali developer.

The acid-decomposable group preferably has a structure of being protected by a group of decomposing and leaving an alkali-soluble group due to an action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl) imide group, a bis(alkylcarbonyl) methylene group, a bis(alkylcarbonyl) imide group, a bis(alkylsulfonyl) methylene group, a bis(alkylsulfonyl) imide group, a tris(alkylcarbonyl) methylene group, and a tris(alkylsulfonyl) methylene group.

Preferable examples of the alkali-soluble group include a carboxyl group, a fluorinated alcohol group (preferably a hexafluoroisopropanol group), and a sulfonic acid group.

A group which is preferable as the acid-decomposable group is a group in which a hydrogen atom of the alkali-soluble group is substituted with a group that is left by an acid.

Examples of the group that is left by an acid include —$C(R_{36})(R_{37})(R_{38})$, —$C(R_{36})(R_{37})(OR_{39})$, and —$C(R_{01})(R_{02})(OR_{39})$.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other, so as to form a ring.

$R_{01}$ and $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, a tertiary alkyl ester group and the like. A tertiary alkyl ester group is more preferable.

A repeating unit that can be included in the resin (A) and has an acid-decomposable group is preferably a repeating unit represented by Formula (AI).

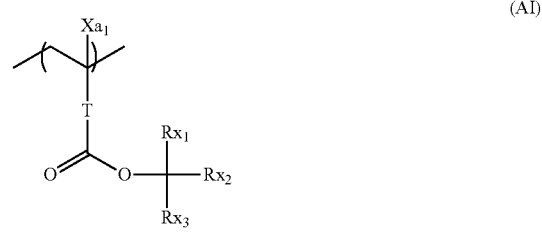

(AI)

In Formula (AI), $Xa_1$ represents a hydrogen atom or an alkyl group that may have a substituent.

T represents a single bond or a divalent linking group.

$Rx_1$ to $Rx_3$ each independently represent a (linear or branched) alkyl group or a (monocyclic or polycyclic) cycloalkyl group.

Two of $Rx_1$ to $Rx_3$ are bonded to form a (monocyclic or polycyclic) cycloalkyl group.

Examples of the alkyl group that is represented by $Xa_1$ and may have a substituent include a methyl group or a group represented by —$CH_2$—$R_{11}$. $R_{11}$ represents a halogen atom (such as a fluorine atom), a hydroxyl group, or a monovalent group, examples of the monovalent organic group include an alkyl group having 5 or less carbon atoms and an acyl group having 5 or less carbon atoms, and an alkyl group having 3 or less carbon atoms is preferable, and a methyl group is more preferable. According to an aspect, $Xa_1$ is preferably a hydrogen atom, a methyl group, a trifluoromethyl group, or a hydroxymethyl group.

Examples of the divalent linking group of T include an alkylene group, a —COO—Rt- group, and an —O-Rt- group. In the formula, Rt represents an alkylene group or a cycloalkylene group.

T preferably a single bond or a —COO-Rt- group. Rt is preferably an alkylene group having 1 to 5 carbon atoms and more preferably —$CH_2$— a group, a —$(CH_2)_2$— group, and a —$(CH_2)_3$— group.

The alkyl group of $Rx_1$ to $Rx_3$ is preferably a group having 1 to 4 carbon atoms such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, a polycyclic cycloalkyl group such as a norbornyl group, a tetracyclodecanyl group, a tetracyclododecanyl group, and an adamantyl group.

The cycloalkyl group formed by bonding two of $Rx_1$ to $Rx_3$ is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group. The monocyclic cycloalkyl group having 5 to 6 carbon atoms is particularly preferable.

With respect to the cycloalkyl group formed by bonding two of $Rx_1$ to $Rx_3$, for example, one of the methylene groups constituting the ring may be substituted with a hetero atom such as an oxygen atom or a group having a hetero atom such as a carbonyl group.

It is preferable that the repeating unit represented by Formula (AI), for example, is an aspect in which $Rx_1$ is a methyl group or an ethyl group, and in which and $Rx_2$ and $Rx_3$ are bonded to each other to form the above cycloalkyl group.

Each of the above groups may have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and a group having 8 or less carbon atoms is preferable.

The content of the sum of the repeating units having acid-decomposable groups is preferably 20 to 80 mol %, more preferably 25 to 75 mol %, and even more preferably 30 to 70 mol % with respect to the total repeating units in the resin (A).

Specifically, specific examples disclosed in <0265> of US2012/0135348A1 can be used, but the present invention is not limited thereto.

The resin (A) preferably contains a repeating unit represented by Formula (3) as the repeating unit represented by Formula (AI).

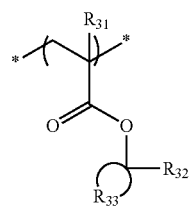

(3)

In Formula (3), $R_{31}$ represents a hydrogen atom or an alkyl group.

$R_{32}$ represents a methyl group, an ethyl group, an n-propy group, an isopropyl group, an n-butyl group, an isobutyl group, or a sec-butyl group.

$R_{33}$ represents an atomic group required for forming a monocyclic alicyclic hydrocarbon structure together with a carbon atom to which $R_{32}$ is bonded. In the alicyclic hydrocarbon structure, a portion of the carbon atoms constituting a ring may be substituted with a hetero atom or a group having a hetero atom.

The alkyl group of $R_{31}$ may have a substituent, and examples of the substituent include a fluorine atom and a hydroxyl group.

$R_{31}$ preferably represents a hydrogen atom, a methyl group, a trifluoromethyl group, or a hydroxymethyl group.

$R_{32}$ is preferably a methyl group, an ethyl group, an n-propyl group, or an isopropyl group, and is more preferably a methyl group or an ethyl group.

The monocyclic alicyclic hydrocarbon structure that is formed by $R_{33}$ together with a carbon atom is preferably a 3-membered to 8-membered ring and more preferably a 5-membered or 6-membered ring.

In the monocyclic alicyclic hydrocarbon structure that is formed by $R_{33}$ together with a carbon atom, examples of the hetero atom that can constitute a ring include an oxygen atom and a sulfur atom, and examples of the group having a hetero atom include a carbonyl group. Here, the group having a hetero atom is preferably not an ester group (ester bond).

The monocyclic alicyclic hydrocarbon structure that is formed by $R_{33}$ together with a carbon atom is preferably formed only of a carbon atom and a hydrogen atom.

The repeating unit represented by Formula (3) is preferably a repeating unit represented by Formula (3').

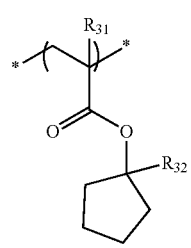

(3')

In Formula (3'), $R_{31}$ and $R_{32}$ are respectively the same as those in Formula (3).

Specific examples of the repeating unit having a structure represented by Formula (3) include the following repeating units, but the present invention is not limited thereto.

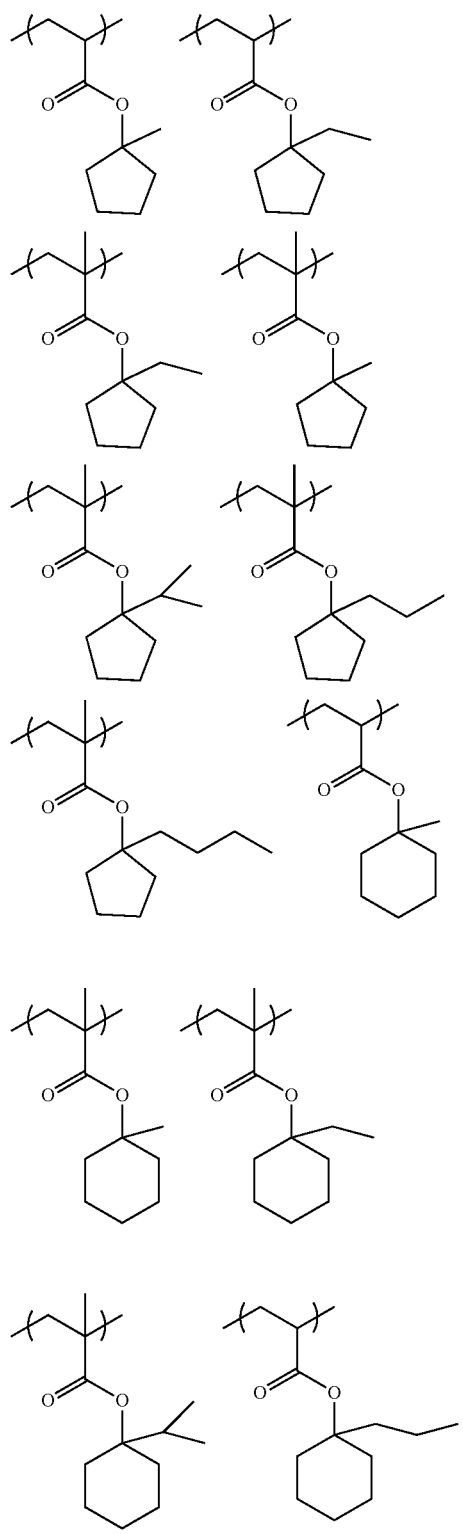

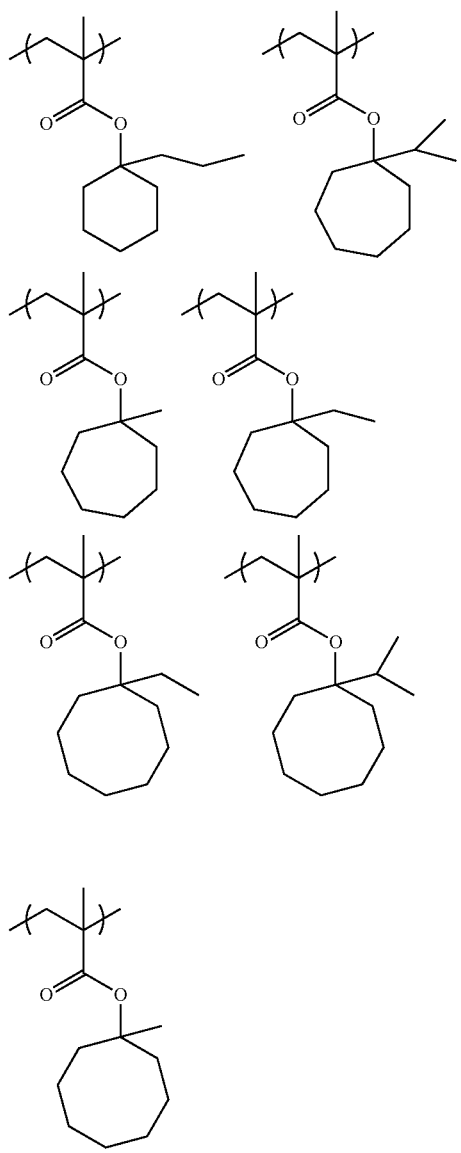

The content of the repeating units having a structure represented by Formula preferably 20 to 80 mol %, more preferably 25 to 75 mol %, and even more preferably 30 to 70 mol % with respect to the total repeating units in the resin (A).

The resin (A) is more preferably a resin having, for example, at least any one of a repeating unit represented by Formula (I) or a repeating unit represented by Formula (II), as a repeating unit represented by Formula (AI).

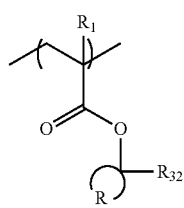

(I)

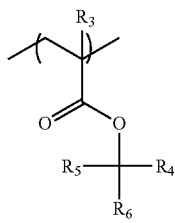

(II)

In Formulae (I) and (II), $R_1$ and $R_3$ each independently represent a hydrogen atom, a methyl group that may have a substituent, or a group represented by —$CH_2$—$R_{11}$. $R_{11}$ represents a monovalent organic group.

$R_2$, $R_4$, $R_5$, and $R_6$ each independently represent an alkyl group or a cycloalkyl group.

R represents an atomic group required for forming an alicyclic structure together with a carbon atom to which $R_2$ is bonded.

$R_1$ and $R_3$ each preferably represent a hydrogen atom, a methyl group, a trifluoromethyl group, or a hydroxy methyl group. Specific examples and preferable examples of the monovalent organic group in $R_{11}$ are the same as those described in $R_{11}$ of Formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having 1 to 10 carbon atoms, and even more preferably an alkyl group having 1 to 5 carbon atoms, and examples thereof include a methyl group and an ethyl group.

R represents an atomic group required for forming an alicyclic structure together with a carbon atom. The alicyclic structure formed by R together with the carbon atom is preferably a monocyclic alicyclic structure, and the number of carbon atoms is preferably 3 to 7 and more preferably 5 or 6.

$R_3$ is preferably a hydrogen atom or a methyl group and more preferably a methyl group.

An alkyl group in $R_4$, $R_5$, and $R_6$ may be linear or branched and may have a substituent. The alkyl group is preferably a group having 1 to 4 carbon atoms such as a methyl group, an ethyl group, an n-propyl group, an isopropyl group, an n-butyl group, an isobutyl group, and a t-butyl group.

The cycloalkyl group in $R_4$, $R_5$, and $R_6$ may be monocyclic or polycyclic and may have a substituent. The cycloalkyl group is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group.

Examples of the substituent that may have each of the above groups include those described as the substituents that may have each of the above groups in Formula (AI).

The acid-decomposable resin is more preferably a resin including a repeating unit represented by Formula (I) and a repeating unit represented by Formula (II), as the repeating unit represented by Formula (AI).

According to another aspect, the repeating unit represented by Formula (AI) is more preferably a resin including at least two repeating units represented by Formula (I). In a case where two or more kinds of repeating units of Formula (I) are included, it is preferable to include both of a repeating unit in which an alicyclic structure formed by R together with a carbon atom is a monocyclic alicyclic structure and a repeating unit in Which an alicyclic structure formed by R together with a carbon atom is a polycyclic alicyclic structure. The monocyclic alicyclic structure preferably has 5 to 8 carbon atoms, more preferably 5 or 6 carbon atoms, and particularly preferably 5 carbon atoms. The polycyclic alicyclic structure is preferably a norbornyl group, a tetracyclodecanyl group, a tetracyclododecanyl group, and art adamantyl group.

The repeating unit having an acid-decomposable group that is contained in the resin (A) may be used singly or two or more kinds thereof may be used in combination. In a case where two or more kinds thereof are used in combination, specific examples disclosed in <0287> of US2012/0135348A1 can be used, but the present invention is not limited thereto.

According to an aspect, the resin (A) preferably contains a repeating unit having a cyclic carbonic acid ester structure. This cyclic carbonic acid ester structure is a structure having a ring including a bond represented by —O—C(=O)—O— as the atomic group constituting the ring. A ring including a bond represented by —O—C(=O)—O— as the atomic group constituting the ring is preferably a 5-membered to 7-membered ring and most preferably a 5-membered ring. The ring may be fused with another ring to form a fused ring.

The resin (A) preferably contains a repeating unit having a lactone structure or a sultone (cyclic sulfonic acid ester) structure.

As the lactone group or the sultone group, any group having a lactone structure or a sultone structure can be used, but a lactone structure or a sultone structure of 5-membered to 7-membered ring is preferable, and it is preferable that another ring structure is fused to a lactone structure or a sultone structure of 5-membered to 7-membered ring in a form of forming a bicyclo structure or a Spiro structure. It is more preferable that the resin has a repeating unit having a lactone structure or a sultone structure represented by any one of Formulae (LC1-1) to (LC1-17) and Formulae (SL1-1) and (SL1-2) disclosed in <0318> of US2012/0135348A1. A lactone structure or a sultone structure is directly bonded to a main chain. As the lactone structure or the sultone structure, (LC1-1), (LC1-4), (LC1-5), and (LC1-8) are preferable, and (LC1-4) is more preferable. By using a specific lactone structure or a specific sultone structure is used, LWR and development defects are improved.

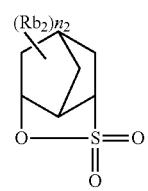

SL1-1

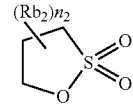

SL1-2

In Formulae (SL1-1) and (SL1-2), $Rb_2$ represents a substituent. $n_2$ represents an integer of 0 to 4. Preferable examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, and an acid-decomposable group. In a case where $n_2$ is 2 or more, the plurality of substituents ($Rb_2$) which are present may be identical to or different from each other, and the plurality of substituent ($Rb_2$) which are bonded to each other to form a ring.

It is preferable that the resin (A) contains a repeating unit having a lactone structure or a sultone structure represented by Formula (III).

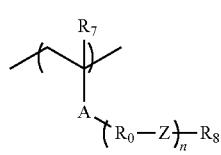

(III)

In Formula (III),

A represents an ester bond (a group represented by —COO—) or an amide bond (a group represented by —CONH—).

In a case where there are a plurality of $R_0$'s, $R_0$'s each independently represent an alkylene group, a cycloaklene group, or a combination thereof.

In a case where there are a plurality of Z's, Z's each independently represents a single bond, an ether bond, an ester bond, an amide bond, a urethane bond

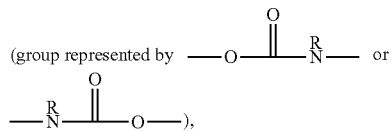

(group represented by or a urea bond

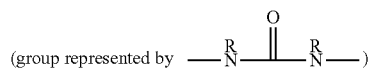

(group represented by

Here, R's each independently represent a hydrogen atom, an alkyl group, a cycloalkyl group, and an aryl group.

$R_8$ represents a monovalent organic group having a lactone structure or a sultone structure.

n is the number of repetitions of the structure represented by —$R_0$—Z— and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond and an ester bond and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$ and the alkyl group in $R_7$ may be respectively substituted with each other, and examples of the substituent include a halogen atom such as a fluorine atom, a chlorine atom, and a bromine atom, an alkoxy group such as a mercapto group, a hydroxy group, a methoxy group, an ethoxy group, an isopropoxy group, a t-butoxy group, and a benzvloxy group, and an acetoxy group such as an acetyloxy group and a propionyloxy group. $R_7$ is preferably a hydrogen atom, a methyl group, a trifluorotnethyl group, or a hydroxvmethyl group.

A preferable chain alkylene group in $R_0$ is preferably a chain alkylene having 1 to 10 carbon atoms, more preferably a chain alkylene having 1 to 5 carbon atoms, and examples thereof include a methylene group, an ethylene group, and a propylene group. A preferable cycloalkylene group is a cycloalkylene group having 3 to 20 carbon atoms, and examples thereof include a cyclohexylene group, a cyclopentylene group, a norbomylene group, and an adamantylene group. In order to exhibit the effect of the present invention, a chain alkylene group is more preferable, and a methylene group is particularly preferable.

The monovalent inorganic group having a lactone structure or a sultone structure represented by $R_8$ is not limited, as long as the monovalent inorganic group has a lactone structure or a sultone structure, and specific examples thereof include a lactone structure or a sultone structure represented by Formulae (LC1-1) to (LC1-17), (SL1-1), and (SLI-2), and a structure represented by (LC1-4) is particularly preferable. $n_2$ in (LC1-1) to (LC1-17), (SLI-1), and (SL1-2) is more preferably 2 or less.

$R_8$ is preferably a monovalent organic group having an unsubstituted lactone structure or an unsubstituted sultone structure or a monovalent organic group having a lactone structure or a sultone structure having a methyl group, a cyano group, or an alkoxycarbonyl group as a substituent and more preferably a monovalent organic group having a lactone structure (cyano lactone) or sultone structure (cyano sultone) having a cyano group as a substituent.

In Formula (III), n is preferably 1 or 2.

Specific examples of the repeating unit having a lactone structure or a sultone structure represented by Formula (III) include repeating units disclosed in <0305> of US2012/0135348A1, and the present invention is not limited thereto.

The repeating unit having a lactone structure or a sultone structure is more preferably a repeating unit represented by Formula (III-1) or (III-1').

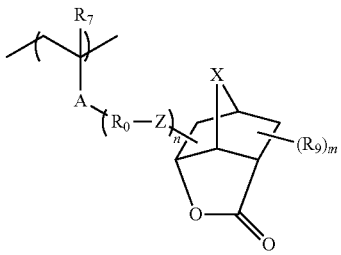

(III-1)

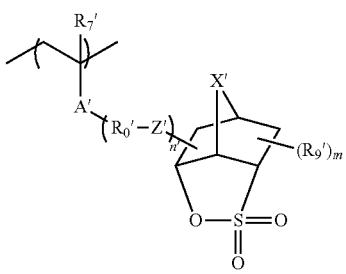

(III-1')

In Formulae (III-1) and (III-1'), $R_7$, A, $R_0$, Z, and n have the same meaning as those in Formula (III).

$R_7'$, A', $R_0'$, Z', and n' have the same meaning as $R_7$, A, $R_0$, Z, and n in Formula (III).

In a case where there are a plurality of $R_9$'s, $R_9$'s each independently represent an alkyl group, a cycloalkyl group, an alkoxycarbonyl group, a cyano group, a hydroxyl group, or an alkoxy group, and in a case where there are a plurality of $R_9$'s, two $R_9$'s are bonded to each other to form a ring.

In a case where there are a plurality of $R_9''$s, $R_9''$s each independently represent an alkyl group, a cycloalkyl group, an alkoxycarbonyl group, a cyano group, a hydroxyl group, or an alkoxy group, and in a case where there are a plurality of $R_9''$s, two $R_9''$s are bonded to each other to form a ring.

X and X' each independently represent an alkylene group, an oxygen atom, or a sulfur atom.

m and m' are the numbers of substituents and each independently represent an integer of 0 to 5. It is preferable that m and m' each independently represent 0 or 1.

The alkyl groups of $R_9$ and $R_9'$ are preferably an alkyl group having 1 to 4 carbon atoms, more preferably a methyl group or an ethyl group, and most preferably a methyl group. Examples of the cycloalkyl group include cyclopropyl, cyclobutyl, cyclopentyl, and cyclohexyl groups. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups each may have a substituent, and examples of the substituent include an alkoxy group such as a hydroxy group, a methoxy group, and an ethoxy group, a cyano group, and a halogen atom such as a fluorine atom. $R_9$ and $R_9'$ are more preferably a methyl group, a cyano group, or an alkoxycarbonyl group, and even more preferably a cyano group.

Examples of the alkylene group of X and X' include a methylene group and an ethylene group. X and X' are preferably an oxygen atom or a methylene group, and more preferably a methylene group.

In a case where m and m' are one or greater, at least one of $R_9$'s or $R_9''$s is preferably substituted at an α-position or a β-position of a carbonyl group of lactone, and particularly preferably substituted at an α-position.

Specific examples of the the repeating unit having a lactone structure or a sultone structure represented by Formula (III-1) or (III-1') include repeating units disclosed in <0315> of US2012/0135348A1, but the present invention is not limited thereto.

The content of the repeating unit represented by Formula (III) (in a case where there are a plurality of repeating units, the content of the sum thereof) is preferably 15 to 60 mol %, more preferably 20 to 60 mol %, and even more preferably 30 to 50 mol % with respect to the total repeating units in the resin (A).

In addition to the repeating unit represented by Formula (III), the resin (A) may contain the repeating unit having a lactone structure or a sultone structure.

Specific examples of the repeating unit having a lactone group or a sultone group include repeating units disclosed in <0325> to <0328> US2012/0135348A1, in addition to the specific examples exemplified above, but the present invention is not limited to these.

Among the specific examples described above, examples of the particularly preferable repeating unit include the following repeating units. A pattern profile and coarse/dense dependence are improved by selecting an optimum lactone group or an optimum sultone group.

(In the formula, Rx represents H, $CH_3$, $CH_2OH$, or $CF_3$.)

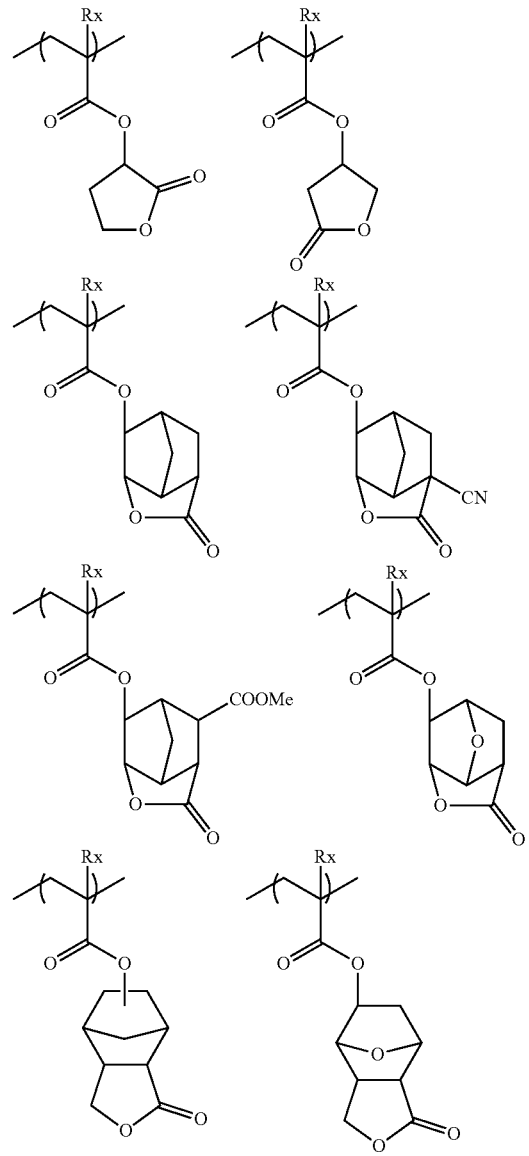

In the repeating unit having a lactone group or a sultone group, an optical isomer is usually present, but any optical isomer may be used. One optical isomer may be used singly, or a plurality of optical isomers may be used in a mixture. In a case where one kind of optical isomer is mainly used, the optical purity (ee) thereof is preferably 90% or more and more preferably 95% or more.

The content of repeating units having a lactone structure or a sultone structure other than the repeating unit represented by Formula (III) (in a case where there are a plurality of repeating units, the content of the sum thereof) is preferably 15 to 60 mol %, more preferably 20 to 50 mol %, and even more preferably 30 to 50 mol % with respect to the total repeating units in the resin.

In order to increase the effect of the present invention, it is possible to use two or more lactone or sultone repeating units selected from Formula (III) in combination. In a case where the lactone or sultone repeating units are used in combination, it is preferable that two or more of the lactone or sultone repeating units of which n is 1 in Formula (III) are selected and used in combination.

The resin (A) preferably has a repeating unit having a hydroxyl group or a cyano group other than Formulae (AI) and (III). As a result, the substrate adhesiveness and developer affinity are improved. The repeating unit having a hydroxyl group or a cyano group is preferably a repeating unit having an alicyclic hydrocarbon structure substituted with a hydroxyl group or a cyano group, and it is preferable not to have an acid-decomposable group. The alicyclic hydrocarbon structure in the alicyclic hydrocarbon structure substituted with a hydroxyl group or a cyano group is preferably an adamantyl group, a diamantyl group, or a norbornane group. As the preferable alicyclic hydrocarbon structure substituted with a hydroxyl group or a cyano group, a structure represented by the following formula is preferable.

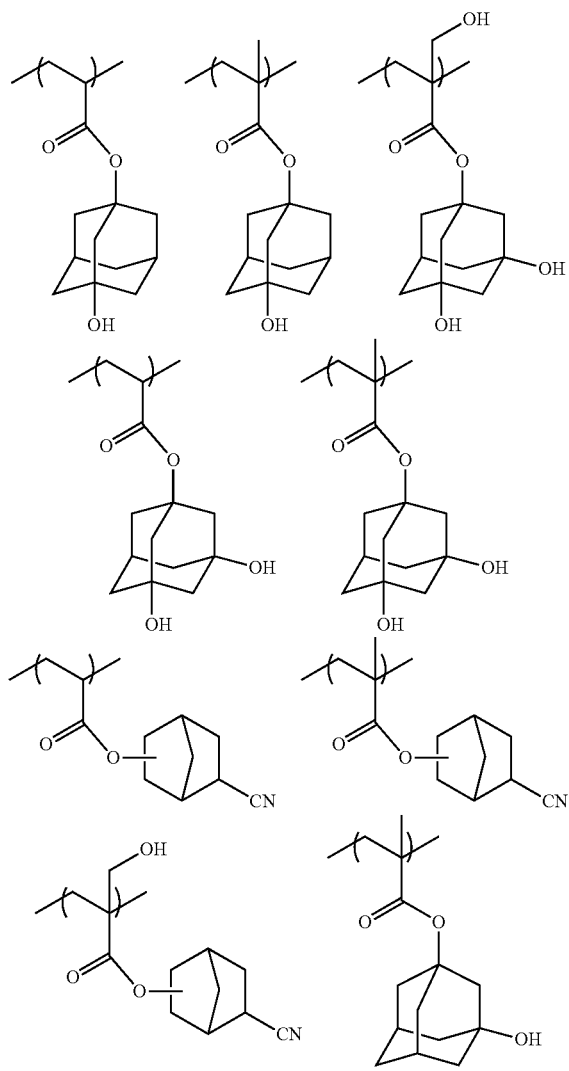

The content of the repeating unit having a hydroxyl group or a cyano group is preferably 5 to 40 mol %, more preferably 5 to 30 mol %, and even more preferably 10 to 25 mol % with respect to the total repeating units in the resin (A).

Specific examples of the repeating unit having a hydroxyl group or a cyano group include repeating units disclosed in paragraph 0340 of US2012/0135348A, but the present invention is not limited thereto.

The resin (A) used in the actinic ray-sensitive or radiation-sensitive resin composition of the embodiment of the present invention may have a repeating unit having an alkali-soluble group. Examples of the alkali-soluble group include a carboxyl group, a sulfonamide group, a sulfonylimide group, a bissulfonylimide group, and aliphatic alcohol (for example, hexafluoroisopropanol group) in which the α-position is substituted with an electron withdrawing group, and it is preferable to have a repeating unit having a carboxyl group. By containing a repeating unit having an alkali-soluble group, resolution in a contact hole application is increased. As the repeating unit having an alkali-soluble group, all of a repeating unit in which an alkali-soluble group is directly bonded to the main chain of the resin like a repeating unit of acrylic acid or methacrylic acid, a repeating unit in which an alkali-soluble group is bonded to the main chain of the resin via a linking group, and a repeating unit obtained by introducing a polymerization initiator having an alkali-soluble group or a chain transfer agent to a terminal of a polymer chain at the time of polymerization are preferable, and the linking group may have a monocyclic or polycyclic hydrocarbon structure. A repeating unit of acrylic acid or methacrylic acid is particularly preferable.

The content of the repeating unit having an alkali-soluble group is preferably 0 to 20 mol %, more preferably 3 to 15 mol %, and even more preferably 5 to 10 mol % with respect to the total repeating units in the resin (A).

Specific examples of the repeating unit having an alkali-soluble group include repeating units disclosed in paragraph 0344 of US2012/0135348A, but the present invention is not limited thereto.

The resin (A) of the embodiment of the present invention may further have a repeating unit having an alicyclic hydrocarbon structure which does not have a polar group (for example, an alkali-soluble group, a hydroxyl group, and a cyano group) and not exhibiting acid decomposability. Examples of the repeating unit include a repeating unit represented by Formula (IV).

(IV)

In Formula (IV), $R_5$ represents a hydrocarbon group having at least one cyclic structure and not having a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group and particularly preferably a hydrogen atom or a methyl group.

The cyclic structure of $R_5$ includes a monocyclic hydrocarbon group and a polycyclic hydrocarbon group. Examples of the monocyclic hydrocarbon group include a cycloalkyl group having 3 to 12 carbon atoms such as a cyclopentyl group, a cyclohexyl group, a cycloheptyl group, and a cyclooctyl group, a cycloalkenyl group having 3 to 12 carbon atoms such as a cyclohexenyl group. A preferable monocyclic hydrocarbon group is a monocyclic hydrocarbon group having 3 to 7 carbon atoms and more preferably a cyclopentyl group and a cyclohexyl group.

The polycyclic hydrocarbon group includes a ring assembly hydrocarbon group and a crosslinked cyclic hydrocarbon group, and examples of the ring assembly hydrocarbon group include a bicyclohexyl group and a perhydronaphthalenyl group. Examples of the crosslinked cyclic hydrocarbon ring include a bicyclic hydrocarbon ring such as pinang, bomnan, norpinan, norbomane, and a bicyclo octane ring (bicyclo[2.2.2]octane ring and bicyclo[3.2.1]octane ring) a tricyclic hydrocarbon ring such as homoburedan, adamantane, tricyclo[5.2.1.0$^{2,6}$]decane, and a tricyclo[4.3.1.1$^{2,5}$] undecane ring, and a tetracyclic hydrocarbon ring such as tetracyclo[4.40.1$^{2,5}$1$^{7,10}$]dodecane and a perhydro-1,4-methano-5,8-methanonaphthalene ring. Examples of the crosslinked cyclic hydrocarbon ring include a fused cyclic hydrocarbon ring, for example, a fused ring obtained by fusing a plurality of 5-membered to 8-membered cycloalkane rings such as perhydronaphthalene (decalin), perhydroanthracene, perhydrophenanthrene, perhydroacenaphthene, perhydrofluorene, perhydroindene, and perhydrophenalene rings.

Preferable examples of the crosslinked cyclic hydrocarbon ring include a norbornyl group, an adamantyl group, a bicyclooctanyl group, and a tricyclo[5,2,1,0$^{2,6}$]decanyl group. More preferable examples of the crosslinked cyclic hydrocarbon ring include a norbomyl group and an adamantyl group.

These alicyclic hydrocarbon groups may have a substituent, and preferable examples of the substituent include a halogen atom, an alkyl group, a hydroxyl group substituted with a hydrogen atom, and an amino group substituted with a hydrogen atom. Preferable examples of the halogen atom include bromine, chlorine, and fluorine atoms, and preferable examples of the alkyl groups include methyl, ethyl, butyl, and t-butyl groups. The above alkyl group may further have a substituent, and examples of the substituent that may be further provided include a halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferable examples of the alkyl group include an alkyl group having 1 to 4 carbon atoms, preferable examples of the substituted methyl group include methoxymethyl, methoxythiomethyl, benzyloxymethyl, t-butoxymethyl, and a 2-methoxyethoxymethyl group, preferable examples of the substituted ethyl group include 1-ethoxyethyl and 1-methyl-1-methoxyethyl, preferable examples of the acyl groups include an aliphatic acyl group having 1 to 6 carbon atoms such as formyl, acetyl, propionyl, butyryl, isobutyryl, valeryl, and pivaloyl groups, and examples of the alkoxycarbonyl group include an alkoxycarbonyl group having 1 to 4 carbon atoms.

The resin (A) may or may not contain a repeating unit having an alicyclic hydrocarbon structure which does not have a polar group and not exhibiting acid decomposability, but in a case where the resin (A) contains the repeating unit, the content of this repeating unit preferably 1 to 40 mol % and more preferably 2 to 20 mol % with respect to the total repeating units in the resin (A).

Specific examples of the repeating unit having an alicyclic hydrocarbon structure having no polar group and not exhibiting acid-decomposability include repeating units disclosed in paragraph 0354 of US2012/0135348A, but the present invention is not limited thereto.

In addition to the above repeating structural unit, the resin (A) used in the composition of the embodiment of the present invention may have various repeating structural units for the purpose of adjusting properties such as dry etching resistance, suitability for standard developer, substrate adhesiveness, and resist profile, and general required properties of resist such as resolving power, heat resistance, and sensitivity.

Examples of the repeating structural units include repeating structural units corresponding to the following monomers, but the repeating structural units are not limited thereto.

Accordingly, the performance required for the resin used in the composition of the embodiment of the present invention, particularly, (1) solubility in a coating solvent, (2) film formability (glass transition point), (3) alkali developability, (4) film thinning (selecting hydrophilic or hydrophobic properties and alkali-soluble group), (5) adhesiveness to the substrate at the unexposed portion, (6) dry etching resistance, or the like can be finely adjusted.

Examples of the monomer include a compound having one addition polymerizable unsaturated bond selected from acrylic acid esters, methacrylic acid esters, acrylamides, methacrylamides, allyl compounds, vinyl ethers, and vinyl esters.

In addition, in a case of an addition polymerizable unsaturated compound copolymerizable with the monomer corresponding to the above various repeating structural units, the compound may be copolymerized.

In the resin (A) used in the composition of the embodiment of the present invention, a content molar ratio of each repeating structural unit is appropriately set in order to adjust properties such as dry etching resistance, or suitability for standard developer of the resist, substrate adhesiveness, and resist profile, and further general required performances of resist such as resolving power, heat resistance, and sensitivity.

In a case where the composition of the embodiment of the present invention is for ArF exposure, in view of transparency to ArF light, it is preferable that the resin (A) used in the composition of the embodiment of the present invention has substantially no aromatic group. Specifically, during the entire repetition of the resin (A), the content of the repeating unit having an aromatic group is preferably 5 mol % or less, more preferably 3 mol % or less, and ideally 0 mol % with respect to the total repeating units, that is, it is more preferable to not have a repeating unit having an aromatic group. The resin (A) preferably has a monocyclic or polycyclic alicyclic hydrocarbon structure.

In view of compatibility with the resin (C) described below, it is preferable that the resin (A) does not contain a fluorine atom and a silicon atom.

As the resin (A) used in the composition of the embodiment of the present invention, it is preferable that all repeating units are formed with (meth)acrylate-based repeating units. In this case, all of the resins of which all the repeating units are methacrylate-based repeating units, of which all the repeating units are acrylate-based repeating units, or of which all the repeating units are methacrylate-based repeating units and acrylate-based repeating units can be used, but the resin of which acrylate-based repeating units are 50 mol % or lower with respect to all repeating units is preferable. A copolymer having 20 to 50 mol % of a (meth)acrylate-based repeating unit having an acid-decomposable group, 20 to 50 mol % of the (meth)acrylate-based repeating unit having a lactone group, 5 to 30 mol % of the (meth)acrylate-based repeating unit having an alicyclic hydrocarbon structure substituted with a hydroxyl group or a cyano group, and 0 to 20 mol % of other (meth)acrylate-based repeating unit is also preferable.

In the case where the composition of the embodiment of the present invention is irradiated with KrF excimer laser light, electron beams, X-rays, or high energy light (such as EUV) having a wavelength of 50 nm or less, the resin (A) preferably has a hydroxy styrene-based repeating unit. It is more preferable to have a hydroxystyrene-based repeating unit, a hydroxystyrene-based repeating unit protected with an acid-decomposable group, and an acid-decomposable repeating unit such as a tertiary alkyl (meth)acrylate ester.

Examples of the hydroxystyrene-based repeating unit having a preferable acid-decomposable group include repeating units of t-butoxycarbonyloxystyrene, 1-alkoxyethoxystyrene, and tertiary alkyl(meth)acrylate ester, and repeating units of 2-alkyl-2-adamantyl (meth)acrylate and dialkyl (1-adamantyl) methyl (meth)acrylate are more preferable.

In a case where the composition according to the embodiment of the present invention is for KrF exposure, EB exposure, or EUV exposure, it is preferable that the resin (A) contains a repeating unit having an aromatic hydrocarbon group.

[Repeating Unit (a) Having Aromatic Hydrocarbon Group]

Suitable examples of a repeating unit (a) having an aromatic hydrocarbon group include a repeating unit (a1) having a phenolic hydroxyl group.

[Repeating Unit (a1) Having Phenolic Hydroxyl Group]

In the present specification, the phenolic hydroxyl group is a group obtained by substituting a hydrogen atom of an aromatic hydrocarbon group with a hydroxy group. Examples of an aromatic ring of the aromatic hydrocarbon group include a monocyclic or polycyclic aromatic ring, and examples thereof include a benzene ring and a naphthalene ring.

Examples of the repeating unit (a1) having a phenolic hydroxyl group include a repeating unit represented by Formula (I).

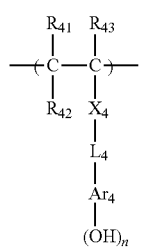

(I)

In the formula, $R_{41}$, $R_{42}$, and $R_{43}$ each independently represent a hydrogen atom, an alkyl group, a cycloalkyl group, a halogen atom, a cyano group, or an alkoxycarbonyl group. Here, $R_{12}$ may be bonded to $Ar_4$, to form a ring. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_1$'s each independently represent a single bond or a divalent linking group. $Ar_4$ represents a (n+1)-valent aromatic hydrocarbon group and represents a (n+2)-valent aromatic hydrocarbon group in a case of being bonded to $R_{42}$ to form a ring.

n represents an integer of 1 to 5.

For the purpose of increasing the polarity of the repeating unit of Formula (I), it is preferable that n is an integer of 2 or more, or $X_4$ is —COO— or —CONR$_{64}$—.

Examples of the alkyl group of $R_{41}$, $R_{42}$, and $R_{43}$ in Formula (I) include an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group, which may have a substituent, more preferably includes an alkyl group having 8 or less carbon atoms, and particularly preferably includes an alkyl group having 3 or less carbon atoms.

In Formula (I), the cycloalkyl group of $R_{41}$, $R_{42}$, and $R_{43}$ may have a monocyclic shape or a polycyclic shape. Preferable examples thereof include a monocyclic cycloalkyl group having 3 to 8 carbon atoms such as a cyclopropyl group, a cyclopentyl group, and a cyclohexyl group which may have a substituent.

In Formula (I), examples of the halogen atom of $R_{41}$, $R_{42}$, and $R_{43}$ include a fluorine atom, a chlorine atom, a bromine atom, and an iodine atom, and a fluorine atom is particularly preferable.

The alkyl group included in the alkoxycarbonyl group of $R_{41}$, $R_{42}$, and $R_{43}$ in Formula (I) is preferably the same as those in the alkyl group in $R_{41}$, $R_{42}$, and $R_{43}$.

Examples of the preferable substituent in each group include an alkyl group, a cycloalkyl group, an acyl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and it is preferable that the number of carbon atoms of the substituent is 8 or less.

$Ar_4$ represents a (n+1)-valent aromatic hydrocarbon group. The divalent aromatic hydrocarbon group in the case where n is 1 may have a substituent, and, for example, an arylene group having 6 to 18 carbon atoms such as a phenylene group, a tolylene group, a naphthylene group, and an anthracenylene group or, for example, aromatic hydrocarbon groups including a heterocyclic ring such as thiophene, furan, pyrrole, benzothiophene, benzofuran, benzopyrrole, triazine, imidazole, benzimidazole, triazole, thiadiazole, and thiazole are exemplified as preferable examples.

Specific examples of the (n+1)-valent aromatic hydrocarbon group in a case where n is an integer of 2 or greater suitably include groups obtained by removing any (n–1) items of hydrogen atoms from the above specific examples of the divalent aromatic hydrocarbon group.

The (n+1)-valent aromatic hydrocarbon group may further have a substituent.

Examples of the substituent that can be included in the alkyl group, the cycloalkyl group, the alkoxycarbonyl group, and the (n+1)-valent aromatic hydrocarbon group include an alkyl group, an alkoxy group such as a methoxy group, an ethoxy group, a hydroxyethoxy group, a propoxy group, a hydroxypropoxy group, and a butoxy group; and an aryl group such as a phenyl group, exemplified in $R_{41}$, $R_{42}$, and $R_{43}$ in Formula (1).

The alkyl group of $R_{64}$ in —CONR$_{64}$— ($R_{64}$ represents a hydrogen atom or an alkyl group) represented by $X_4$ is preferably an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group, which may have a substituent, and more preferably an alkyl group having 8 or less carbon atoms.

$X_4$ is preferably a single bond, —COO—, and —CONN— and is more preferably a single bond and —COO—.

The divalent linking group as $L_4$ is preferably an alkylene group, and the alkylene group is preferably an alkylene group having 1 to 8 carbon atoms such as a methylene group, an ethylene group, a propylene group, a butylene group, a hexylene group, and an octylene group, which may have a substituent.

$Ar_4$ is more preferably an aromatic hydrocarbon group having 6 to 18 carbon atoms that may have a substituent and particularly preferably a benzene ring group, a naphthalene ring group, and a biphenylene ring group.

The repeating unit represented by Formula (1) preferably has a hydroxystyrene structure. That is, $Ar_4$ is preferably a benzene ring group.

Specific examples of the repeating unit (a1) having a phenolic hydroxyl group included in the resin (A) are provided below, but the present invention is not limited to these. In the formulae, a represents 1 or 2.

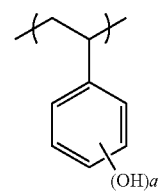
(B-1)

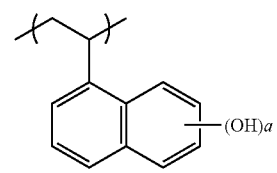
(B-2)

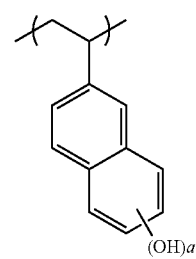
(B-3)

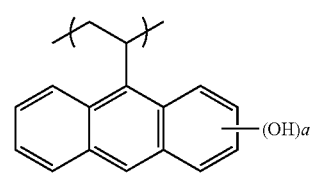
(B-4)

-continued

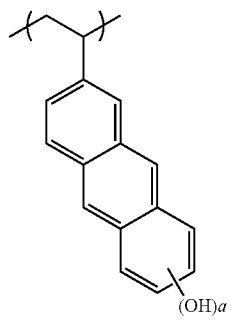
(B-5)

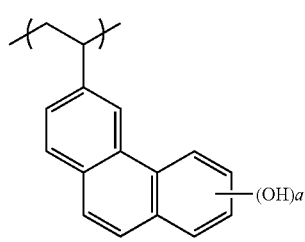
(B-6)

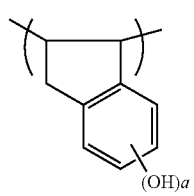
(B-7)

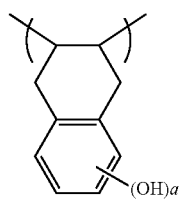
(B-8)

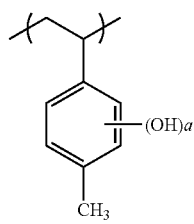
(B-9)

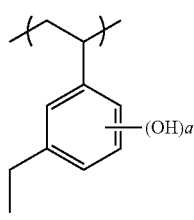
(B-10)

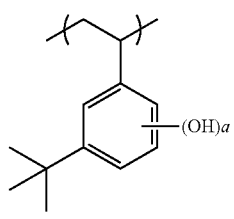
(B-11)

(B-12) 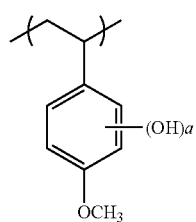
(B-13) 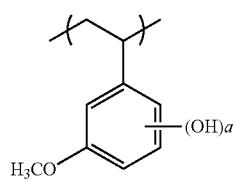
(B-14) 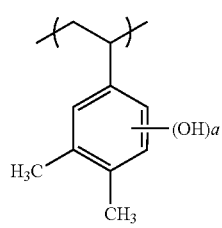
(B-15) 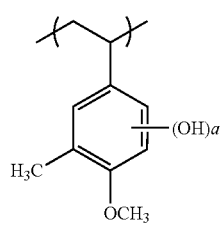
(B-16) 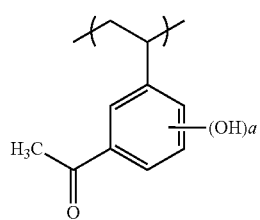
(B-17) 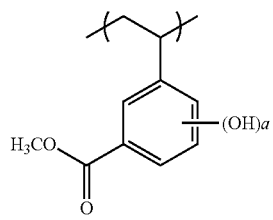
(B-18) 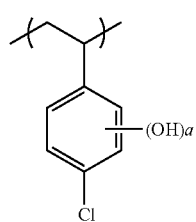
(B-19) 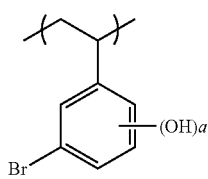
(B-20) 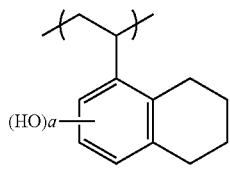
(B-21) 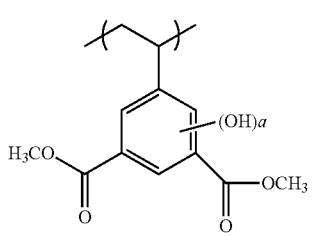
(B-22) 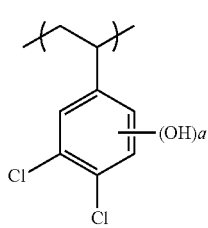
(B-23) 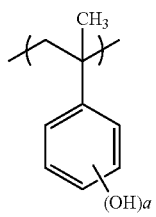
(B-24) 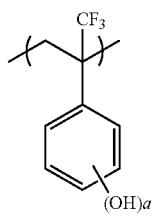
(B-25) 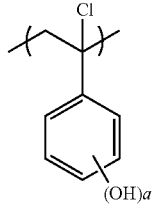

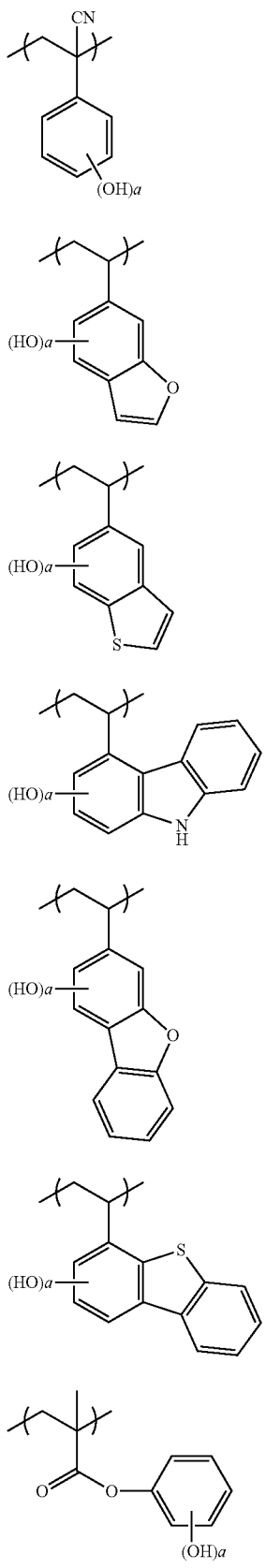

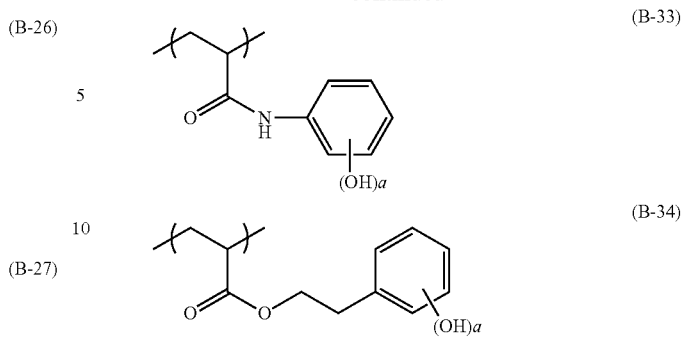

The resin (A) may have only one type of repeating unit (a1) having a phenolic hydroxyl group or may have two or more kinds thereof.

The content of the repeating unit (a1) having a phenolic hydroxyl group is preferably 10 to 95 mol %, more preferably 20 to 90 mol %, and even more preferably 30 to 85 mol % with respect to the total repeatimg units in the resin (A).

Examples of the repeating unit (a) having an aromatic hydrocarbon group suitably include a repeating unit (a2) having a structure (acid-decomposable group) in which a phenolic hydroxyl group is protected by a leaving group which is decomposed and left due to an action of an acid.

[Repeating Unit (a2) Having Structure (Acid-Decomposable Group) in Which Phenolic Hydroxyl Group is Protected by Leaving Group That is Decomposed and Left Due to Action of Acid]

Examples of the leaving group that is decomposed and left due to an action of an acid include a group represented by Formulae (Y1) to (Y4).

$$—C(Rx_1)(Rx_2)(Rx_3) \quad \text{Formula (Y1)}$$

$$—C(=O)OC(Rx_1)(Rx_2)(Rx_3) \quad \text{Formula (Y2)}$$

$$—C(R_{36})(R_{37})(OR_{38}) \quad \text{Formula (Y3)}$$

$$—C(Rn)(H)(Ar) \quad \text{Formula (Y4)}$$

In Formulae (Y1) and (Y2). $Rx_1$ to $Rx_3$ each independently represent a (linear or branched) alkyl group or a (monocyclic or polycyclic) cycloalkyl group. Here, in a case where all of $Rx_1$ to $Rx_3$ are (linear or branched) alkyl groups, at least two of $Rx_1, \ldots,$ or $Rx_3$ are preferably methyl groups.

It is more preferable that $Rx_1$ to $Rx_3$ each independently represent a repeating unit representing a linear or branched alkyl group, it is even more preferable that $Rx_1$ to $Rx_3$ each independently represent a repeating unit representing a linear alkyl group.

Two of $Rx_1$ to $Rx_3$ are bonded to form a monocyclic or polycyclic ring.

The alkyl group of $Rx_1$ to $Rx_3$ is preferably a group having 1 to 4 carbon atoms such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, a polycyclic cycloalkyl group such as a norbornyl group, a tetracyclodecanyl group, a tetracyclododecanyl group, and an adamantyl group.

The cycloalkyl group formed by bonding two of $Rx_1$ to $Rx_3$ is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group. The monocyclic cycloalkyl group having 5 to 6 carbon atoms is particularly preferable.

With respect to the cycloalkyl group formed by bonding two of $Rx_1$ to $Rx_3$, for example, one of the methylene groups constituting the ring may be substituted with a hetero atom such as an oxygen atom or a group having a hetero atom such as a carbonyl group.

It is preferable that the repeating unit represented by Formulae (Y1) and (Y2), for example, is an aspect in which $Rx_1$ is a methyl group or an ethyl group, and in which and $Rx_2$ and $Rx_3$ are bonded to each other to form the above cycloalkyl group.

In Formula (Y3), $R_{36}$ to $R_{38}$ each independently represent a hydrogen atom or a monovalent organic group. $R_{37}$ and $R_{38}$ may be bonded to each other, so as to form a ring. Examples of the monovalent organic group include an alkyl group, a cycloalkyl group, an aryl group, an aralkyl group, and an alkenyl group. $R_{36}$ is preferably a hydrogen atom.

In Formula (Y4), Ar represents an aromatic hydrocarbon group. Rn represents an alkyl group, a cycloalkyl group, and an aryl group. Rn and Ar are bonded to each other to form a nonaromatic ring. Ar is more preferably an aryl group.

The repeating unit (a2) is preferably a repeating unit having a structure in which a hydrogen atom is protected by a group represented by Formulae (Y1) to (Y4) in a phenolic hydroxyl group.

The repeating unit (a2) is preferably a repeating unit represented by Formula (AII).

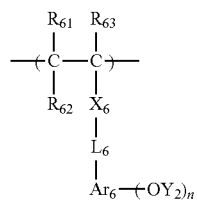
(AII)

In Formula (AII), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring. In this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic hydrocarbon group and represents a (n+2)-valent aromatic hydrocarbon group in a case of being bonded to $R_{62}$ to form a ring.

In a case where n≥2 is satisfied, $Y_2$'s each independently represent a hydrogen atom or a group that is left by an action or an acid. Here, at least one of $Y_2$'s represents a group that is left due to an action of an acid. It is preferable that a group that is left due to an action of an acid as $Y_2$ is a group that is represented by any one of Formulae (Y1) to (Y4).

n represents an integer of 1 to 4.

Each of the above groups may have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and a group having 8 or less carbon atoms is preferable.

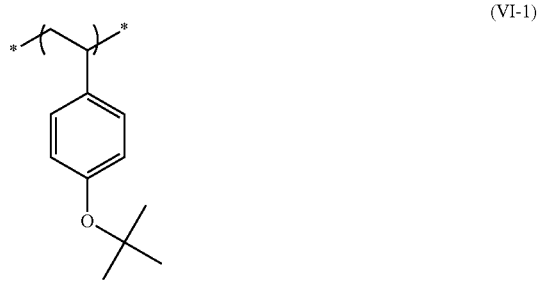
(VI-1)

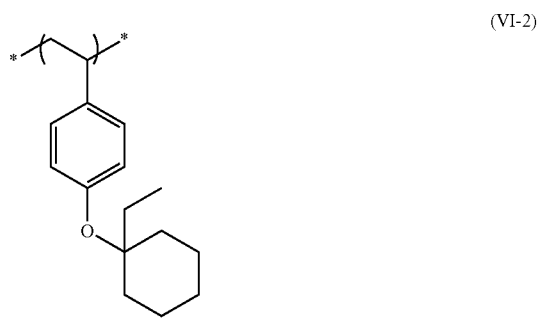
(VI-2)

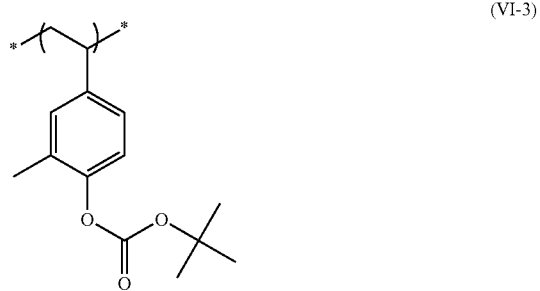
(VI-3)

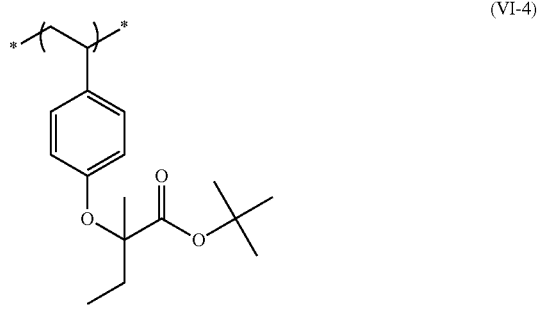
(VI-4)

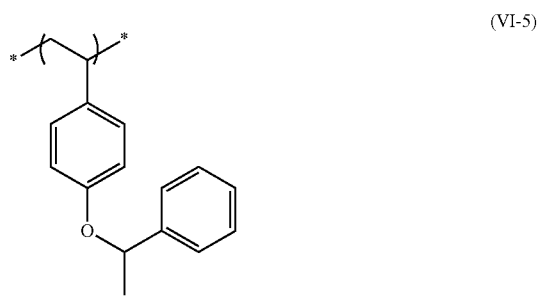
(VI-5)

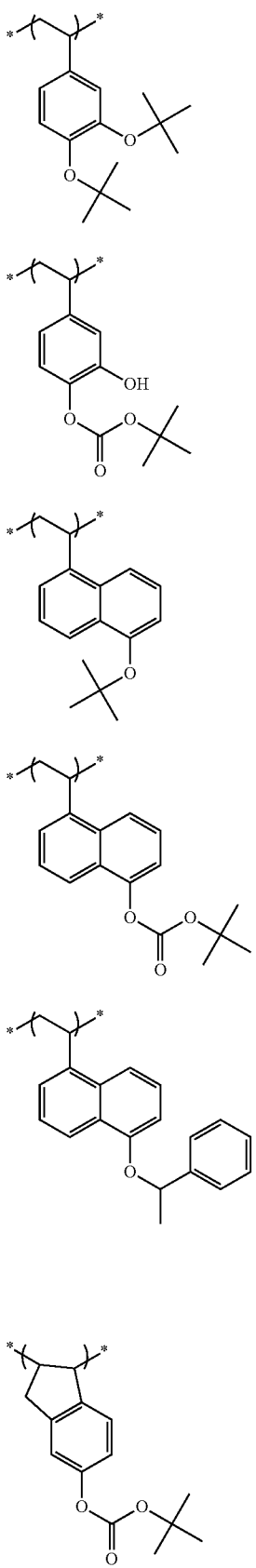
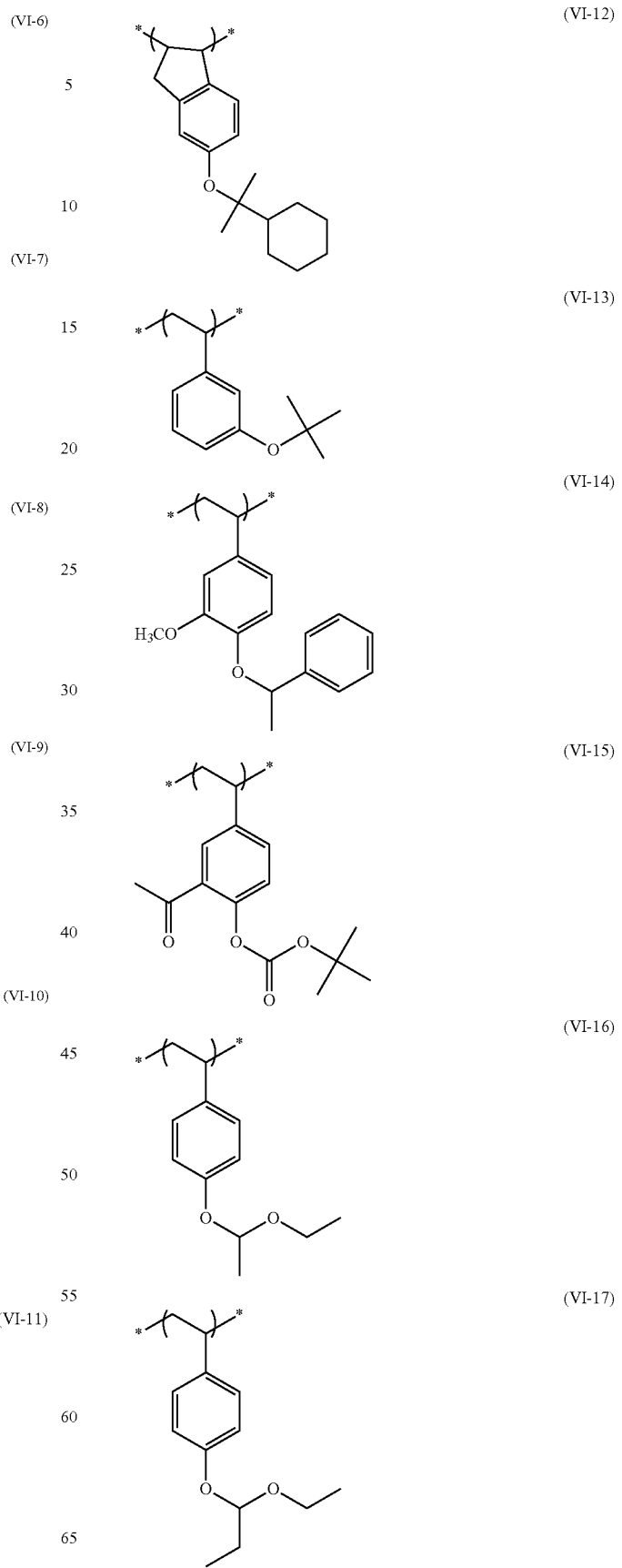

(VI-18)
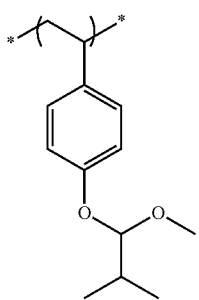
(VI-19)
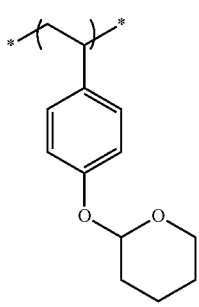
(VI-20)
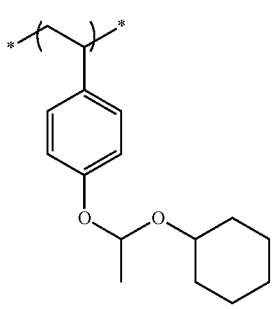
(VI-21)
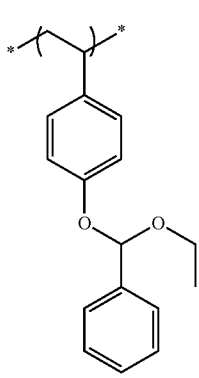
(VI-22)
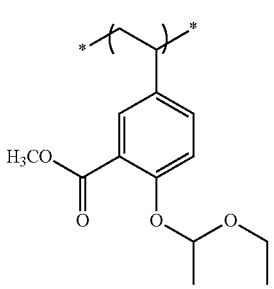
(VI-23)
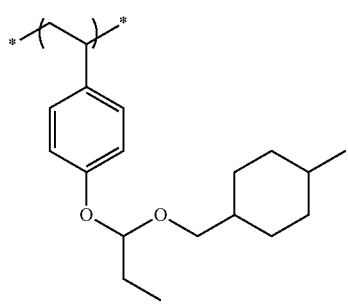
(VI-24)
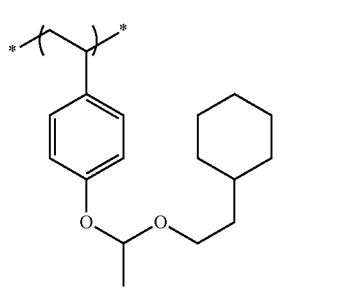
(VI-25)
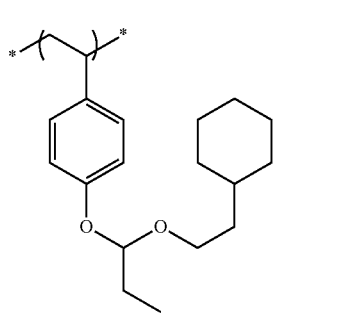
(VI-26)
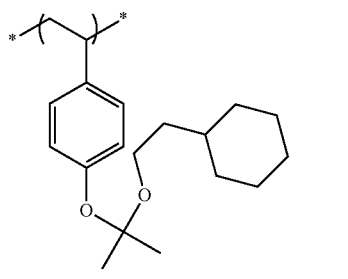
(VI-27)
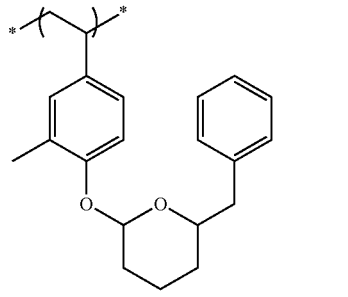

(VI-28) 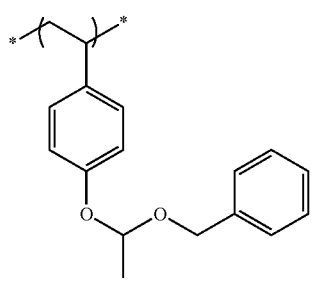
(VI-29) 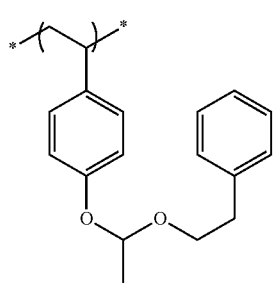
(VI-30) 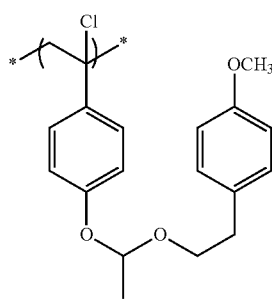
(VI-31) 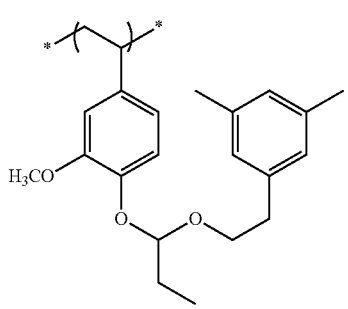
(VI-32) 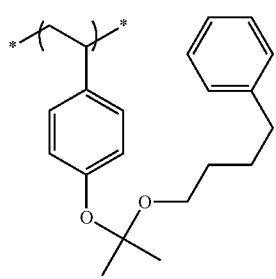
(VI-33) 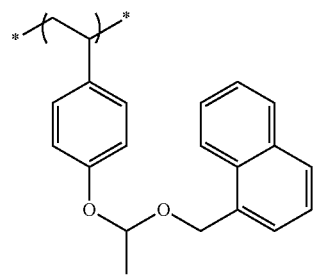
(VI-34) 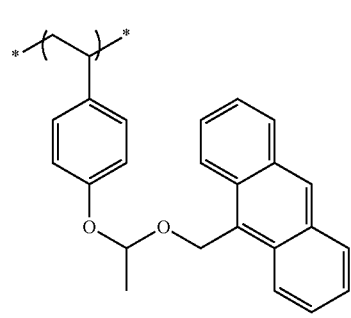
(VI-35) 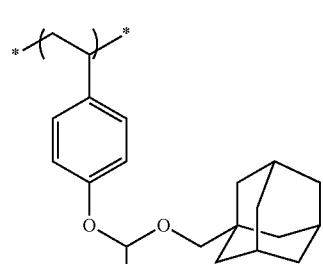
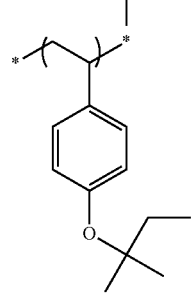

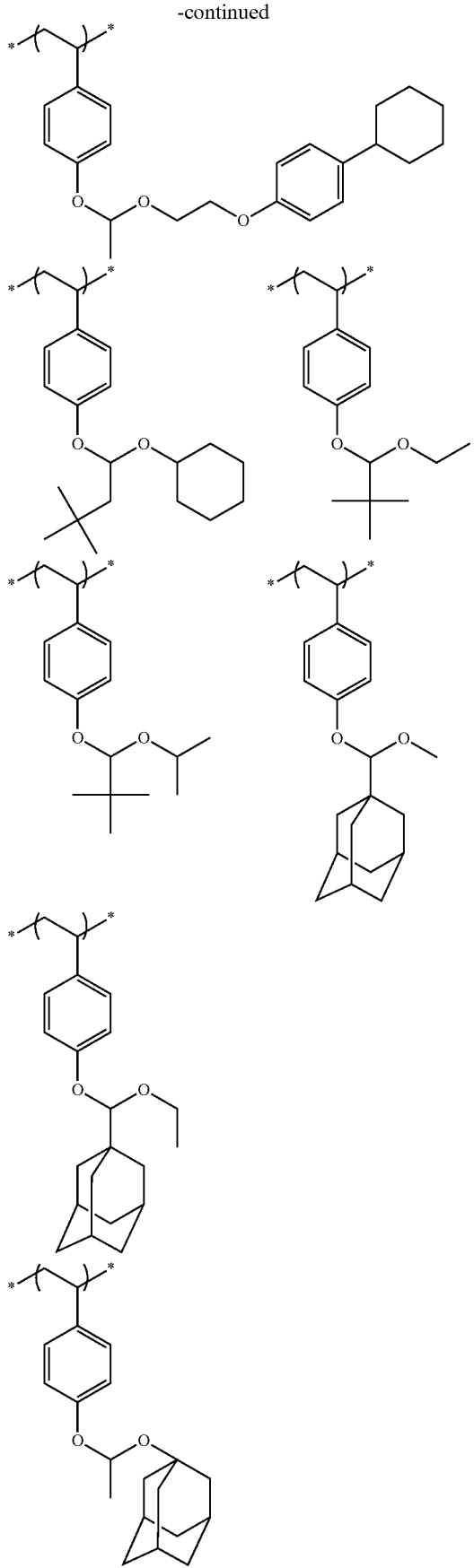
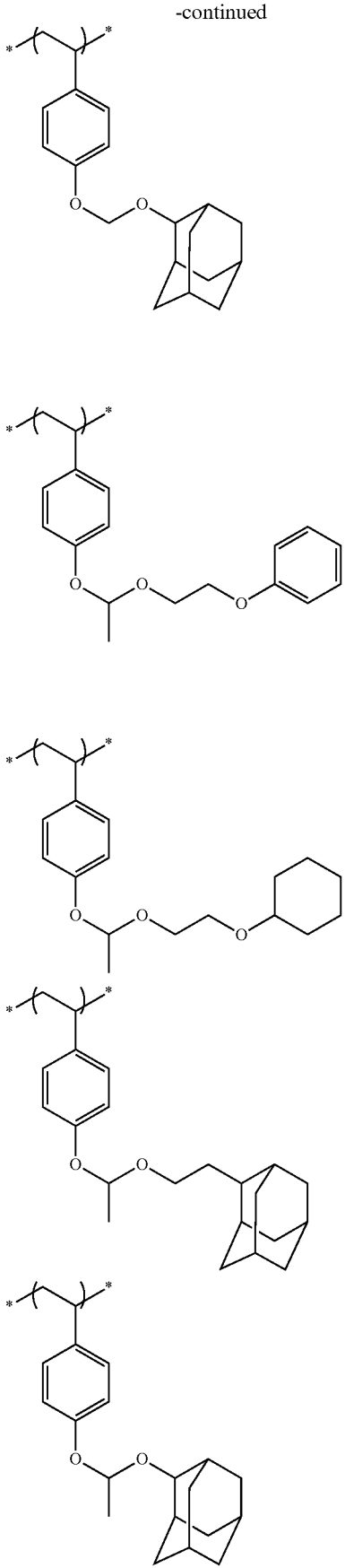

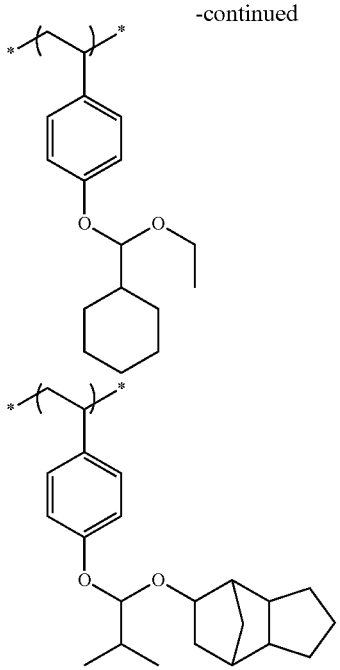

The repeating unit (a2) in the resin (A) may be used singly or two or more kinds thereof may be used in combination.

The content (a total amount thereof in a case where a plurality of kinds are contained) of the repeating unit (a2) in the resin (A) is preferably 5 mol % to 80 mol %, more preferably 5 mol % to 75 mol %, and even more preferably 10 mol % to 65 mol % with respect to the total repeating units in the resin (A).

The repeating unit having an acid-decomposable group and an aromatic hydrocarbon group in the present specification corresponds to a repeating unit having an acid-decomposable group and also a repeating unit having an aromatic hydrocarbon group.

The resin (A) according to the embodiment of the present invention can be synthesized by a general method (for example, radical polymerization). Specifically, a synthesis method disclosed in <0126> to <0128> of US2012/0164573A1 can be used.

The weight-average molecular weight of the resin (A) of the embodiment of the present invention is preferably 1,000 to 200,000, more preferably 2,000 to 20,000, even more preferably 3,000 to 15,000, and particularly preferably 3,000 to 11,000, as a value in terms of polystyrene by a GPC method. In a case where the weight-average molecular weight is caused to be 1,000 to 200,000, it is possible to prevent deterioration of heat resistance and dry etching resistance and it is possible to prevent deterioration of developability and deterioration of film formability due to increase in viscosity.

The dispersion degree (molecular weight distribution) is generally in the range of 1.0 to 3.0, preferably in the range of 1,0 to 2.6, more preferably in the range of 1.0 to 2.0, and particularly preferably in the range of 1.4 to 2.0. As the molecular weight distribution is smaller, a resolution and a resist shape are excellent, a sidewall of a resist pattern is smooth, and roughness properties are excellent.

The content of the resin (A) of the embodiment of the present invention is preferably 30 to 99 mass % and more preferably 55 to 95 mass % with respect to the total solid content of the composition, The resin of the embodiment of the present invention may be used singly, or two or more kinds thereof may be used in combination.

<Photoacid Generator>

The composition of the embodiment of the present invention typically contains a photoacid generator.

The photoacid generator corresponds to a compound that generates acid by the irradiation with an actinic ray or radiation.

The photoacid generator is not particularly limited and is preferably a compound that generates an organic acid by the irradiation with an actinic ray or radiation.

As the acid generator, well-known compounds which generate an acid by the irradiation with the actinic ray or the radiation and are used in a photoinitiator of photocationic polymerization, a photoinitiator of photoradical polymerization, a light-decoloring agent of pigments, a photochromic agent, micro resist, or the like, and the mixture thereof can be appropriately selected to be used. Examples thereof include compounds disclosed in paragraphs <0039> to <0103> of JP2010-061043A and compounds disclosed in paragraphs <0284> to <0389> of JP2013-004820A, but the present invention is not limited thereto.

Examples thereof include a diazonium salt compound, a phosphonium salt compound, a sulfonium salt compound, an iodonium salt compound, imidosulfonate, oxime sulfonate, diazodisulfone, disulfone, and o-nitrobenzyl sulfonate.

Suitable examples of the acid generator contained in the composition of the embodiment of the present invention include compounds that generate acid due to the irradiation with actinic rays or radiation represented by Formula (3).

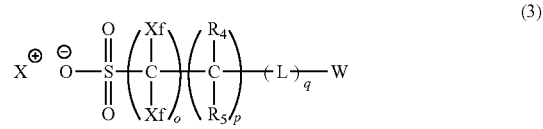

(Anion)

In Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, $R_4$'s and $R_5$'s in a case where a plurality thereof are present may be identical to or different from each other, respectively.

L represents a divalent linking group, and L's in a case where a plurality thereof are present may be identical to or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms of this alkyl group is preferably 1 to 10 and more preferably 1 to 4. The alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. Particularly, it is preferable that both Xf's are fluorine atoms.

$R_1$ and $R_3$ each independently represent a hydrogen atom, a fluorine atom, an alkyl group, or an alkyl group substituted with at least one fluorine atom, $R_4$'s and $R_5$'s in a case where a plurality thereof are present may be identical to or different from each other, respectively.

The alkyl groups as $R_4$ and $R_5$ each may have a substituent, and an alkyl group having 1 to 4 carbon atoms is preferable. $R_4$ and $R_5$ are preferably a hydrogen atom.

Specific examples and suitable aspects of the alkyl group substituted with at east one fluorine atom are the same as those of Xf in Formula. (3).

L represents a divalent linking group, and L's in a case where a plurality thereof are present may be identical to or different from each other.

Examples of the divalent linking group include —COO— (—C(=O)—O—), —OCO—, —CONH—, —NHCO—, —CO—, —O—, —S—, —SO—, —SO₂—, an alkylene group (preferably having 1 to 6 carbon atoms), a cycloalkylene group (preferably having 3 to 10 carbon atoms), an alkenylene group (preferably having 2 to 6 carbon atoms), or a divalent linking group obtained by combining a plurality thereof. Among these, —COO—, —OCO—, —CONH—, —NHCO—, —CO—, —O—, —SO₂—, a —COO-alkylene group, a —OCO-alkylene group, a —CONH-alkylene group, and a —NHCO— alkylene group are preferable, and —COO—, —OCO—, —CONH—, —SO₂—, a —COO-alkylene group, and a —OCO-alkylene group are more preferable.

W represents an organic group including a cyclic structure. Among these, a cyclic organic group is preferable.

Examples of the cyclic organic group include an alicyclic group, an aryl group, and a heterocyclic group.

The alicyclic group may be monocyclic or polycyclic. Examples of the monocyclic alicyclic group include a monocyclic cycloalkyl group such as a cyclopentyl group, a cyclohexyl group, and a cyclooctyl group. Examples of the polycyclic alicyclic group include a polycyclic cycloalkyl group such as a norhornyl group, a tricyclodecanyl group, a tetracyclodecanyl group, a tetracyclododecanyl group, and an adamantyl group. Among these, an alicyclic group having a bulky structure having 7 or more carbon atoms such as a norbomyl group, a tricyclodecanyl group, a tetracyclodecanyl group, a tetracyclododecanyl group, and an adamantyl group is preferable, in view of suppressing diffusion in the film in the PEB (heating after exposure) step and improvement of a Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group having a relatively low light absorbance at 193 nm is preferable.

The heterocyclic group may be monocyclic or polycyclic, but polycyclic can further suppress diffusion of acid. The heterocyclic group may have aromaticity or may not have aromaticity. Examples of the aromatic heterocyclic ring include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. The heterocyclic ring in the heterocyclic group is particularly preferably a furan ring, a thiophene ring, a pyridine ring, or a decahydroisoquinoline ring. Examples of the lactone ring and the sultone ring include a lactone structure and a sultone structure exemplified in the above resins.

The cyclic organic group may have a substituent. Examples of the substituent includes an alkyl group (may be any one of a linear group or a branched group and preferably having 1 to 12 carbon atoms), a cycloalkyl group (may be either any one of a monocyclic ring, a polycyclic ring, or a Spiro ring and preferably having 3 to 20 carbon atoms), an aryl group (preferably having 6 to 14 carbon atoms), a hydroxyl group, an alkoxy group, an ester group, art amido group, a urethane group, a ureido group, a thioether group, a sulfonamide group, and a sulfonic acid ester group. Carbon constituting the cyclic organic group (carbon contributing to ring formation) may be carbonyl carbon.

o represents an integer of 1 to 3. p represents an integer of 0 to 10. q represents an integer of 0 to 10.

According to an aspect, it is preferable that o in Formula (3) is an integer of 1 to 3, p is an integer from 1 to 10, and q is 0. Xf is preferably a fluorine atom, and both of $R_4$ and $R_5$ are preferably hydrogen atoms, and W is preferably a polycyclic hydrocarbon group. o is more preferably 1 or 2, and even more preferably 1. p is more preferably an integer of 1 to 3, more preferably 1 or 2, and particularly preferably 1. W is more preferably a polycyclic cycloalkyl group and even more preferably an adamantyl group or a diamantyl group.

(Cation)

In Formula (3), $X^+$ represents a cation.

$X^+$ is not particularly limited as long as it is a cation, but as a suitable aspect, for example, a cation (a moiety other than $Z^-$) in Formula (ZI), (ZII), and (ZIII) described below can be mentioned.

Suitable aspects of the acid generator include compounds represented by Formula (ZI), (ZII), or (ZIII).

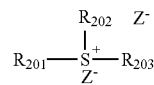

(ZI)

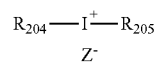

(ZII)

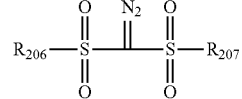

(ZIII)

In Formula (ZI), $R_{201}$, $R_{202}$, and $R_{203}$ each independently represent organic groups.

The number of carbon atoms of the organic group as $R_{201}$, $R_{202}$, and $R_{203}$ is generally 1 to 30 and preferably 1 to 20.

Two of $R_{201}$ to $R_{203}$ may be bonded to each other to form a ring structure and may contain an oxygen atom, a sulfur atom, an ester bond, an amide bond, or a carbonyl group in the ring. Examples of the group formed by bonding two of $R_{201}$ to $R_{203}$ include an alkylene group (for example, a butylene group and a pentylene group).

$Z^-$ represents an anion, preferably represents an anion in Formula (3), that is, preferably represents the anion below.

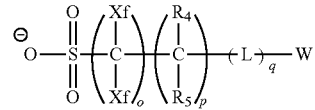

Xf, $R_4$, $R_5$, L, W, o, p, and q have the same meaning as Xf, $R_4$, $R_5$, L, o, p, and q in Formula (3), respectively, A plurality of Xf's, $R_4$ in a case where a plurality thereof are present, $R_5$ in a case where a plurality thereof are present, and L's in a case where a plurality thereof are present may be identical to or different from each other, respectively.

In the anion in Formula (3), examples of the combination of partial structures other than W include $SO_3^-$—$CF_2$—$CH_2$—OCO—, $SO_3^-$—$CF_2$—CHF—$CH_2$—OCO—, $SO_3^-$—$CF_2$—COO—, $SO_3^-$—$CF_2$—$CF_2$—$CH_2$—, and $SO_3^-$—$CF_2$—$CH(CF_3)$—OCO—, as preferable combinations.

Examples of the organic group represented by $R_{201}$, $R_{202}$, and $R_{203}$ include groups corresponding to compounds (ZI-1), (ZI-2), (ZI-3), and (ZI-4).

A compound having a plurality of structures represented by Formula (ZI) may be used. For example, at least one of $R_{201}$, ..., or $R_{203}$ is a compound having a structure in which at least one of $R_{201}$ to $R_{203}$ of the compound represented by Formula (ZI) is bonded to at least one of the other compounds represented by Formula (ZI) via a single bond or a linking group may be used.

Examples of the even more preferable (ZI) component include compounds (ZI-1), (ZI-2), (ZI-3), and (ZI-4) described below.

First, the compound (ZI-1) is described.

The compound (ZI-1) is an arylsulfonium compound in which at least one of $R_{201}$, ..., or $R_{203}$ in Formula (ZI) is an aryl group, that is, a compound having an arylsulfonium as a cation.

In the arylsulfonium compound, all of $R_{201}$ to $R_{203}$ may be an aryl group, or a portion of $R_{201}$ to $R_{203}$ may be an aryl group and the remainder may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group of the arylsulfonium compound is preferably a phenyl group or a naphthyl group and more preferably a phenyl group. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, two or more aryl groups may be identical to or different from each other.

The alkyl group or cycloalkyl group included in the arylsulfonium compound, if necessary, is preferably a linear or branched alkyl group having 1 to 15 carbon atoms and a cycloalkyl group having 3 to 15 carbon atoms, and examples thereof include a methyl group, an ethyl group, a propyl group, a n-butyl group, a sec-butyl group, a t-butyl group, a cyclopropyl group, a cyclobutyl group, and a cyclohexyl group.

An aryl group, an alkyl group, or a cycloalkyl group of $R_{201}$ to $R_{203}$ may have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, and a phenylthio group, as a substituent.

Subsequently, the compound (ZI-2) is described.

A compound (ZI-2) is a compound in which $R_{201}$ to $R_{203}$ in Formula (ZI) each independently represent an organic group not having an aromatic ring. Here, the aromatic ring includes an aromatic ring containing a hetero atom.

The organic group that does not contain an aromatic ring as $R_{201}$ to $R_{203}$ generally has 1 to 30 carbon atoms and preferably has 1 to 20 carbon atoms.

$R_{201}$ to $R_{203}$ each independently and preferably an alkyl group, a cycloalkyl group, an allyl group, or a vinyl group, more preferably a linear or branched 2-oxoalkyl group, a 2-oxocycloalkyl group, or an alkoxycarhonylmethyl group, and particularly preferably a linear or branched 2-oxoalkyl group.

The alkyl group and the cycloalkyl group of $R_{201}$ to $R_{203}$ each are preferably a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbomyl group).

$R_{201}$ to $R_{203}$ may be further substituted with a halogen atom, an alkoxy group example, 1 to 5 carbon atoms), a hydroxyl group, a cyano group, or a nitro group.

Subsequently, the compound (ZI-3) is described.

The compound (ZI-3) is a compound represented by Formula (ZI-3) and a compound having a phenacylsulfonium salt structure.

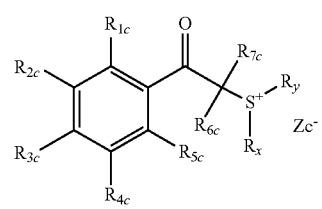

(ZI-3)

In Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ are respectively bonded to each other to form ring structures, and these ring structures each may have an oxygen atom, a sulfur atom, a ketone group, an ester bond, or an amide bond.

Examples of the ring structure include an aromatic or nonaromatic hydrocarbon ring, an aromatic or nonaromatic heterocyclic ring, or a polycyclic fused ring formed by combining two or more of these rings. Examples of the ring structure include 3-membered to 10-membered rings, and 4-membered to 8-membered rings are preferable, and 5-membered or 6-membered rings are more preferable.

Examples of the groups formed by bonding two or more of $R_{1c}$ to $R_{5c}$, $R_{6c}$ and $R_{7c}$, and $R_x$ and $R_y$ to each other include a butylene group and a pentylene group.

The groups formed by bonding $R_{5c}$ and $R_{6c}$ and $R_{5c}$ and $R_x$ each are preferably a single bond or an alkylene group, and examples of the alkylene group include a methylene group and an ethylene group.

$Zc^-$ represents an anion and preferably represents an anion in Formula (3), and details thereof are as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) of the present invention include cations disclosed in paragraph <0036> of the specification of US2012/0076996A.

Subsequently, the compound (ZI-4) is described.

The compound (ZI-4) is represented by Formula (ZI-4).

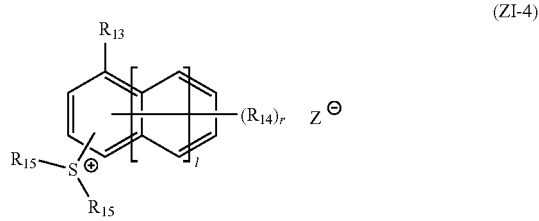

(ZI-4)

In Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where there are a plurality of $R_{14}$'s, $R_{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, and a naphthyl group. These groups may have a substituent. Two $R_{15}$'s may be bonded to each other to form a ring. In a case where two of $R_{15}$'s are bonded to each other to form a ring, a hetero atom such as an oxygen atom or a nitrogen atom may be included in the ring skeleton. In one aspect, it is preferable that two $R_{15}$'s are alkylene groups and are bonded to each other to form a ring structure.

l represents an integer of 0 to 2.

r represents an integer of 0 to 8.

$Z^-$ represents an anion, preferably represents an anion in Formula (3), and specifically as described above.

In Formula (ZI-4), the alkyl groups of $R_{13}$, $R_{14}$, and $R_{15}$ are linear or branched, preferably have 1 to 10 carbon atoms, and are preferably a methyl group, an ethyl group, an n-butyl group, and a t-butyl group.

Examples of the cation of the compound represented by Formula (ZI-4) of the present invention include cations disclosed in paragraphs <0121>, <0123>, and <0124> of JP2010-256842A and paragraphs <0127>, <0129>, and <0130> of JP2011-076056A.

Subsequently, Formulae (ZII) and (ZIII) are described.

In Formulae (ZII) and (ZIII). $R_{204}$ to $R_{207}$ each independently represent an aryl group, an alkyl group, or a cycloalkyl group.

The aryl group of $R_{204}$ to $R_{207}$ is preferably a phenyl group or a naphthyl group and more preferably a phenyl group. The aryl groups of $R_{204}$ to $R_{207}$ may be acyl groups each having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

The alkyl group and the cycloalkyl group of $R_{204}$ to $R_{207}$ each are preferably a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

An aryl group, an alkyl group, and a cycloalkyl group of $R_{204}$ to $R_{207}$ each may have a substituent. Examples of the substituent that may be included in an aryl group, an alkyl group, or a cycloalkyl group of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion, preferably represents an anion in Formula (3), and specifically as described above.

The acid generator may have an aspect of a low molecular weight compound or may have an aspect of being incorporated into a part of the polymer. The aspect of a low molecular weight compound and the aspect of being incorporated in a part of a polymer may be used in combination.

According to the present invention, the photoacid generator preferably has a low molecular weight compound.

In a case where the acid generator is in the aspect of a low molecular weight compound, the molecular weight is preferably 3000 or less, more preferably 2000 or less, and even more preferably 1000 or less.

In a case where the acid generator is in an aspect of being incorporated into a part of the polymer, the acid generator may be incorporated in a part of the resin (A) as described above or may be incorporated in a resin different from the resin (A).

The acid generators can be synthesized by well-known methods, and can be synthesized, for example, by a method disclosed in JP2007-161707A.

The acid generator may be used singly, or two or more kinds thereof may be used in combination.

The content (the sum in a case where a plurality of kinds are present) of the acid generator in the composition is preferably 0.1 to 30 mass %, more preferably 0.5 to 25 mass %, even more preferably 3 to 20 mass %, and particularly preferably 3 to 15 mass % based on the total solid content of the composition.

In a case where the compound represented by Formulae (ZI-3) or (ZI-4) is included as the acid generator, the content (the sum in a case where a plurality of kinds are present) of the acid generator in the composition is preferably 5 to 35 mass % and more preferably 7 to 30 mass % based on the total solid content of the composition.

<Resin (C)>

As described above, the composition according to the embodiment of the present invention contains the resin (C) having a repeating unit represented by Formula (1).

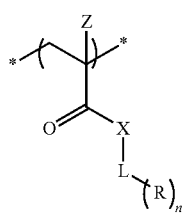

(1)

In Formula (1), Z represents a halogen atom, a group represented by $R_{11}OCH_2$—, or a group represented by $R_{12}OC(=O)CH_2$—. $R_{11}$ and $R_{12}$ each independently represent a monovalent substituent. X represents an oxygen atom or a sulfur atom. L represents a (n+1)-valent linking group. R represents a group having a group that is decomposed due to the action of an alkali developer such that solubility increases in an alkali developer. n represents a positive integer. In a case where n is 2 or more, a plurality of R's may be identical to or different from each other.

Examples of the halogen atom of Z include a fluorine atom, a chlorine atom, a bromine atom, and an iodine atom, and a fluorine atom is preferable.

Examples of the monovalent substituent as $R_{11}$ and $R_{12}$ include an alkyl group (preferably having 1 to 4 carbon atoms), a cycloalkyl group (preferably having 6 to 10 carbon atoms), and an aryl group (preferably having 6 to 10 carbon atoms). The monovalent substituent as $R_{11}$ and $R_{12}$ may further have a substituent, and also examples thereof include an alkyl group (preferably having 1 to 4 carbon atoms), a halogen atom, a hydroxyl group, an alkoxy group (preferably having 1 to 4 carbon atoms), and a carboxy group.

The linking group as L is preferably a divalent or trivalent linking group (other words, n is preferably 1 or 2), more preferably a divalent linking group (other words, n is preferably 1). The linking group as L is preferably a linking group selected from the group consisting of an aliphatic group, an aromatic group, and a combination thereof.

For example, in a case where n is 1 and the linking group as L is a divalent linking group, examples of the divalent aliphatic group include an alkylene group, an alkenylene group, an alkynylene group, or a polyalkyleneoxy group. Among them, an alkylene group and an alkenylene group are preferable, and an alkylene group is more preferable. The divalent aliphatic group is preferably a chain structure rather than a cyclic structure, and more preferably a linear structure rather than a branched chain structure. The divalent aliphatic group may have a substituent, and examples of the substituent include a halogen atom (F, Cl, Br, I, and the like), a hydroxyl group, a carboxyl group, an amino group, a cyano group, an aryl groups, an alkoxy group, an aryloxy group, an acyl group, an alkoxycarbonyl group, an aryloxycarbonyl group, an acyloxy group, a monoalkylamino group, a dialkylamino group, an arylamino group, and a diarylamino group. Examples of the divalent aromatic group include an aryl group. Among these, a phenylene group and a naphthylene group are preferable. The divalent aromatic group may have a substituent, and in addition to the examples of the substituent in the divalent aliphatic group, examples thereof include an alkyl group.

In the case where n is 2 or more, specific examples of the (n+1)-valent linking group include a group obtained by removing any (n−1) items of hydrogen atoms from a specific example of the divalent linking group.

Specific examples of L include the following linking groups, but the present invention is not limited thereto.

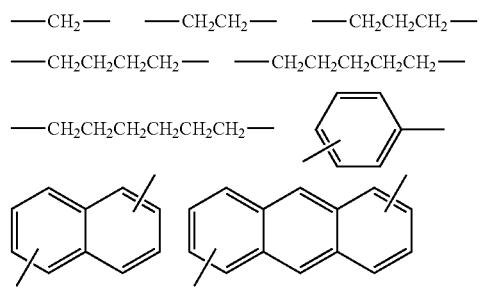

As described above, these linking groups may further have a substituent.

R is preferably a group represented by Formula (A).

—Y-EWG (A)

In Formula (A), Y represents a group that is decomposed due to the action of an alkali developer such that solubility increases in an alkali developer. EWG represents an electron withdrawing group.

Examples of Y include a carboxylic acid ester group: —COO— or OCO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, and a sulfonic acid ester group: —SO$_2$O—, and a carboxylate group is preferable.

According to the present invention, the electron withdrawing group is a partial structure represented by Formula (EW). * in Formula (EW) represents a bonding hand directly connected to the group Y in Formula (A).

(EW)

In Formula (EW), $n_{ew}$ is the number of repetitions of the linking group represented by —C($R_{ew1}$)($R_{ew2}$)— and represents an integer of 0 or 1. In a case where $n_{ew}$ is 0, $n_{ew}$ represents a single bond and this indicates that $Y_{ew1}$ is directly bonded.

$Y_{ew1}$ represents a halogen atom, a cyano group, a nitro group, a halo(cyclo)alkyl group represented by —C($R_{f1}$)($R_{f2}$)—$R_{f3}$, a haloaryl group, an oxy group, a carbonyl group, a sulfonyl group, a sulfonyl group, and a combination thereof. (Here, in a case where $Y_{ew1}$ is a halogen atom, a cyano group, or a nitro group, $n_{ew}$ is 1.)

$R_{ew1}$ and $R_{ew2}$ each independently represent any substituent and, for example, represent a hydrogen atom, an alkyl group (preferably having 1 to 8 carbon atoms), a cycloalkyl group (preferably having 3 to 10 carbon atoms), or an aryl group (preferably having 6 to 10 carbon atoms).

At least two of $R_{ew1}$, $R_{ew2}$, and $Y_{ew1}$ may be linked to each other to form a ring.

The "halo(cyclo)alkyl group" represents an alkyl group and a cycloalkyl group of which at least a portion is halogenated, and the "haloaryl group" represents an aryl group of which at least a portion is halogenated.

$Y_{ew1}$ is preferably a halogen atom, a halo(cyclo)alkyl group represented by —C($R_{f1}$)($R_{f2}$)—$R_{f3}$, or a haloaryl group.

Here, $R_{f1}$ represents a halogen atom, a perhaloalkyl group, a perhalocycloalkyl group, or a perhaloaryl group, more preferably a fluorine atom, a perfluoroalkyl group, or a perfluorocycloalkyl group, and even more preferably a fluorine atom or a trifluoromethyl group.

$R_{f2}$ and $R_{f3}$ each independently represent a hydrogen atom, a halogen atom, or an organic group, and $R_{f2}$ and $R_{f3}$ may be linked to each other to form a ring. Examples of the organic group include an alkyl group, a cycloalkyl group, and an alkoxy group, these may be substituted with a halogen atom (preferably a fluorine atom), and it is more preferable that $R_{f2}$, $R_{f3}$ are a (halo)alkyl group or a (halo)cycloalkyl group. It is more preferable that $R_{f2}$ represents the same group as $R_{f1}$ or is linked to $R_{f3}$ to form a ring.

Examples of the ring formed by linking $R_{f2}$ and $R_{f3}$ to each other include a (halo)cycloalkyl ring.

The (halo)alkyl group in $R_{f1}$ to $R_{f3}$ may be either linear or branched, and the linear (halo)alkyl group is preferably a (halo)alkyl group having 1 to 30 carbon atoms, more preferably 1 to 20 carbon atoms, and examples thereof include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group, and a group obtained by halogenating these. The branched (halo)alkyl group preferably has 3 to 30 carbon atoms, more preferably has 3 to 20 carbon atoms, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanoyl group, and a group obtained by halogenating these. The group is preferably a group having 1 to 4 carbon atoms such as a methyl group, an ethyl group, an n-propyl group, an i-propyl group, an n-butyl group, an i-butyl group, and a t-butyl group, or a group obtained by halogenating these.

The (halo)cycloalkyl group in $R_{f1}$ to $R_{f3}$ or in a ring formed by linking $R_{f2}$ and $R_{f3}$ to each other may be monocyclic or polycyclic. In the case of a polycyclic (halo)cycloalkyl group, the (halo)cycloalkyl group may be a crosslinked (halo)cycloalkyl group. That is, in this case, the (halo)cycloalkyl group may have a bridging structure.

As the monocyclic (halo)cycloalkyl group, a (halo)cycloalkyl group having 3 to 8 carbon atoms is preferable, and examples thereof include a (halo)cyclopropyl group, a (halo)cyclopentyl group, a (halo)cyclohexyl group, a (halo)cyclobutyl group, and a (halo)cyclooctyl group.

Examples of the polycyclic (halo)cycloalkyl group include a (halo)cycloalkyl group having a bicyclo, tricyclo, or tetracyclo structure having 5 or more carbon atoms, a (halo)cycloalkyl group having 6 to 20 carbon atoms is preferable, and examples thereof include a (halo)adamantyl group, a (halo)norbornyl group, a (halo)isobornyl group, a (halo)camphanyl group, a (halo)dicyclopentyl group, a (halo) α-pinel group, a (halo)tricyclodecanyl group, a (halo)tetocyclododecyl group, and a (halo)androstanyl group.

Examples of the (halo)cycloalkyl group include those represented by the following formulae and groups obtained by halogenating these. A portion of the carbon atoms in the cycloalkyl group may be substituted with a hetero atom such as an oxygen atom.

(1)

(2)

(3)

(4)

(5)

(6)

(7)

(8)

(9)

(10)

(11)

(12)

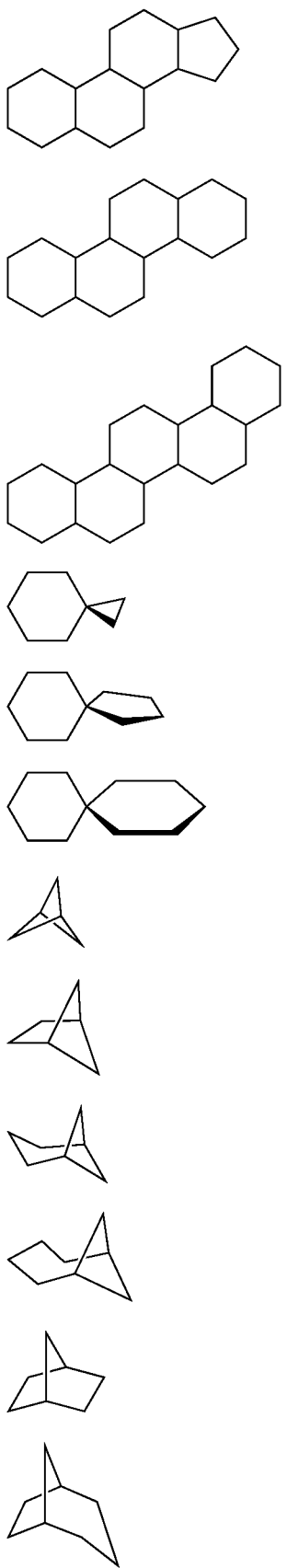
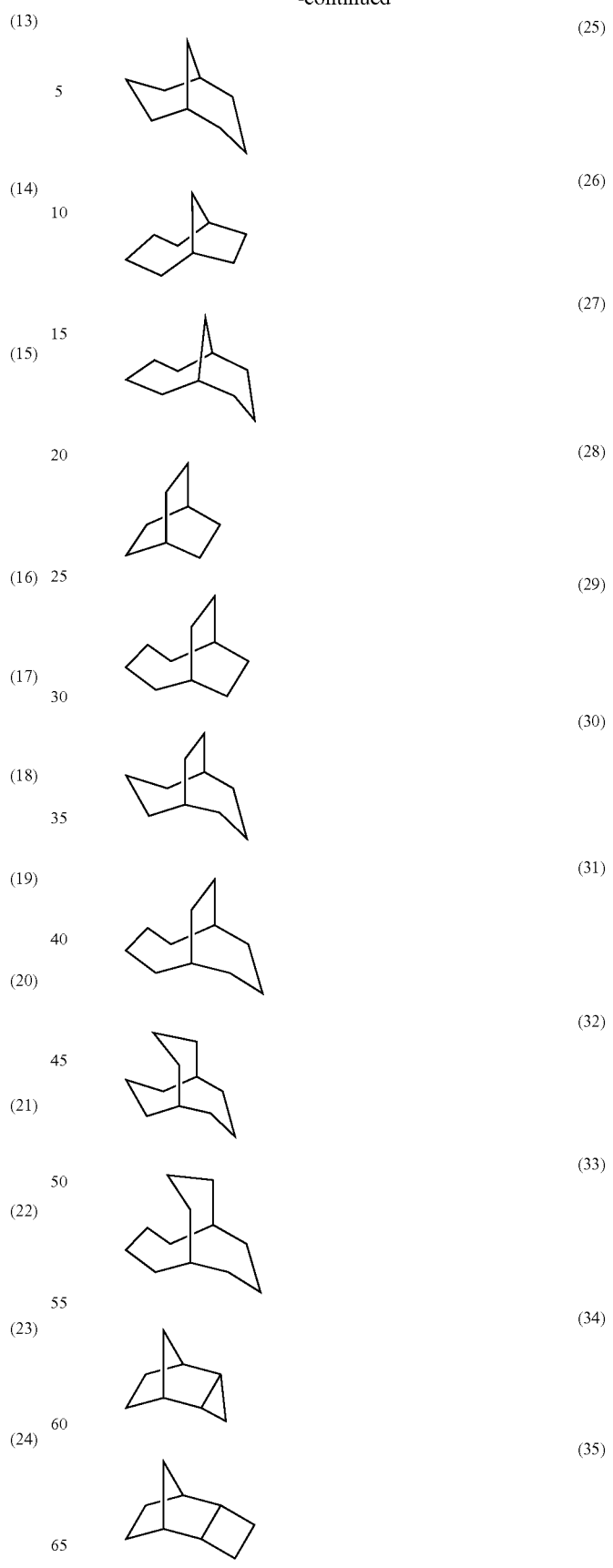

-continued

(36) 

(37) 

(38) 

(39) 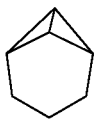

(40) 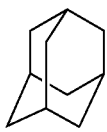

(41) 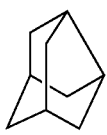

(42) 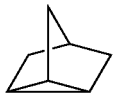

(43) 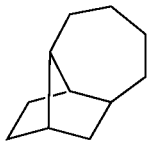

(44) 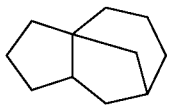

(45) 

(46) 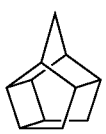

(47) 

(48) 

-continued

(49) 

(50) 

Preferable examples of the alicyclic moiety include an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. More preferable examples are an adamantyl group, a decalin group, a norbornyl group, a cedrol group, a cyclohexyl group, a cycloheptyl group, a cyclooctyl group, a cyclodecanyl group, a cyclododecanyl group, and a tricyclodecanyl group.

Examples of the substituent of the alicyclic moiety include an alkyl group, a halogen atom, a hydroxyl group, an alkoxy group, a carboxyl group, and an alkoxycarbonyl group. The alkyl group preferably represents a lower alkyl group such as a methyl group, an ethyl group, a propyl group, an isopropyl group, and a butyl group and more preferably represents a methyl group, an ethyl group, a propyl group, and an isopropyl group. Preferable examples of the alkoxy group include alkoxy groups having 1 to 4 carbon atoms such as a methoxy group, an ethoxy group, a propoxy group, and a butoxy group. Examples of the substituent that may be included in the alkyl group and the alkoxy group include a hydroxyl group, a halogen atom, and an alkoxy group (preferably having 1 to 4 carbon atoms).

The (halo)cycloalkyl group in $R_{f2}$ and $R_{f3}$ or in the ring formed by linking $R_{f2}$ and $R_{f3}$ to each other is more preferably a fluorocycloalkyl group represented by —$C_{(n)}F_{(2n-2)}$H. The number n of carbon atoms is not particularly limited and is preferably 5 to 13 and more preferably 6.

Examples of the (per)haloaryl group in $Y_{ew1}$ or in $R_{f1}$ include a perfluoroaryl group represented by —$C_{(n)}F_{(n-1)}$. The number n of carbon atoms is not particularly limited and is preferably 5 to 13 and more preferably 6.

Preferable examples of the ring formed by linking at least two of $R_{ew1}$, $R_{ew2}$, and $Y_{ew1}$ include a cycloalkyl group or a heterocyclic group.

Respective groups and respective rings constituting the partial structure represented by Formula (EW) each may further have a substituent, and examples thereof include a hydroxyl group, a halogen atom (fluorine, chlorine, bromine, and iodine), an alkyl group such as a nitro group, a cyano group, a methyl group, an ethyl group, an n-propyl group, an i-propyl group, an n-butyl group, an i-butyl group, and a t-butyl group, an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group such as a methoxycarbonyl group and an ethoxycarbonyl group, an aralkyl group such as a benzyl group, a phenethyl group, and a cumyl group, an acyl group such as an aralkyloxy group, a formyl group, an acetyl group, a butyryl group, a benzoyl group, a cyanamyl group, and a valeryl group, an acyloxy group such as a butyryloxy group, an alkenyl group such as a vinyl group, a propenyl group, and an allyl group, an alkenyloxy group such as a vinyloxy group, a propenyloxy group, an allyloxy group, and a butenyloxy group, an aryl group such as a phenyl group and a naphthyl group, an aryloxy group such as a phenoxy group, and an aryloxycarbonyl group such as a benzoyloxy group. However, the ionic group is not included in the aforementioned additional substituent.

In Formula (1), EWG is preferably an alkyl group substituted with one or more selected from the group consisting of a halogen atom, a cyano group, and a nitro group, more preferably an alkyl group (a haloalkyl group) substituted with a halogen atom, and even more preferably a fluoroalkyl group. The alkyl group substituted with one or more selected from the group consisting of a halogen atom, a cyano group, and a nitro group preferably has 1 to 10 carbon atoms and more preferably 1 to 5 carbon atoms.

More specifically, EWG is preferably an atomic group represented by —C(R'$_1$)(R'$_{f1}$)(R'$_{f2}$) or —C(R'$_1$)(R'$_2$)(R'$_{f1}$). Here, R'$_1$ and R'$_2$ each independently represent a hydrogen atom or an alkyl group which is not substituted with an electron withdrawing group (which is preferably unsubstituted). R'$_{f1}$ and R'$_{f2}$ each independently represent a halogen atom, a cyano group, a nitro group, or a perfluoroalkyl group.

An alkyl group as R'$_1$ and R'$_2$ may be linear or branched and preferably has 1 to 6 carbon atoms.

The perfluoroalkyl group represented by R'$_{f1}$ and R'$_{f2}$ may be linear or branched and preferably has 1 to 6 carbon atoms.

Preferable and specific examples of EWG include —CF$_3$, —C$_2$F$_5$, —C$_3$F$_7$, —C$_4$F$_9$, —CF(CF$_3$)$_2$, —CF(CF$_3$)C$_2$F$_5$, —CF$_2$CF(CF$_3$)$_2$, —C(CF$_3$)$_3$, —C$_5$F$_{11}$, —C$_6$F$_{13}$, —C$_7$F$_{15}$, —C$_8$F$_{17}$, —CH$_2$CF$_3$, —CH$_2$C$_2$F$_5$, —CH$_2$C$_3$F$_7$, —CH(CF$_3$)$_2$, —CH(CF$_3$)C$_2$F$_5$, —CH$_2$CF(CF$_3$)$_2$, and —CH$_2$CN. Among these, —CF$_3$, —C$_2$F$_5$, —C$_4$F$_9$, —CH$_2$CF$_3$, —CH$_2$C$_2$F$_5$, —CH$_2$C$_3$F$_7$, —CH(CF$_3$)$_2$, and —CH$_2$CN are preferable, —CH$_2$CF$_3$, —CH$_2$C$_2$F$_5$, —CH$_2$C$_3$F$_7$, —CH(CF$_3$)$_2$, and —CH$_2$CN are more preferable, —CH$_2$C$_2$F$_5$, —CH(CF$_3$)$_2$, and —CH$_2$CN are even more preferable, and —CH$_2$C$_2$F$_5$, and —CH(CF$_3$)$_2$ are particularly preferable.

The repeating unit represented by Formula (1) is preferably a repeating unit represented by Formula (2) or (3) and is more preferably a structure represented by Formula (2) in view of high followability of an immersion liquid to an exposure device and suppression of a development defect.

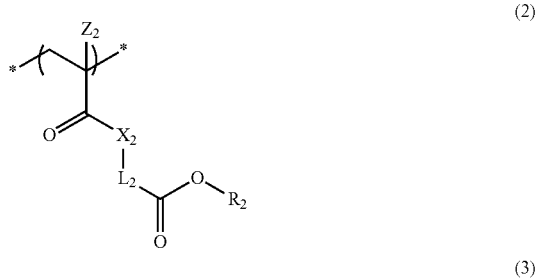

(2)

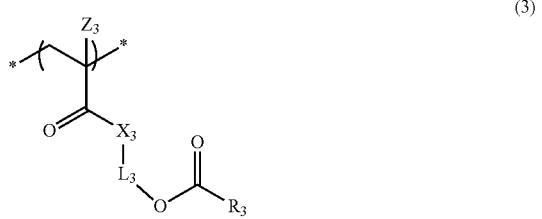

(3)

In Formula (2), R$_2$ represents an electron withdrawing group. L$_2$ represents a divalent linking group. X$_2$ represents an oxygen atom or a sulfur atom. Z$_2$ represents a halogen atom.

In Formula (3), R$_3$ represents an electron withdrawing group. L$_3$ represents a divalent linking group. X$_3$ represents an oxygen atom or a sulfur atom. Z$_3$ represents a halogen atom.

Specific examples and preferable examples of the divalent linking group as L$_2$ and L$_3$ are the same as those described in L as a divalent linking group of Formula (1).

The electron withdrawing group as R$_2$ and R$_3$ is a partial structure represented by Formula (EW), and specific examples and preferable examples thereof are as described above, but a halo(cyclo)alkyl group is particularly preferable.

In Formula (2), L$_2$ and R$_2$ are not bonded to each other to form a ring, and in Formula (3), L$_3$ and R$_3$ are not bonded to each other to form a ring.

X$_2$ and X$_3$ each are preferably an oxygen atom.

Z$_2$ and Z$_3$ are preferably a fluorine atom or a chlorine atom and more preferably a fluorine atom.

The repeating unit represented by Formula (1) is preferably a repeating unit represented by Formula (4).

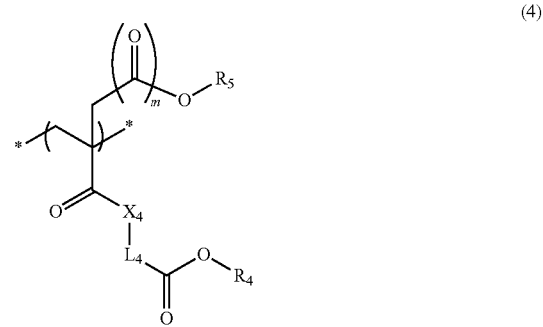

(4)

In Formula (4), R$_4$ represents an electron withdrawing group. R$_5$ represents a hydrogen atom, an alkyl group, or an aryl group. L$_4$ represents a divalent linking group. X$_4$ represents an oxygen atom or a sulfur atom. m represents 0 or 1.

Specific examples and preferable examples of the divalent linking group of L$_4$ are the same as those described in L as the divalent linking group of Formula (1).

The electron withdrawing group as R$_4$ is a partial structure represented by Formula (EW), and specific examples and preferable examples thereof are as described above, but a halo(cyclo)alkyl group is particularly preferable.

In Formula (4), L$_4$ and R$_4$ are not bonded to each other to form a ring.

X$_4$ is preferably an oxygen atom.

Examples of the alkyl group of R$_5$ include a methyl group, an ethyl group, a propyl group, an octyl group, an isopropyl group, a t-butyl group, an isopentyl group, a 2-ethylhexyl group, a 2-methylhexyl group, and a cyclopentyl group.

Examples of the aryl group of R$_5$ include a phenyl group, a 1-naphthyl group, and 2-naphthyl group.

The alkyl group and the aryl group of R$_5$ may have a substituent. Examples of the substituent include a halogen atom (F, Cl, Br, and I), a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group, and a diarylamino group.

$R_5$ is preferably a group that is not decomposed due to an action of an alkali developer.

The repeating unit represented by Formula (1) is preferably a repeating unit represented by Formula (5).

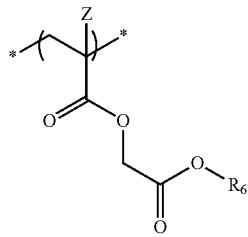

(5)

In Formula (5), Z represents a halogen atom, a group represented by $R_{11}OCH_2$—, or a group represented by $R_{12}OC(=O)CH_2$—. $R_{11}$ and $R_{12}$ each independently represent a monovalent substituent. $R_6$ represents an electron withdrawing group.

The electron withdrawing group as $R_6$ is a partial structure represented by Formula (EW), and specific examples and preferable examples are as described above, but a halo(cyclo)alkyl group is particularly preferable.

Specific examples and preferable examples of the halogen atom, a group represented by $R_{11}OCH_2$—, and a group represented by $R_{12}OC(=O)CH_2$— as Z are the same as described in Formula (1).

The content of the repeating units represented by Formula (1) is preferably 10 to 100 mol % more preferably 20 to 100 mol %, even more preferably 30 to 100 mol %, and most preferably 40 to 100 mol % with respect to the total repeating units in the resin (C).

Hereinafter, specific examples of the repeating unit represented by Formula (1) are provided, but the present invention is not limited to these. In the formula, X represents a halogen atom, and Ph represents a phenyl group.

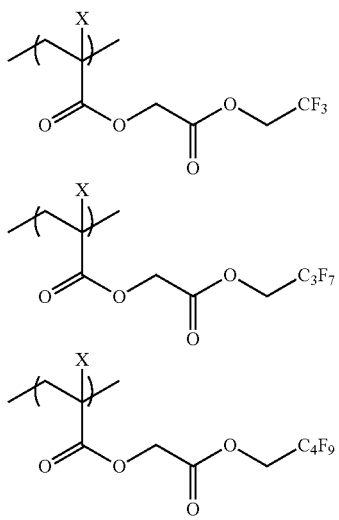

-continued

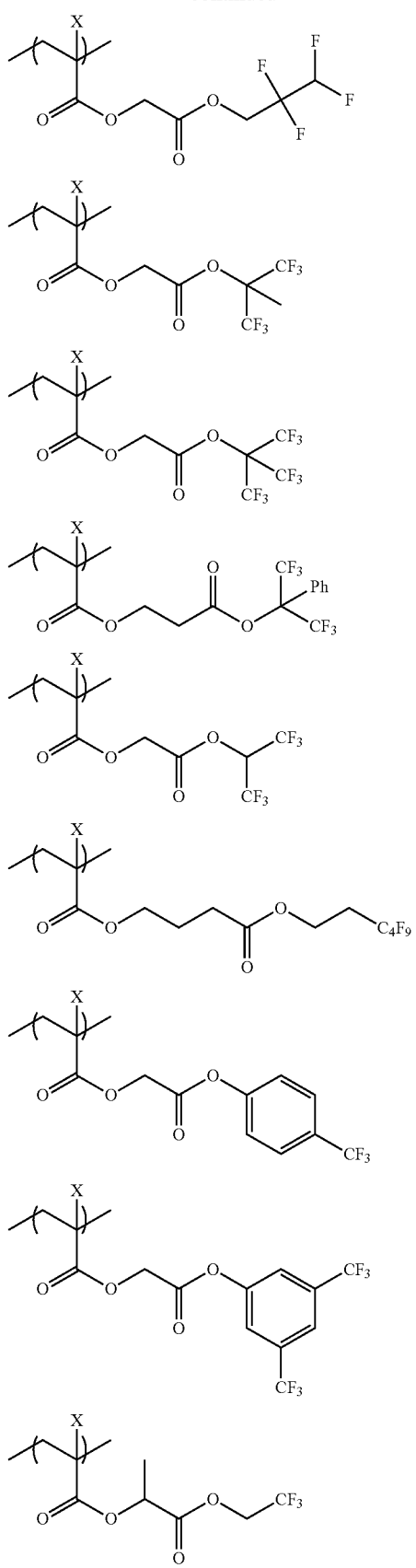

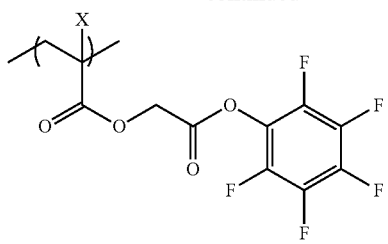
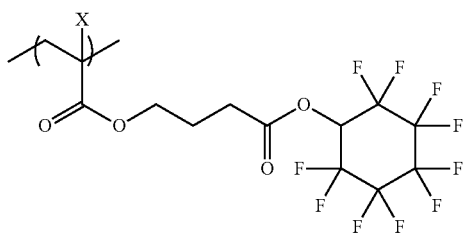
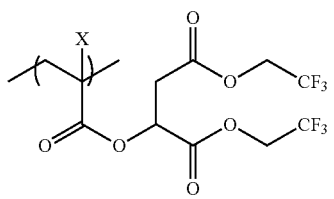
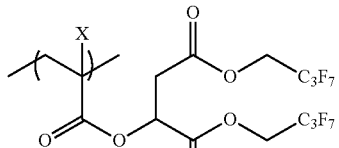
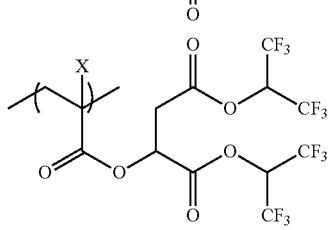
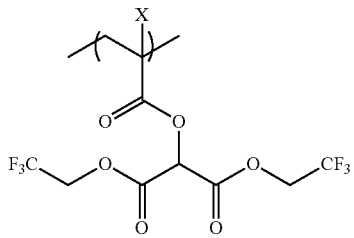
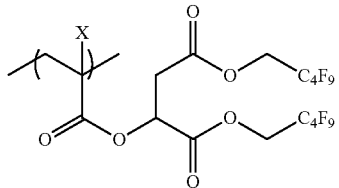
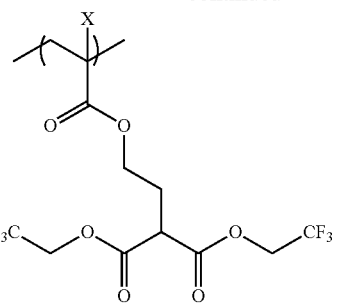
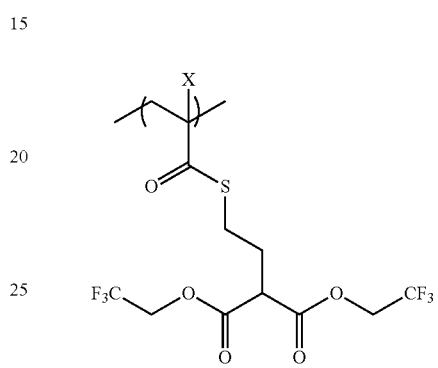
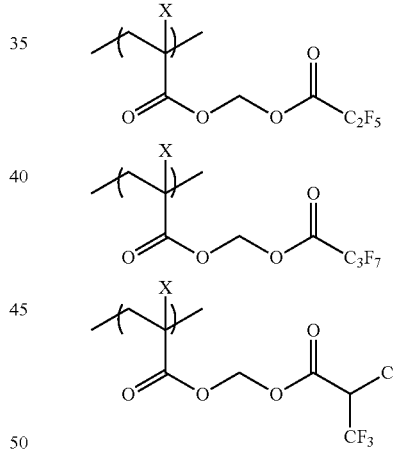
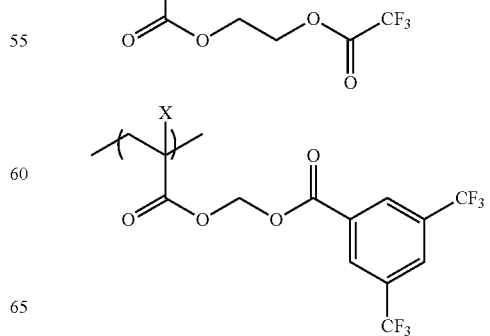

63
-continued
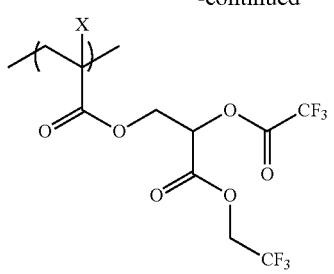
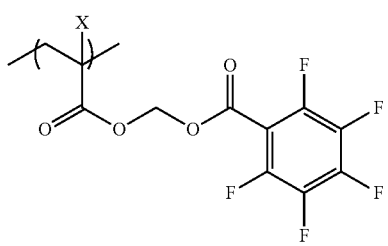
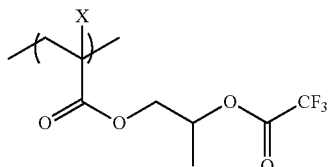
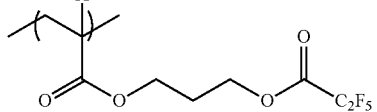
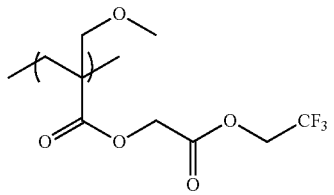
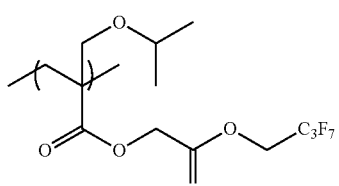
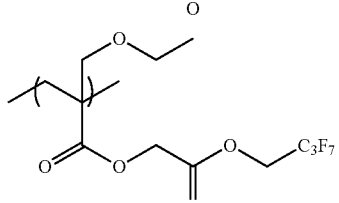
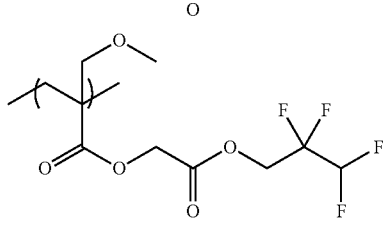
64
-continued
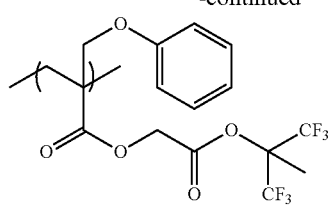
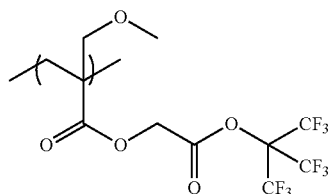
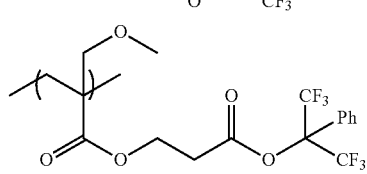
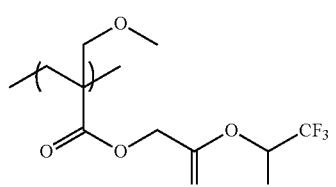
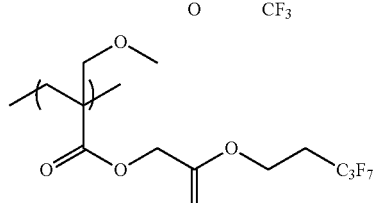
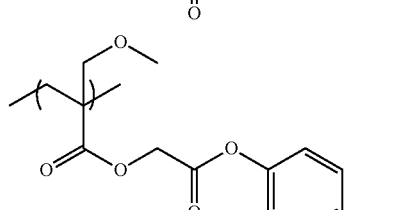
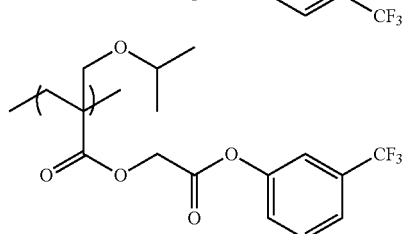
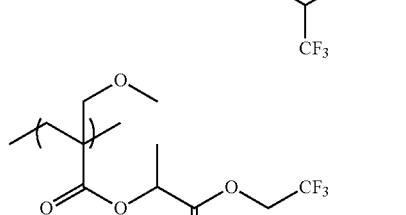

-continued
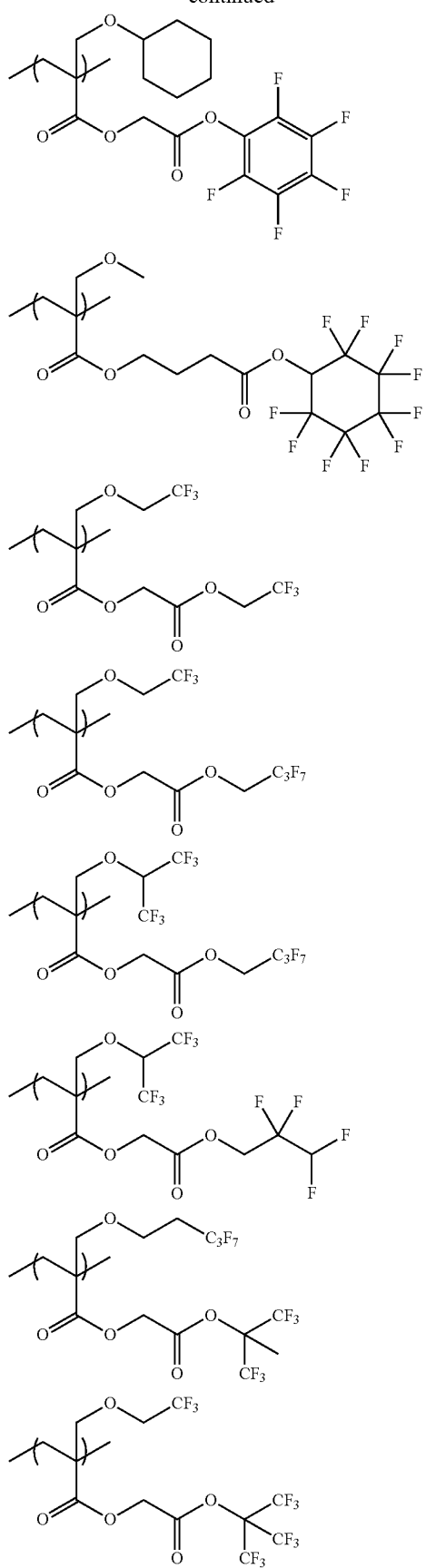
-continued
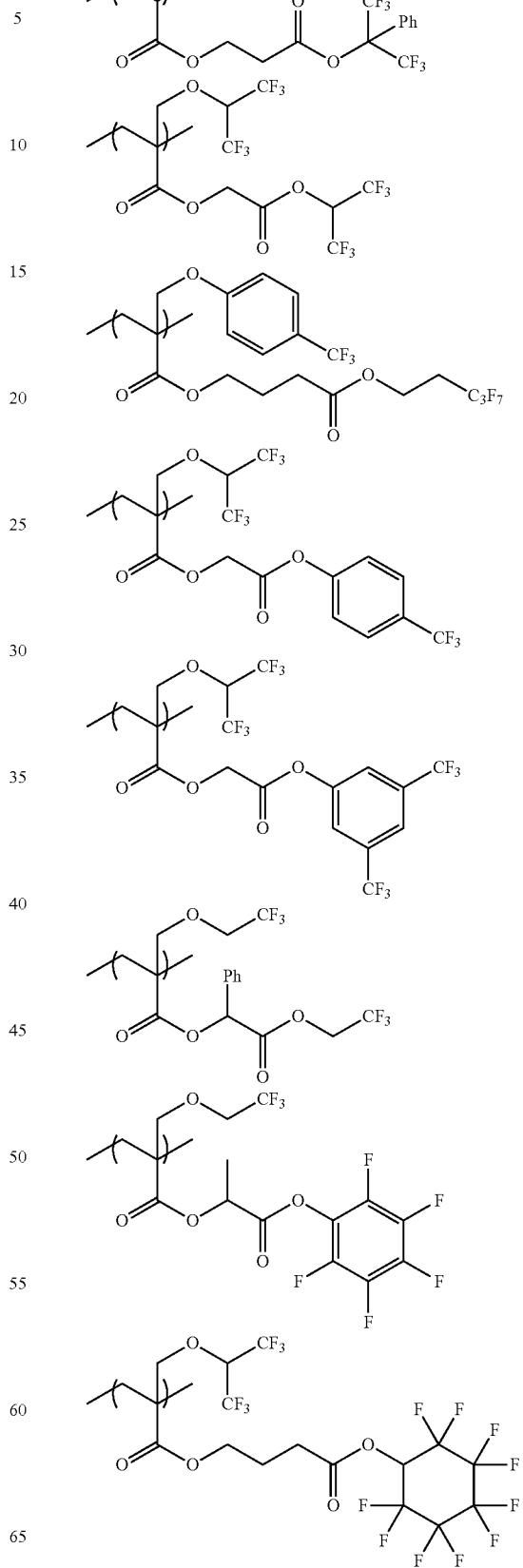

67
-continued
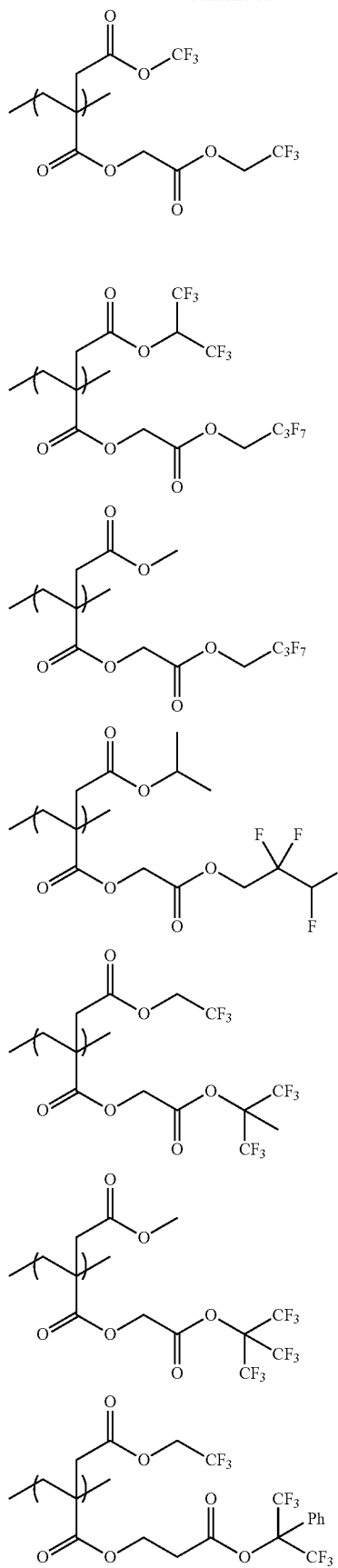
68
-continued
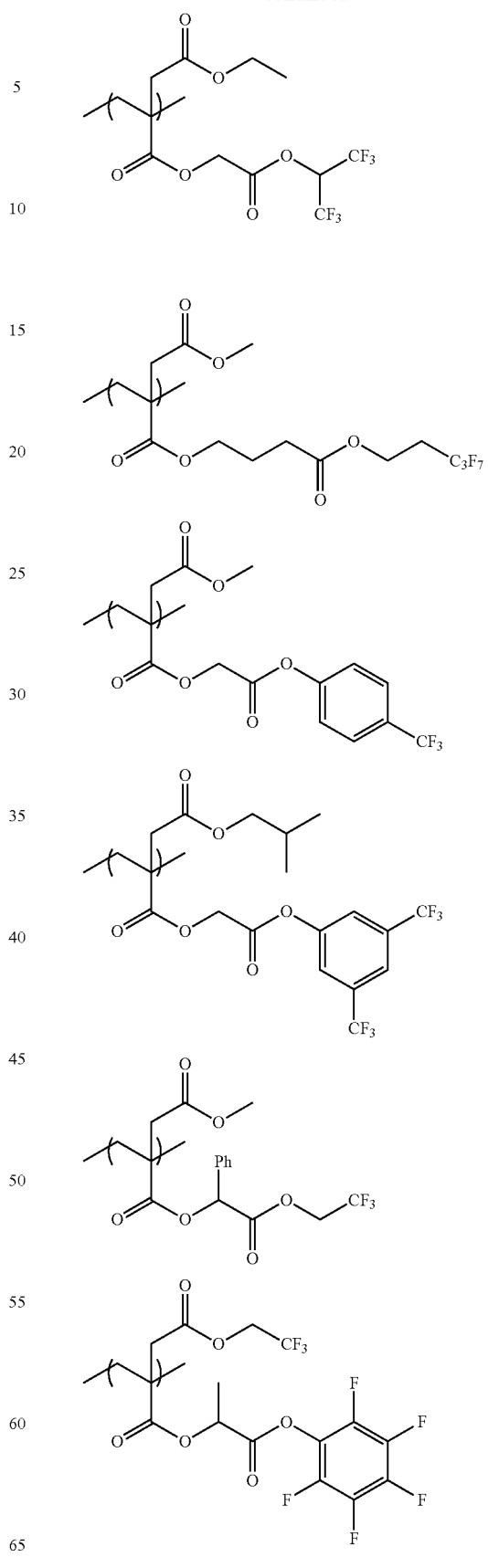

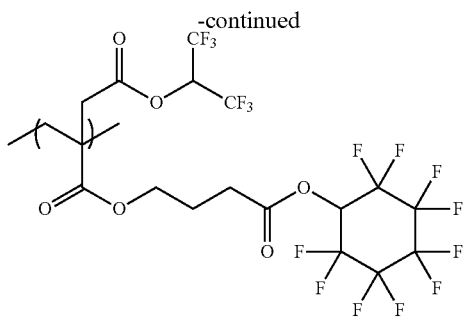

The resin (C) is preferably a hydrophobic resin, and it is preferable that the resin (C) is different from the aforementioned resin (preferably the resin (A)).

It is preferable that the resin (C) is designed to be unevenly distributed on the interface as described above, but, differently from the surfactant, a hydrophilic group does not need to be included in the molecule and may not contribute to the even mixture of the polar/non-polar materials.

In view of the uneven distribution on the film surface, the resin (C) preferably includes any one or more kinds of a "fluorine atom", a "silicon atom", or a "$CH_3$ partial structure contained in a side chain portion of the resin" and more preferably includes two or more kinds thereof.

In a case where the resin (C) includes a fluorine atom and/or a silicon atom, the fluorine atom and/or the silicon atom in the resin (C) may be included in the main chain of the resin and may be included in the side chain.

In the case where the resin (C) includes a fluorine atom, the partial structure having a fluorine atom is preferably a resin having an alkyl group having a fluorine atom, a cycloalkyl group having a fluorine atom, or an aryl group having a fluorine atom.

The alkyl group (preferably having 1 to 10 carbon atoms and more preferably having 1 to 4 carbon atoms) having a fluorine atom is a linear or branched alkyl group in which at least one hydrogen atom is substituted with a fluorine atom and may further have a substituent in addition to the fluorine atom.

The cycloalkyl group having a fluorine atom and the aryl group having a fluorine atom are respectively a cycloalkyl group in which one hydrogen atom is substituted with a fluorine atom and an aryl group having a fluorine atom, and may further have a substituent in addition to the fluorine atom.

Preferable examples of the alkyl group having a fluorine atom, the cycloalkyl group having a fluorine atom, and the aryl group having a fluorine atom include groups represented by the Formulae (F2) to (F4), but the present invention is not limited to these.

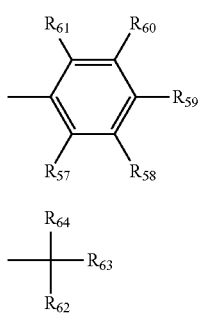

(F2)

(F3)

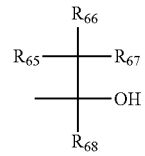

(F4)

In Formulae (F2) to (F4), $R_{57}$ to $R_{68}$ each independently represent a hydrogen atom, a fluorine atom, or a (linear or branched) alkyl group. At least one of $R_{57}$, . . . or $R_{61}$, at least one of $R_{62}$, . . . or $R_{64}$, and at least one of $R_{65}$, . . . , or $R_{68}$ each independently represent a fluorine atom or an alkyl group in which at least one hydrogen atom is substituted with a fluorine atom (preferably having 1 to 4 carbon atoms).

All of $R_{57}$ to $R_{61}$ and $R_{65}$ to $R_{67}$ are preferably fluorine atoms. $R_{62}$, $R_{63}$, and $R_{68}$ are preferably an alkyl group (preferably having 1 to 4 carbon atoms) at least one hydrogen atom is substituted with a fluorine atom and more preferably a perfluoroalkyl group having 1 to 4 carbon atoms. $R_{62}$ and $R_{63}$ may be linked to each other to form a ring.

The resin (C) may contain a silicon atom. A partial structure having a silicon atom is preferably a resin having an alkylsilyl structure (preferably a trialkylsilyl group) or a cyclic siloxane structure.

Examples of the repeating units having a fluorine atom or a silicon atom include repeating units exemplified in [0519] of US2012/0251948A1.

As described above, it is also preferable that the resin (C) includes a $CH_3$ partial structure in the side chain moiety.

Here, the $CH_3$ partial structure of the side chain moiety in the resin (C) (hereinafter also simply referred to as a "side chain $CH_3$ partial structure") includes the $CH_3$ partial structure included in the ethyl group, the propyl group, or the like.

Meanwhile, a methyl group directly bonded to the main chain of the resin (C) (for example, an α-methyl group of a repeating unit having a methacrylic acid structure) is not included in the $CH_3$ partial structure in the present invention because contribution to uneven distribution on the surface of the resin (C) is small due to the influence of the main chain.

More specifically, this is a case where the resin (C) is a repeating unit derived from a monomer having a polymerizable site having a carbon-carbon double bond, such as a repeating unit represented by Formula (M), and in a case where $R_{11}$ to $R_{14}$ are $CH_3$ "itself", $CH_3$ is not included in the $CH_3$ partial structure of the side chain moiety in the present invention.

Meanwhile, the $CH_3$ partial structure that is present from the C—C main chain via a certain atom corresponds to the $CH_3$ partial structure in the present invention. For example, in a case where $R_{11}$ is an ethyl group ($CH_2CH_3$), one $CH_3$ partial structure in the present invention is provided.

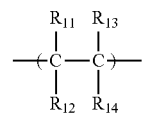

(M)

In Formula (M), $R_{11}$ to $R_{14}$ each independently represent a side chain moiety.

Examples of $R_{11}$ to $R_{14}$ of the side chain moiety include a hydrogen atom and a monovalent organic group.

Examples of the monovalent organic group of $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these groups may further have a substituent.

The resin (C) is preferably a resin having a repeating unit having a $CH_3$ partial structure in a side chain moiety and more preferably has at least one repeating unit (x) of a repeating unit represented by Formula (II) and a repeating unit represented by Formula (III), as such a repeating unit.

Hereinafter, the repeating unit represented by Formula (II) will be described in detail.

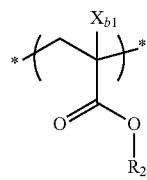

(II)

In Formula (II), $X_{b1}$ represents a hydrogen atom, an alkyl group, a cyano group, or a halogen atom, and $R_2$ represents an organic group that has one or more $CH_3$ partial structures and that is stable to an acid. Here, more specifically, the organic group which is stable to an acid is preferably an organic group that does not have an acid-decomposable group (a group that is decomposed due to an action of an acid and generates a polar group such as a carboxy group).

The alkyl group of $X_{b1}$ is preferably an alkyl group having 1 to 4 carbon atoms, and examples thereof include a methyl group, an ethyl group, a propyl group, a hydroxymethyl group, or a trifluoromethyl group, but a methyl group is more preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group each having one or more $CH_3$ partial structures. The cycloalkyl group, the alkenyl group, the cycloalkenyl group, the aryl group, and the aralkyl group each may further have an alkyl group as a substituent.

$R_2$ is preferably an alkyl group or an alkyl-substituted cycloalkyl group each having one or more $CH_3$ partial structures.

The organic group as $R_2$ that has one or more $CH_3$ partial structures and that is stable to acid preferably has 2 to 10 $CH_3$ partial structures and more preferably 2 to 8 $CH_3$ partial structures.

Preferably specific examples of the repeating unit represented by Formula (II) are provided below. The present invention is not limited thereto.

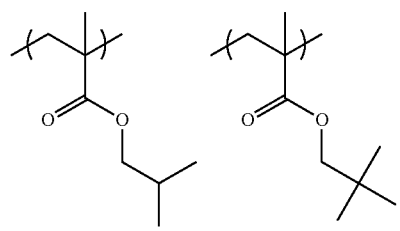

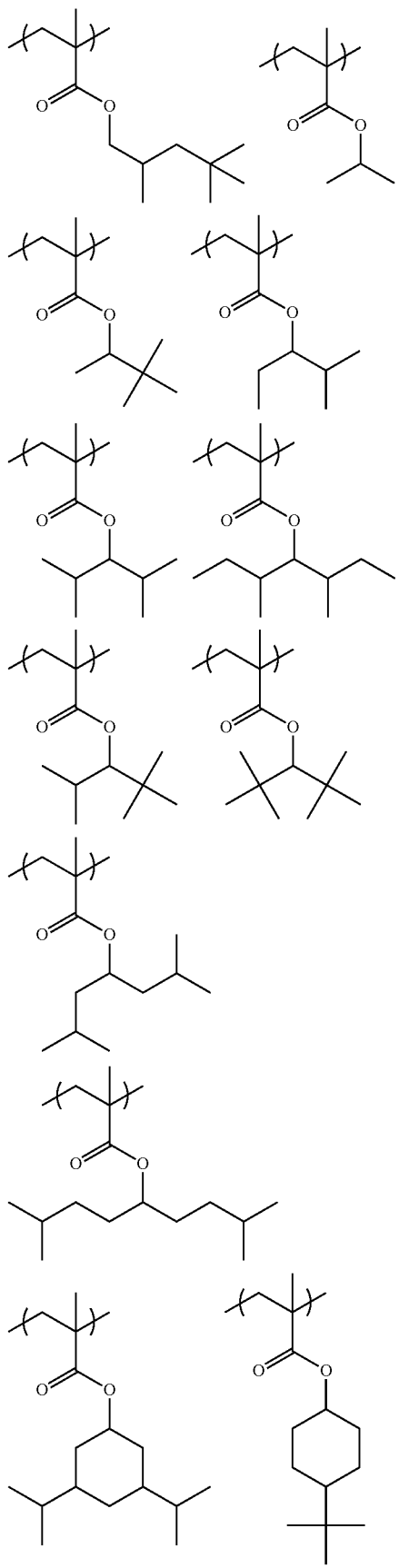

-continued

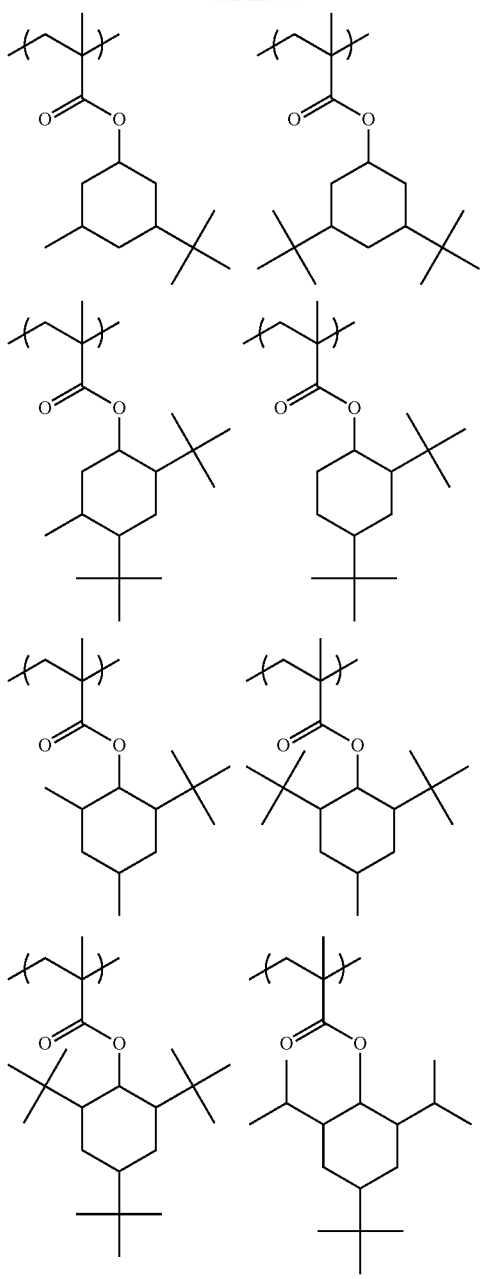

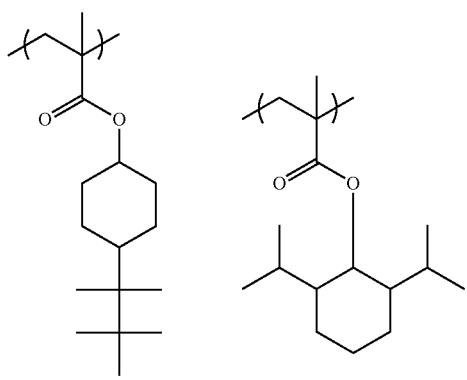

-continued

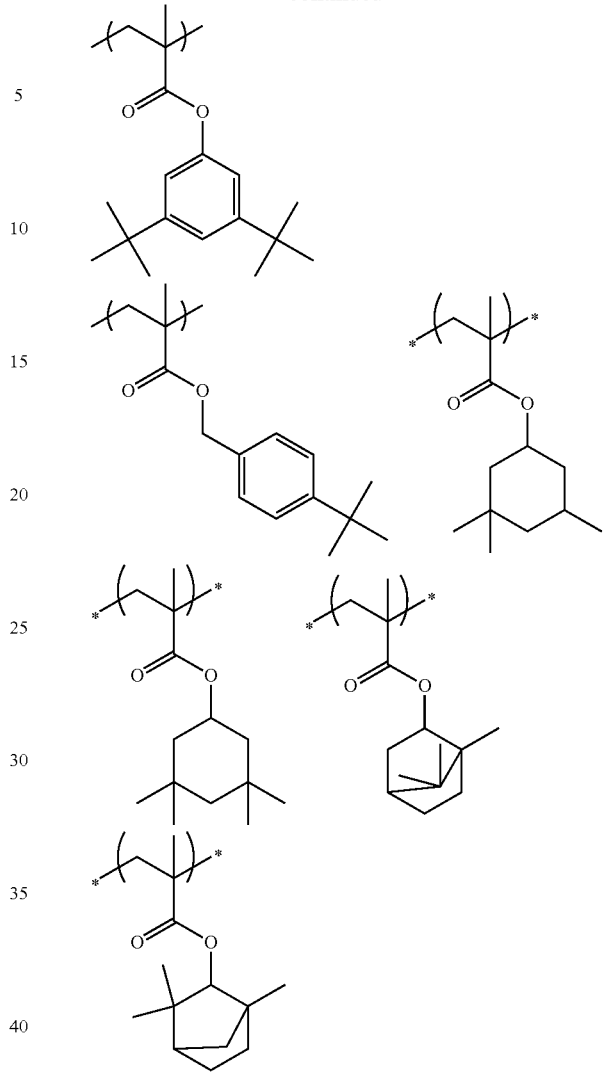

The repeating unit represented by Formula (II) is preferably a repeating unit that is stable to acid (non-acid decomposable). Specifically, it is preferable that the repeating unit is a repeating unit not having a group that is decomposed due to an action of an acid and generates a polar group.

Hereinafter, the repeating unit represented by Formula (III) is described in detail.

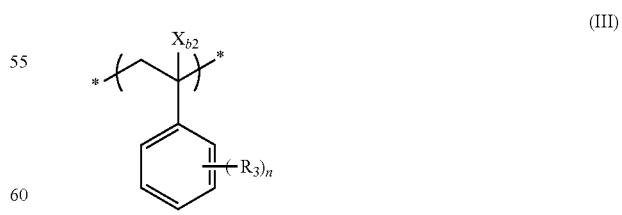

In Formula (III), $X_{b2}$ represents a hydrogen atom, an alkyl group, a cyano group, or a halogen atom, $R_3$ represents an organic group that has one or more $CH_3$ partial structures and that is stable to acid, and n represents an integer of 1 to 5.

The alkyl group of $X_{b2}$ is preferably a group having 1 to 4 carbon atoms, and examples thereof include a methyl group, an ethyl group, a propyl group, a hydroxymethyl group, or a trifluoromethyl group, but a hydrogen atom is preferable.

$X_{b2}$ is preferably a hydrogen atom.

Since $R_3$ is an organic group that is stable to acid, more specifically, the organic group that does not have an acid-decomposable group is preferable.

Examples of $R_3$ include an alkyl group having one or more $CH_3$ partial structures.

The organic group as $R_3$ that has one or more $CH_3$ partial structures and that is stable to an acid preferably has 1 to 10 $CH_3$ partial structures, more preferably 1 to 8 $CH_3$ partial structures, and even more preferably 1 to 4 $CH_3$ partial structures.

n represents an integer of 1 to 5, more preferably represents an integer of 1 to 3, and even more preferably represents 1 or 2.

Preferable specific examples of the repeating unit represented by Formula (III) are provided below. The present invention is not limited thereto.

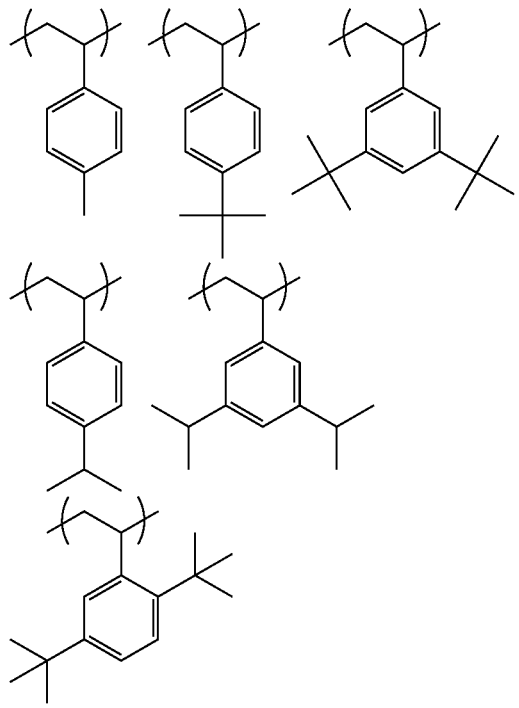

The repeating unit represented by Formula (III) is preferably a repeating unit that is stable to an acid (non-acid decomposable). Specifically, it is preferable that the repeating unit is a repeating unit not having a group that is decomposed due to an action of an acid and generates a polar group.

In the case where the resin (C) includes a $CH_3$ partial structure in the side chain moiety and particularly does not have a fluorine atom and a silicon atom, the content of the at least one repeating unit (x) of the repeating unit represented by Formula (II) or the repeating unit represented by Formula (III) is preferably 90 mol % or more and more preferably 95 mol % or more with respect to the total repeating units of the resin (C). The content is generally 100 mol % or less with respect to the total repeating units of the resin (C).

In a case where the resin (C) contains 90 mol % or more of the at least one repeating unit (x) of the repeating unit represented by Formula (II) or the repeating unit represented by Formula (III) with respect to the total repeating units of the resin (C), the surface free energy of the resin (C) increases. As a result, the resin (C) is hardly unevenly distributed on the surface of the actinic ray-sensitive or radiation-sensitive film, and a static/dynamic contact angle of the actinic ray-sensitive or radiation-sensitive film against water is securely improved, so as to improve immersion liquid followability.

Even in a case where (i) a fluorine atom and/or a silicon atom is included or in a case where (ii) a $CH_3$ partial structure is included in a side chain moiety, the resin (C) may have at least one group selected from the group of (x) and (z) as below:

(x) an alkali-soluble group; and (z) a group that is decomposed due to an action of an acid.

(x) Examples of the alkali-soluble group include a phenolic hydroxyl group, a carboxylic acid group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl) imide group, a bis(alkylcarbonyl) methylene group, a bis(alkylcarbonyl) imide group, a bis(alkylsulfonyl) methylene group, a bis(alkylsulfonyl) imide group, a tris(alkylcarbonyl) methylene group, and a tris(alkylsulfonyl) methylene group.

Preferable examples of the alkali-soluble group include a fluorinated alcohol group (preferably hexafluoroisopropanol), a sulfonimide group, and a bis(carbonyl) methylene group.

Examples of the repeating unit having an alkali-soluble group (x) include a repeating unit in which an alkali-soluble group is directly bonded to the main chain of the resin like a repeating unit of acrylic acid or methacrylic acid and a repeating unit in which an alkali-soluble group is bonded to the main chain of the resin via a linking group, and a repeating unit obtained by introducing a polymerization initiator having an alkali-soluble group or a chain transfer agent can be introduced to a terminal of a polymer chain in a case of polymerization, and all cases are preferable.

The content ratio of the repeating unit having an alkali-soluble group (x) is preferably 1 to 50 mol %, more preferably 3 to 35 mol %, and even more preferably 5 to 30 mol % with respect to the total repeating units in the resin (C).

Specific examples of the repeating unit having the alkali-soluble group (x) are shown below, but the present invention is not limited thereto, in the specific example. Rx represents H, $CH_3$, $CH_2OH$, or $CF_3$.

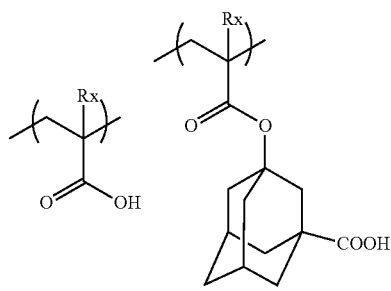

77
-continued
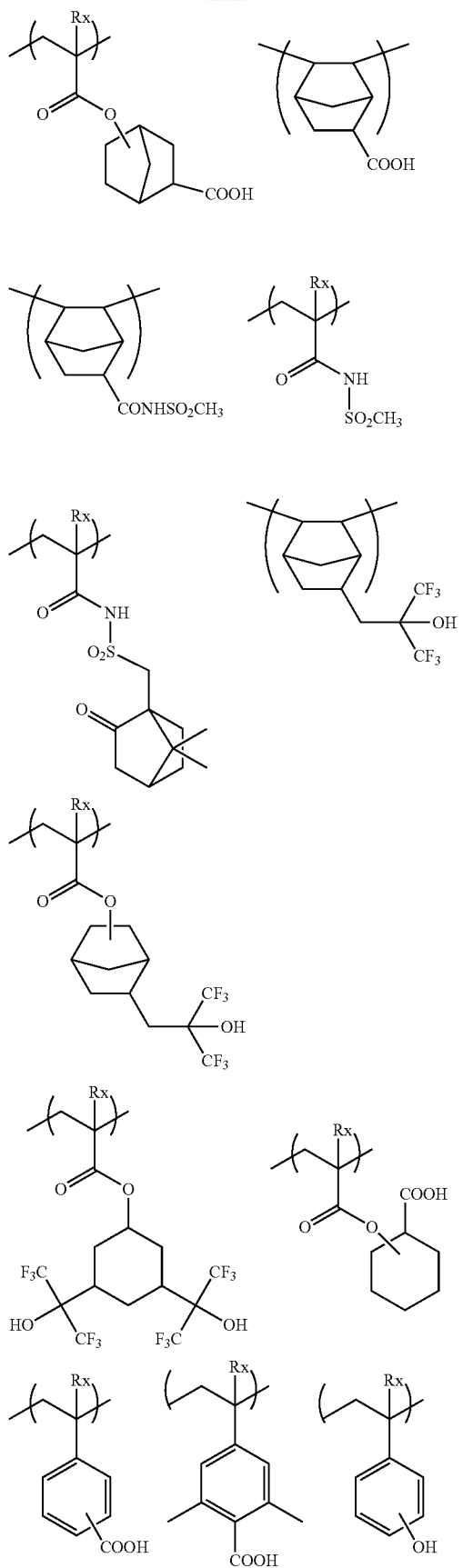
78
-continued
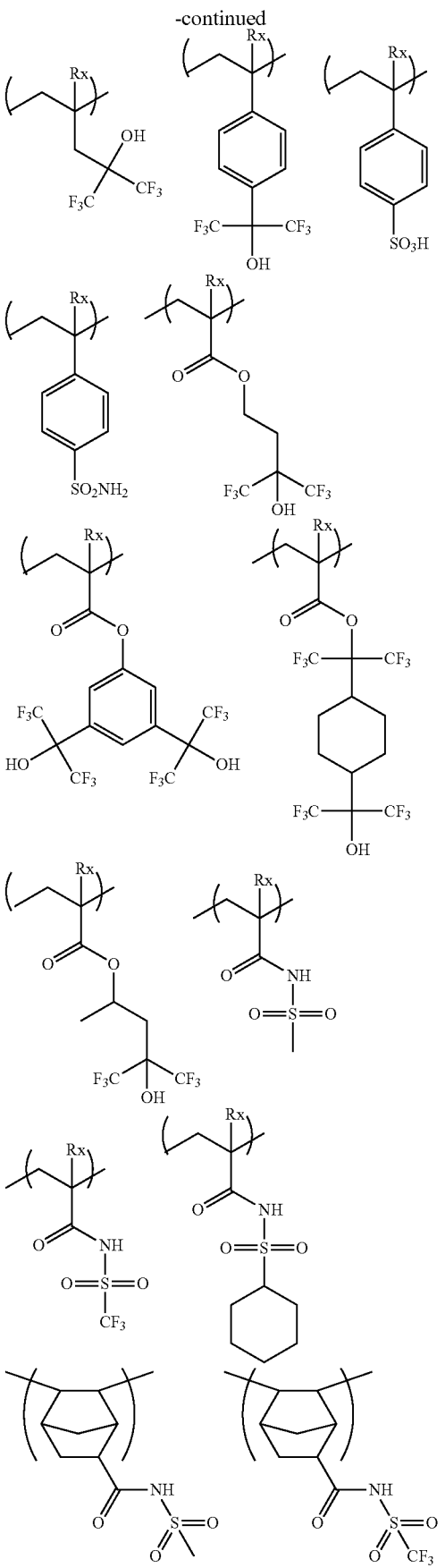

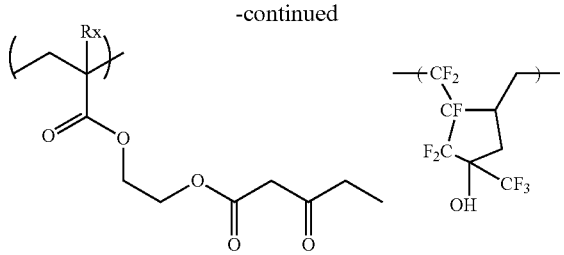

Examples of the repeating unit having the group (z) which is decomposed due to the action of an acid in the resin (C) include repeating units which are the same as the repeating units having an acid-decomposable group as provided as the resin (A). The acid-decomposable group is preferably a cumyl ester group, an enol ester group, an acetal ester group, a tertiary alkyl ester group and the like. A tertiary alkyl ester group is more preferable.

A repeating unit that has an acid-decomposable group is preferably a repeating unit represented by Formula (CAI).

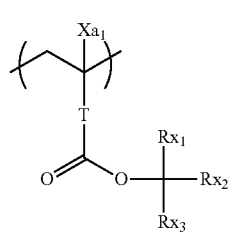

(CAI)

In Formula (CAI), $Xa_1$ represents a hydrogen atom, a methyl group, or a group represented by —$CH_2$—$R_9$. $R_9$ represents a hydroxyl group or a monovalent organic group, examples of the monovalent organic group include an alkyl group having 5 or less carbon atoms and an acyl group, an alkyl group having 3 or less carbon atoms is preferable, and a methyl group is more preferable. $Xa_1$ preferably represent a hydrogen atom, a methyl group, a trifluoromethyl group, or a hydroxymethyl group.

T represents a single bond or a divalent linking group.

$Rx_1$ to $Rx_3$ each independently represent a (linear or branched) alkyl group or a (monocyclic or polycyclic) cycloalkyl group.

Two out of $Rx_1$ to $Rx_3$ are bonded to form a (monocyclic or polycyclic) cycloalkyl group.

Examples of the divalent linking group of T include an alkylene group, a —COO-Rt-group, and an —O-Rt- group. In the formula, Rt represents an alkylene group or a cycloalkylene group.

T preferably a single bond or a —COO-Rt- group. Rt is preferably an alkylene group having 1 to 5 carbon atoms and more preferably a —$CH_2$— group and a —$(CH_2)_3$— group.

The alkyl group of $Rx_1$ to $Rx_3$ is preferably a group having 1 to 4 carbon atoms such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, a polycyclic cycloalkyl group such as a norbomyl group, a tetracyclodecanyl group, a tetracyclododecanyl group, and an adamantyl group.

The cycloalkyl group formed by bonding two out of $Rx_1$ to $Rx_3$ is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group, and a monocyclic cycloalkyl group having 5 or 6 carbon atoms is preferable.

An aspect in which $Rx_1$ is a methyl group or an ethyl group and in which and $Rx_2$ and $Rx_3$ are bonded to each other to form the above cycloalkyl group is preferable.

Each of the above groups may have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and a group having 8 or less carbon atoms is preferable.

With respect to the resin (C), the content ratio of the repeating unit having a group (z) which is decomposed due to an action of an acid is preferably 1 to 80 mol %, more preferably 10 to 80 mol %, and even more preferably 20 to 60 mol % with respect to the total repeating units in the resin (C). By having the group (z) which is decomposed due to an action of an acid, LWR can be improved.

The resin (C) may have another repeating unit. Examples of the preferable aspects of the other repeating unit include the following.

(cy1) A repeating unit having a fluorine atom and/or a silicon atom, being stable to an acid, and being poorly soluble or insoluble in an alkali developer.

(cy2) A repeating unit not having a fluorine atom nor a silicon atom, being stable to an acid, and being poorly soluble or insoluble in an alkali developer.

(cy3) A repeating unit having a fluorine atom and/or a silicon atom and having a polar group other than the above (x) and (z).

(cy4) A repeating unit not having a fluorine atom nor a silicon atom and having a polar group other than the above (x) and (z).

The expression "poorly soluble or insoluble in an alkali developer" in the repeating units of (cy1) and (cy2) indicates that (cy1) and (cy2) do not include an alkali-soluble group or a group (for example, an acid-decomposable group or a polarity conversion group) that generates an alkali-soluble group due to an action of an acid or an alkali developer.

It is preferable that the repeating units (cy1) and (cy2) have an alicyclic hydrocarbon structure not having a polar group.

Preferable aspects of the repeating units (cy1) to (cy4) are provided below.

The repeating units (cy1) and (cy2) are preferably repeating units represented by Formula (CIII).

(CIII)

In Formula (CIII), $R_{c31}$ represents an alkyl group that may be substituted with a hydrogen atom or a fluorine atom, a cyano group, or a —$CH_2$—O—$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group and particularly preferably a hydrogen atom or a methyl group.

$R_{c32}$ represents a group having an alkyl group, a cycloalkyl group, an alkenyl group, a cycloalkenyl group, or an aryl group. These groups may be substituted with a group including a fluorine atom, a silicon atom, or the like.

$L_{c3}$ represents a single bond or a divalent linking group.

The alkyl group of $R_{c32}$ in Formula (CIII) is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group having 6 to 20 carbon atoms or a naphthyl group, and these groups may have a substituent.

$R_{c32}$ is preferably an unsubstituted alkyl group or an alkyl group that is substituted with a fluorine atom. The divalent linking group of $L_{c3}$ is preferably an alkylene group (preferably having 1 to 5 carbon atoms), an oxy group, a phenylene group, or an ester bond (a group represented by —COO—).

The repeating units (cy1) and (cy2) are preferably repeating units represented by Formulae (C4) and (C5).

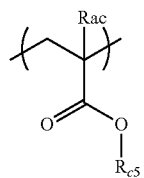
(C4)

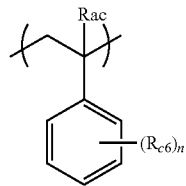
(C5)

In Formulae (C4) and (C5), $R_{c5}$ represents a hydrocarbon group having at least one cyclic structure and having none of the hydroxyl group and a cyano group.

Rac represents an alkyl group that may be substituted with a hydrogen atom or a fluorine atom, a cyano group, or a —$CH_2$—O—$Rac_2$ group. In the formula, $Rac_2$ represents a hydrogen atom, an alkyl group, or an acyl group. Rac is preferably a hydrogen atom, a methyl group, a hydroxymethyl group, or a trifluoromethyl group and particularly preferably a hydrogen atom or a methyl group.

The cyclic structure of $R_{c5}$ includes a monocyclic hydrocarbon group and a polycyclic hydrocarbon group. Examples of the monocyclic hydrocarbon group include a cycloalkyl group having 3 to 12 carbon atoms and a cycloalkenyl group having 3 to 12 carbon atoms. A preferable monocyclic hydrocarbon group is a monocyclic hydrocarbon group having 3 to 7 carbon atoms.

The polycyclic hydrocarbon group includes a ring assembly hydrocarbon group and a crosslinked cyclic hydrocarbon group. Examples of the crosslinked cyclic hydrocarbon ring include a bicyclic hydrocarbon ring, a tricyclic hydrocarbon ring, and a tetracyclic hydrocarbon ring. The crosslinked cyclic hydrocarbon ring also includes a fused cyclic hydrocarbon ring (for example, a fused ring obtained by fusing a plurality of 5-membered to 8-membered cycloalkane rings). Preferable examples of the crosslinked cyclic hydrocarbon ring include a norbornyl group and an adamantyl group.

These alicyclic hydrocarbon groups may have a substituent, and preferable examples of the substituent include a halogen atom, an alkyl group, a hydroxyl group protected by a protective group, and an amino group protected by a protective group. Preferable examples of the halogen atom include bromine, chlorine, and fluorine atoms, and preferable examples of the alkyl groups include methyl, ethyl, butyl, and t-butyl groups. The above alkyl group may further have a substituent, and examples of the substituent that may be further provided include a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group, and an aralkyloxycarbonyl group. Preferable examples of the alkyl group include an alkyl group having 1 to 4 carbon atoms, preferable examples of the substituted methyl group include methoxymethyl, methoxythiomethyl, benzyloxymethyl, t-butoxymethyl, and a 2-methoxyethoxymethyl group, preferable examples of the substituted ethyl group include 1-ethoxyethyl and 1-methyl-1-methoxyethyl, preferable examples of the acyl groups include an aliphatic acyl group having 1 to 6 carbon atoms such as formyl, acetyl, propionyl, butyryl, isobutyryl, valeryl, and pivaloyl groups, and preferable examples of the alkoxycarbonyl group include an alkoxycarbonyl group having 2 to 4 carbon atoms.

$R_{c6}$ represents an alkyl group, a cycloalkyl group, an alkenyl group, a cycloalkenyl group, an alkoxycarbonyl group, or an alkylcarbonyloxy group. These groups may be substituted with a fluorine atom or a silicon atom.

The alkyl group of $R_{c6}$ is preferably a linear or branched alkyl group having 1 to 20 carbon atoms. The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

n represents an integer of 0 to 5. In a case where n is 2 or more, a plurality of $R_{c6}$'s may be identical to or different from each other.

$R_{c6}$ is preferably an unsubstituted alkyl group or an alkyl group substituted with a fluorine atom and is particularly preferably a trifluoromethyl group and a t-butyl group.

It is preferable that the (cy1) and (cy2) are also repeating units represented by Formula (CII-AB).

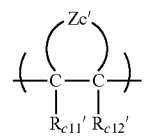
(CII-AB)

In Formula (CII-AB), $R_{c11}'$ and $R_{c12}'$ each independently represent a hydrogen atom, a cyano group, a halogen atom, or an alkyl group.

Zc' represents an atomic group that includes two bonded carbon atoms (C—C) and is to form an alicyclic structure.

Formula (CII-AB) is more preferably Formula (CII-AB1) or (CII-AB2).

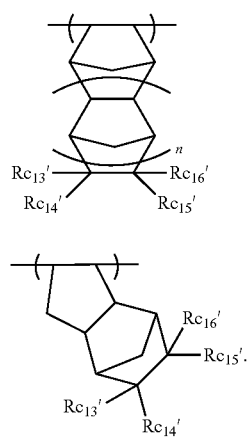

(CII-AB1)

(CII-AB2)

In Formulae (CII-AB1) and (CII-AB2), $Rc_{13}'$ to $Rc_{16}'$ each independently represent a hydrogen atom, a halogen atom, an alkyl group, or a cycloalkyl group.

At least two of $Rc_{13}'$ to $Rc_{16}'$ are bonded to each other to form a ring.

n represents 0 or 1.

Specific examples of (cy1) and (cy2) are provided below, but the present invention is not limited to these. In the formula, Ra represents H, $CH_3$, $CH_2OH$, $CF_3$, or CN.

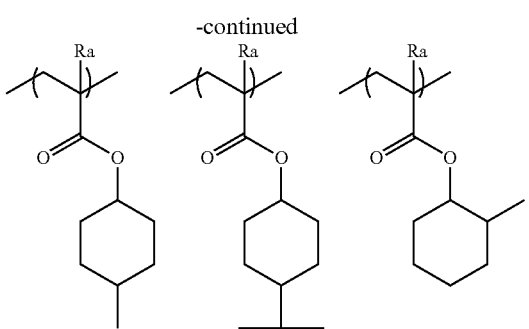

-continued

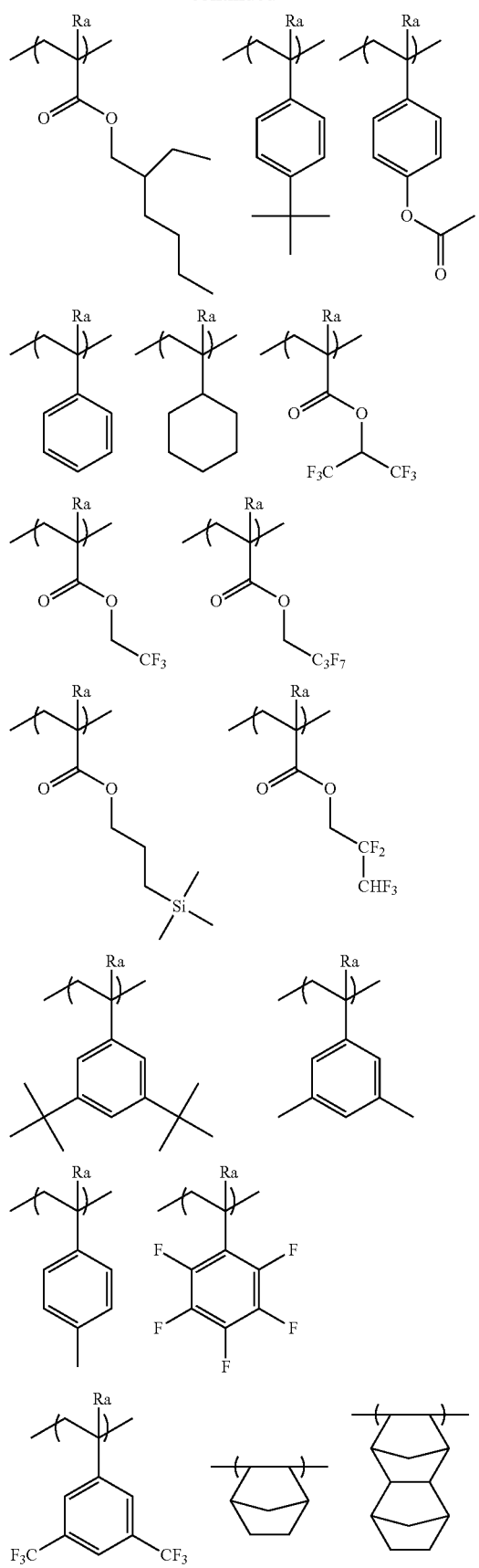
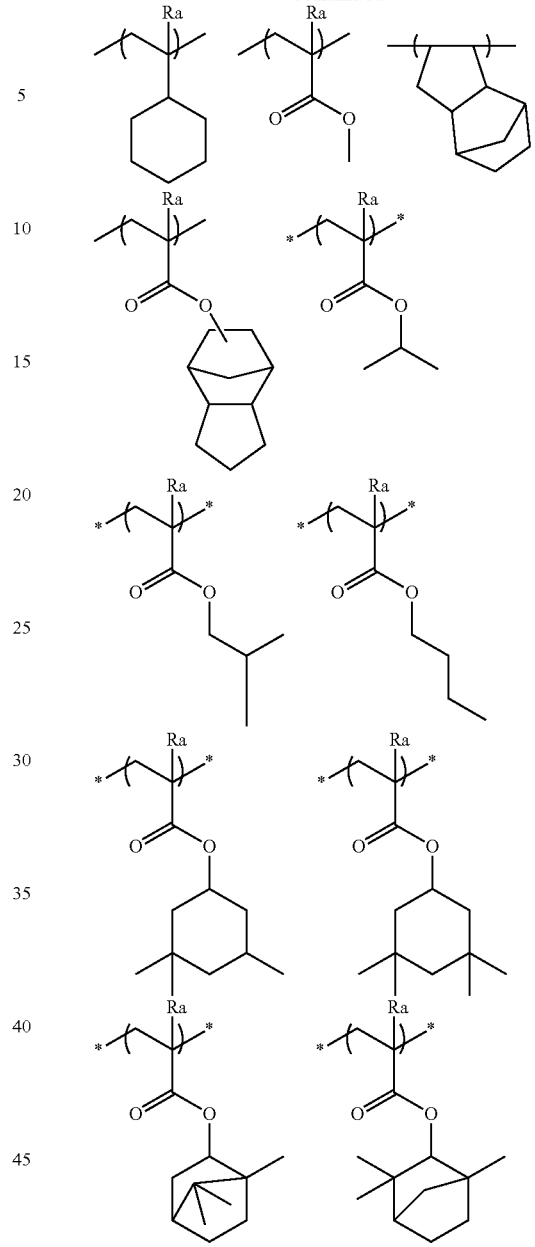

In (cy3) and (cy4), the polar group is preferably a repeating unit having a hydroxyl group or a cyano group. As a result, developer affinity is improved. The repeating unit having a hydroxyl group or a cyano group is preferably a repeating unit having an alicyclic hydrocarbon structure substituted with a hydroxyl group or a cyano group. The alicyclic hydrocarbon structure in the alicyclic hydrocarbon structure substituted with a hydroxyl group or a cyano group is preferably an adamantyl group, a diamantyl group, or a norbornyl group. Examples of the preferable alicyclic hydrocarbon structure substituted with a hydroxyl group or a cyano group include a monohydroxyadamantyl group, a dihydroxyadamantyl group, a monohydroxydiamantyl group, a dihydroxydiamantyl group, and a cyano group-substituted norbornyl group Examples of the repeating unit having an atomic group include repeating units represented by Formulae (CAIIa) to (CAIId).

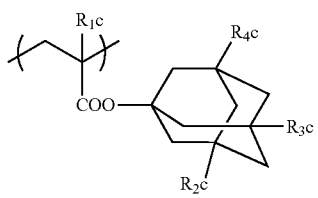 (CAIIa)

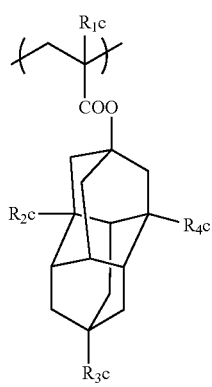 (CAIIb)

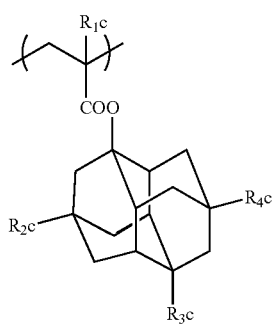 (CAIIc)

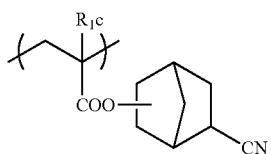 (CAIId)

In Formulae (CAIIa) to (CAIId), $R_1c$ represents a hydrogen atom, a methyl group, a trifluoromethyl group, or a hydroxymethyl group.

$R_2c$ to $R_4c$ each independently represent a hydrogen atom, a hydroxyl group, or a cyano group. Here, at least one of $R_2c$, . . . , or $R_4c$ represents a hydroxyl group or a cyano group. One or two of $R_2c$ to $R_4c$ are preferably hydroxyl groups, and the remainders are hydrogen atoms. In Formula (CAIIa), it is even more preferable that two of $R_2c$ to $R_4c$ are hydroxyl groups, and the remainders are hydrogen atoms.

Specific examples of the repeating units represented by (cy3) and (cy4) are provided below, but the present invention is not limited to these.

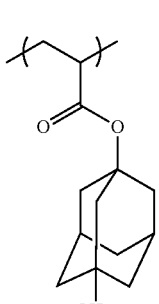 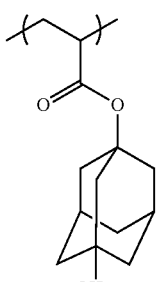 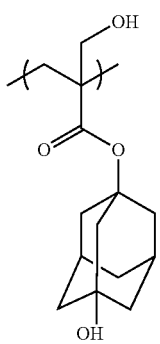

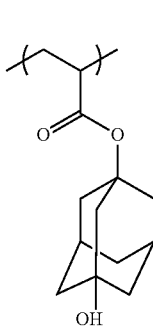 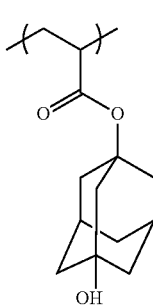

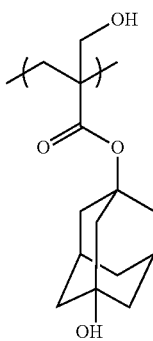

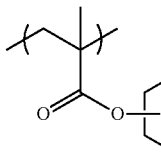

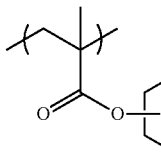

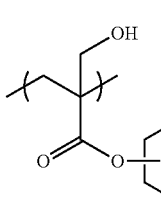 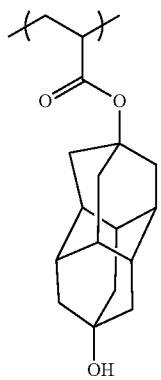

-continued

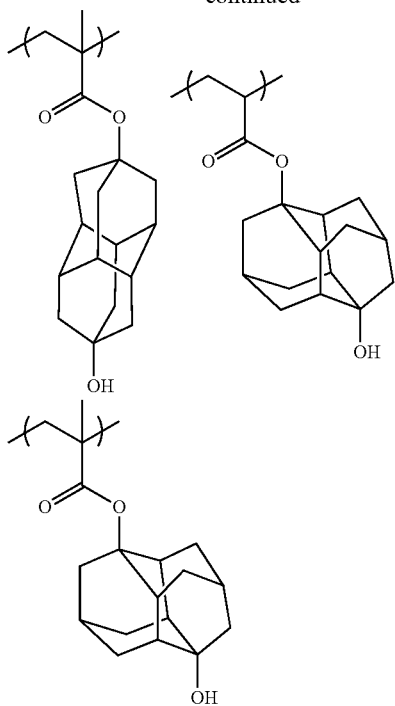

The content ratio of the repeating unit represented by (cy1) to (cy4) is preferably 5 to 40 mol %, more preferably 5 to 30 mol %, and even more preferably 10 to 25 mol % with respect to the total repeating unit in the resin (C).

The resin (C) may have a plurality of repeating units represented by (cy1) to (cy4).

The repeating unit containing a fluorine atom is preferably 10 to 100 mol % and more preferably 30 to 100 mol % with respect to the total repeating units included in the resin (C). The repeating unit including a silicon atom is preferably 10 to 100 mol % and more preferably 20 to 100 mol % with respect to the total repeating units included in the resin (C).

Meanwhile, particularly, in a case where the resin (C) includes a $CH_3$ partial structure in a side chain moiety, an aspect in which the resin (C) does not substantially contain a fluorine atom and a silicon atom is also preferable. Also, it is preferable that the resin (C) is substantially constituted only by repeating units constituted only by atoms selected from a carbon atom, an oxygen atom, a hydrogen atom, a nitrogen atom, and a sulfur atom.

The weight-average molecular weight of the resin (C) in terms of standard polystyrene is preferably 1,000 to 100,000, more preferably 1,000 to 50,000, and even more preferably 2,000 to 25,000.

The content of the resin (C) in the actinic ray-sensitive or radiation-sensitive resin composition is preferably 0.01 to 10 mass %, more preferably 0.1 to 10 mass %, even more preferably 0.1 to 9 mass %, and particularly preferably 0.5 to 8 mass % with respect to the total solid content of the actinic ray-sensitive or radiation-sensitive resin composition.

The resin (C) may be used singly and two or more kinds thereof may be used in combination. In a case where two or more resins (C) are used in combination, it is preferable that the total content is in the above range.

In a case where the actinic ray-sensitive or radiation-sensitive film is formed, the receding contact angle (temperature: 23° C., relative humidity: 45%) of water on the actinic ray-sensitive or radiation-sensitive film is preferably 75° or more, more preferably 80° or more, and even more preferably 85° or more. For example, even in a case where the scanning speed in a case of exposure is set as 800 mm/s, the immersion defect is sufficiently decreased by causing the receding contact angle to be 85° or more.

The receding contact angle of water can be suitably achieved, for example, by setting the content of the resin (C) to be in the above range.

It is obvious that the resin (C) has few impurities such as metal, and the content of the retained monomer or oligomer components is preferably 0 to 10 mass %, more preferably 0 to 5 mass %, and even more preferably 0 to 1 mass %. Accordingly, it is possible to obtain a resist which does not have foreign matter in a liquid or a temporal change of sensitivity or the like. In view of resolution, a resist shape, a sidewall of a resist pattern, and roughness, the molecular weight distribution (Mw/Mn, also referred to as a dispersion degree) is preferably in the range of 1 to 3 and more preferably in the range of 1 to 2.

As the proportion (surface coverage) of the resin (C) that is in present on the outermost surface of the actinic ray-sensitive or radiation-sensitive film obtained from the composition containing the resin (C) is higher, even in a case where residual liquid droplets remain after immersion exposure, the permeation of the liquid droplets to the actinic ray-sensitive or radiation-sensitive film is suppressed. As a result, since immersion defects can be reduced, it is preferable that the surface coverage is higher.

The surface coverage of the resin (C) of the actinic ray-sensitive or radiation-sensitive film is preferably 50% or more, more preferably 70% or more, even more preferably 90% or more, and most preferably 100%.

As the method of calculating the surface coverage of the actinic ray-sensitive or radiation-sensitive film obtained from the composition containing the resin (C), the following method can be mentioned.

(Surface coverage)=(cos θR−cos θo)/(cos θA−cos θo)

Here, θR represents a stationary contact angle of water of an actinic ray-sensitive or radiation-sensitive film obtained from a composition containing the resin (C), θA represents a stationary contact angle of water of a film obtained only from the resin (C), and θo represents a stationary contact angle of water of an actinic ray-sensitive or radiation-sensitive film obtained from a composition which does not contain the resin (C) and in which components other than the resin (C) are the same as those in the composition containing the resin (C).

It is preferable that the actinic ray-sensitive or radiation-sensitive film obtained from the composition containing the resin (C) is in a state in which the surface coverage of the resin (C) is high and the receding contact angle of water is high before the exposure and the stationary contact angle of water is low after the exposure development, since the development detect is decreased.

The stationary contact angle (measurement condition temperature: 23° C., relative humidity: 45%) of water of the actinic ray-sensitive or radiation-sensitive film after the exposure development is preferably 70° or less, more preferably 65° or less, and even more preferably 60° or less.

Hereinafter, specific examples of the resin (C) are presented in Tables 1 to 3. In the following table, the compositional ratio of the repeating unit represents a molar ratio. Repeating units in compositions presented in the following table are described below (TMS represents a trimethylsilyl group). In the table, Pd represents a dispersion degree (Mw/Mn) of a resin.

TABLE 1

| Resin | Composition (Compositional ratio) | Mw | Pd |
|---|---|---|---|
| P-1 | p-1(100) | 7500 | 1.6 |
| P-2 | p-4(100) | 11000 | 1.5 |
| P-3 | p-7/p-60(90/10) | 12000 | 1.6 |
| P-4 | p-13/p-60(80/20) | 9000 | 1.6 |
| P-5 | p-12(100) | 9000 | 1.6 |
| P-6 | p-30(100) | 7000 | 1.5 |
| P-7 | p-47/p-63(90/10) | 8000 | 1.6 |
| P-8 | p-50(100) | 9000 | 1.5 |
| P-9 | p-45(100) | 10000 | 1.6 |
| P-10 | p-3/p-38(90/10) | 11000 | 1.5 |
| P-11 | p-20(100) | 12000 | 1.6 |
| P-12 | p-16/p-62(90/10) | 12000 | 1.4 |
| P-13 | p-23(100) | 11500 | 1.6 |
| P-14 | p-27(100) | 15000 | 1.5 |
| P-15 | p-57(100) | 8500 | 1.6 |
| P-16 | p-3/p-39(98/2) | 17000 | 1.4 |
| P-17 | p-8(100) | 12000 | 1.4 |
| P-18 | p-17(100) | 15000 | 1.6 |
| P-19 | p-40/p-65(98/2) | 10000 | 1.6 |
| P-20 | p-42(100) | 8500 | 1.5 |
| P-21 | p-42/p-61(80/20) | 9000 | 1.6 |
| P-22 | p-1/p-63(90/10) | 11000 | 1.6 |
| P-23 | p-41(100) | 16000 | 1.6 |
| P-24 | p-11(100) | 14500 | 1.6 |
| P-25 | p-43(100) | 12500 | 1.6 |
| P-26 | p-54(100) | 12000 | 1.4 |
| P-27 | p-54/p-38(80/20) | 13500 | 1.6 |
| P-28 | p-42/p-61(80/20) | 9000 | 1.6 |
| P-29 | p-18(100) | 10000 | 1.6 |
| P-30 | p-23/p-63(98/2) | 95000 | 1.4 |
| P-31 | p-20/p-64(90/10) | 8000 | 1.6 |
| P-32 | p-10(100) | 9500 | 1.6 |
| P-33 | p-5/p-69(80/20) | 12000 | 1.6 |
| P-34 | p-44(100) | 10000 | 1.6 |
| P-35 | p-44/p-71(98/2) | 9500 | 1.6 |
| P-36 | p-44/p-64(90/10) | 15000 | 1.6 |
| P-37 | p-54/p-74(70/30) | 16000 | 1.6 |
| P-38 | p-55(100) | 17000 | 1.6 |
| P-39 | p-25(100) | 9500 | 1.6 |
| P-40 | p-29(100) | 9000 | 1.6 |
| P-41 | p-41/p-70(90/10) | 11000 | 1.6 |
| P-42 | p-41/p-71(80/20) | 12000 | 1.6 |
| P-43 | p-36(100) | 12000 | 1.6 |
| P-44 | p-36/p-73(90/10) | 11500 | 1.6 |
| P-45 | p-37(100) | 15000 | 1.6 |
| P-46 | p-22/p-75(90/10) | 8500 | 1.6 |
| P-47 | p-8/p-63(90/10) | 6500 | 1.6 |
| P-48 | p-15/p-38(98/2) | 7000 | 1.6 |
| P-49 | p-2(100) | 11000 | 1.5 |
| P-50 | p-31/p-70(98/2) | 12000 | 1.6 |
| P-51 | p-55/p-69(90/10) | 9000 | 1.6 |
| P-52 | p-56/p-68(80/20) | 9000 | 1.4 |
| P-53 | p-6/p-2(50/50) | 7000 | 1.6 |
| P-54 | p-57/p-74(80/20) | 8000 | 1.6 |
| P-55 | p-57/p-75(70/30) | 9000 | 1.6 |
| P-56 | p-57/p-67(90/10) | 10000 | 1.6 |
| P-57 | p-48/p-72(98/2) | 15000 | 1.6 |
| P-58 | p-48(100) | 16000 | 1.6 |
| P-59 | p-16(100) | 10000 | 1.4 |
| P-60 | p-19/p-67(98/2) | 9000 | 1.6 |
| P-61 | p-39/p-32(80/20) | 9000 | 1.5 |
| P-62 | p-19(100) | 11000 | 1.6 |
| P-63 | p-8/p-74(80/20) | 12000 | 1.4 |
| P-64 | p-40(100) | 12000 | 1.6 |
| P-65 | p-47(100) | 14500 | 1.4 |
| P-66 | p-53/p-61(80/20) | 12500 | 1.6 |
| P-67 | p-4/p-70(80/20) | 12000 | 1.6 |
| P-68 | p-4/p-71(80/20) | 13500 | 1.6 |
| P-69 | p-31(100) | 11500 | 1.6 |
| P-70 | p-37/p-64(80/20) | 11000 | 1.6 |
| P-71 | p-50/p-75(80/20) | 8000 | 1.6 |
| P-72 | p-51/p-61(98/2) | 10000 | 1.6 |

TABLE 1-continued

| Resin | Composition (Compositional ratio) | Mw | Pd |
|---|---|---|---|
| P-73 | p-51/p-62(90/10) | 9000 | 1.6 |
| P-74 | p-25/p-57(90/10) | 9000 | 1.6 |
| P-75 | p-5(100) | 11000 | 1.6 |
| P-76 | p-45/p-65(80/20) | 12000 | 1.6 |
| P-77 | p-46(100) | 8000 | 1.6 |
| P-78 | p-43/p-63(98/2) | 9000 | 1.4 |
| P-79 | p-9(100) | 9000 | 1.6 |
| P-80 | p-9/p-62(98/2) | 7000 | 1.5 |

TABLE 2

| Resin | Composition (Compositional ratio) | Mw | Pd |
|---|---|---|---|
| P-81 | p-11/p-61 (90/10) | 8000 | 1.6 |
| P-82 | p-43/p-60 (90/10) | 9000 | 1.4 |
| P-83 | p-14/p-56 (80/20) | 11000 | 1.4 |
| P-84 | p-29/p-63 (98/2) | 12000 | 1.6 |
| P-85 | p-52/p-56 (90/10) | 12000 | 1.6 |
| P-86 | p-3 (100) | 12000 | 1.6 |
| P-87 | p-26 (100) | 15000 | 1.6 |
| P-88 | p-33 (100) | 10000 | 1.6 |
| P-89 | p-33/p-73 (90/10) | 9000 | 1.6 |
| P-90 | p-52 (100) | 9000 | 1.6 |
| P-91 | p-52/p-57 (50/50) | 11000 | 1.6 |
| P-92 | p-59 (100) | 12000 | 1.6 |
| P-93 | p-8/p-63 (98/2) | 10000 | 1.5 |
| P-94 | p-24 (100) | 9000 | 1.6 |
| P-95 | p-1/p-65 (98/2) | 9000 | 1.6 |
| P-96 | p-24/p-70 (50/50) | 11000 | 1.4 |
| P-97 | p-32 (100) | 12000 | 1.6 |
| P-98 | p-32/p-69 (90/10) | 12000 | 1.6 |
| P-99 | p-53 (100) | 11500 | 1.6 |
| P-100 | p-53/p-66 (80/20) | 12000 | 1.6 |
| P-101 | p-13/p-66 (80/20) | 9000 | 1.6 |
| P-102 | p-34 (100) | 9000 | 1.6 |
| P-103 | p-39 (100) | 11000 | 1.6 |
| P-104 | p-22 (100) | 8500 | 1.6 |
| P-105 | p-46/p-66 (90/10) | 11000 | 1.4 |
| P-106 | p-58 (100) | 12000 | 1.6 |
| P-107 | p-58/p-68 (98/2) | 9000 | 1.5 |
| P-108 | p-10/p-68 (90/10) | 7000 | 1.6 |
| P-109 | p-6 (100) | 8000 | 1.4 |
| P-110 | p-49 (100) | 8000 | 1.6 |
| P-111 | p-49/p-63 (90/10) | 7000 | 1.4 |
| P-112 | p-49/p-60 (98/2) | 12000 | 1.6 |
| P-113 | p-58/p-75 (80/20) | 15000 | 1.6 |
| P-114 | p-59/p-66 (90/10) | 10000 | 1.6 |
| P-115 | p-28/p-62 (80/20) | 9000 | 1.6 |
| P-116 | p-7 (100) | 14000 | 1.6 |
| P-117 | p-21/p-72 (80/20) | 7500 | 1.6 |
| P-118 | p-2/p-40 (90/10) | 8000 | 1.6 |
| P-119 | p-35 (100) | 9000 | 1.6 |

TABLE 3

| Resin | Composition (Compositional ratio) | Mw | Pd |
|---|---|---|---|
| P-120 | p-49/p-76 (90/10) | 10000 | 1.6 |
| P-121 | p-49/p-60/p-87 (90/8/2) | 9000 | 1.6 |
| P-122 | p-59/p-81 (80/20) | 9000 | 1.6 |
| P-123 | p-58/p-81 (91/9) | 11000 | 1.6 |
| P-124 | p-8/p-85 (83/17) | 13000 | 1.6 |
| P-125 | p-22/p-84 (90/10) | 8000 | 1.6 |
| P-126 | p-2/p-77 (90/10) | 9000 | 1.4 |
| P-127 | p-15/p-80 (95/5) | 9000 | 1.6 |
| P-128 | p-2 (100) | 7000 | 1.5 |
| P-129 | p-31/p-70/p-79 (80/18/2) | 12000 | 1.6 |
| P-130 | p-55/p-69/p-63 (90/5/5) | 11500 | 1.6 |
| P-131 | p-56/p-83 (80/20) | 15000 | 1.6 |
| P-132 | p-37/p-82 (81/19) | 8500 | 1.6 |

TABLE 3-continued
| Resin | Composition (Compositional ratio) | Mw | Pd |
|---|---|---|---|
| P-133 | p-50/p-75/p-76 (80/15/5) | 6500 | 1.5 |
| P-134 | p-10/p-86 (94/6) | 7000 | 1.6 |
| P-135 | p-17/p-79 (89/11) | 11000 | 1.6 |
| P-136 | p-25/p-87 (92/8) | 8500 | 1.4 |
| P-137 | p-54/p-82 (82/18) | 9000 | 16 |
| P-138 | p-42/p-76 (80/20) | 10000 | 16 |
| P-139 | p-16/p-62/p-77 (88/10/2) | 11000 | 1.6 |
| P-140 | p-23/p-85 (90/10) | 12000 | 1.6 |
| P-141 | p-20/p-80 (90/10) | 11000 | 1.6 |
| P-142 | p-32/p-82 (89/11) | 9000 | 1.6 |
| P-143 | p-5/p-84 (83/17) | 9000 | 1.6 |
| P-144 | p-3/p-86 (90/10) | 11000 | 1.5 |
| P-145 | p-44/p-71/p-80 (91/7/2) | 10000 | 1.6 |
| P-146 | p-1/p-84 (85/15) | 9000 | 1.6 |
| P-147 | p-33/p-76 (70/30) | 9000 | 1.4 |
| P-148 | p-30/p-79 (82/18) | 11000 | 1.6 |
| P-149 | p-57/p-78 (78/22) | 9000 | 1.6 |
| P-150 | p-57/p-84 (88/12) | 9000 | 1.6 |
| P-151 | p-19/2-83 (88/12) | 11000 | 1.6 |
| P-152 | p-55/p-77/p-78(90/5/5) | 8500 | 1.6 |
| P-153 | p-38/p-87(80/20) | 12000 | 1.6 |
| P-154 | p-6/p-7/p-84 (50/40/10) | 12000 | 1.4 |
| P-155 | p-41/p-83 (96/4) | 15000 | 1.6 |
| P-156 | p-40/p-78 (80/20) | 9000 | 1.5 |
| P-157 | p-21/p-82 (86/14) | 14000 | 1.6 |
| P-158 | p-2/p-81 (89/11) | 8500 | 1.6 |
| P-159 | p-9/p-88 (70/30) | 11000 | 1.6 |
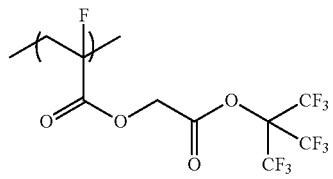
(p-1)
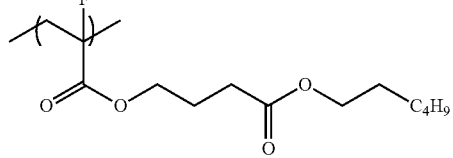
(p-2)
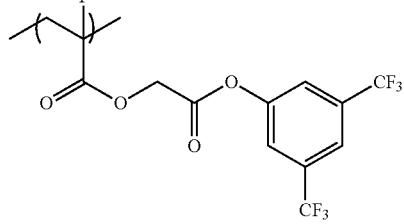
(p-3)
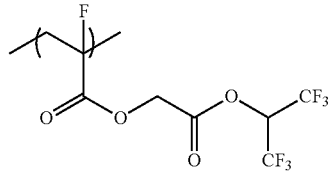
(p-4)
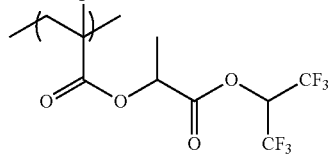
(p-5)
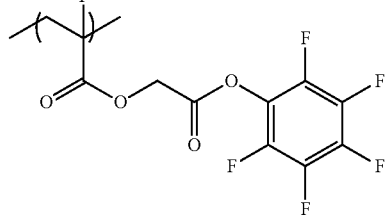
(p-6)
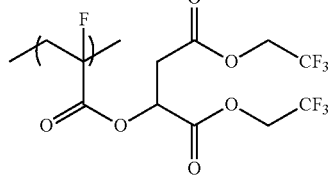
(p-7)
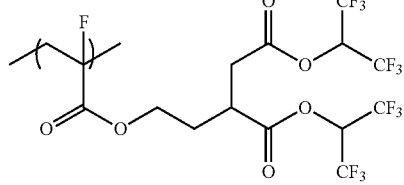
(p-8)
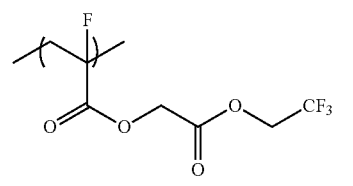
(p-9)
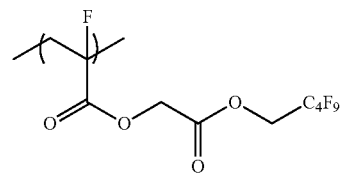
(p-10)
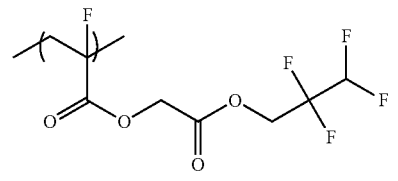
(p-11)
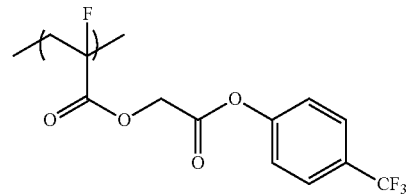
(p-12)

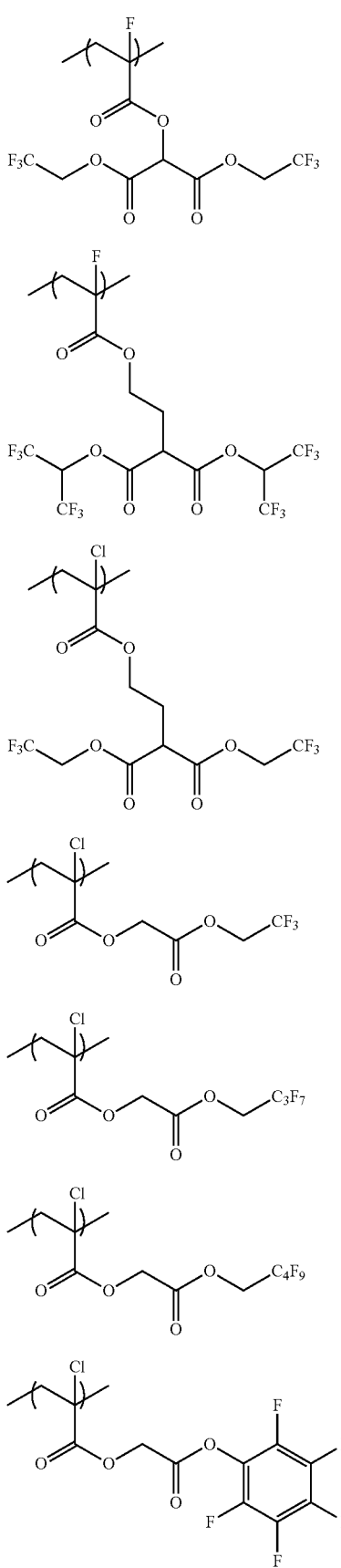
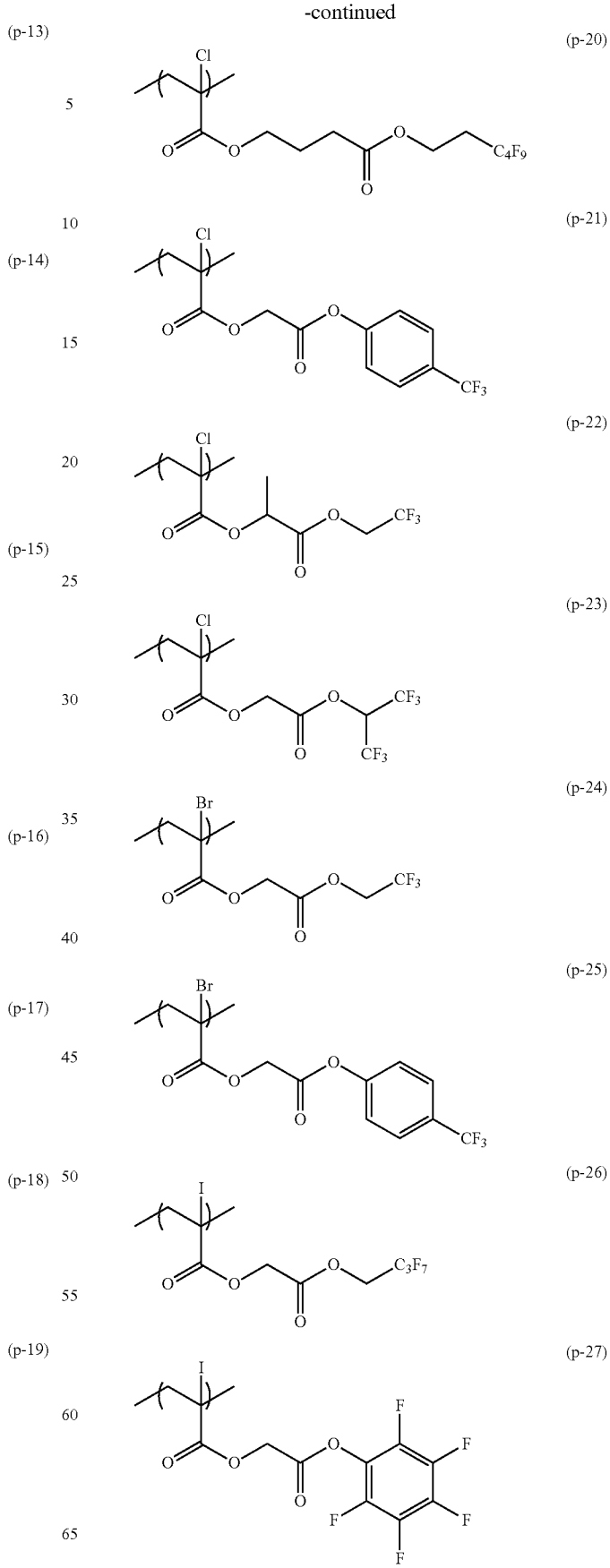

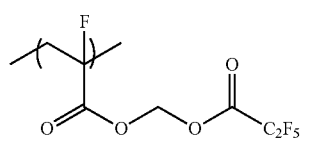
(p-28)
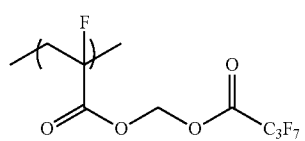
(p-29)
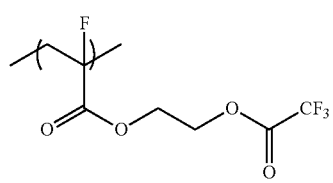
(p-30)
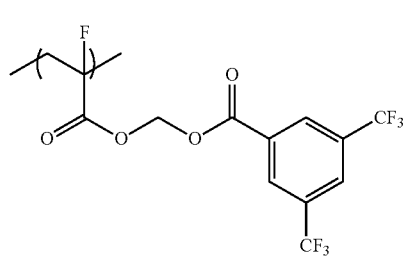
(p-31)
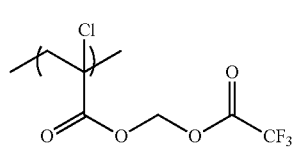
(p-32)
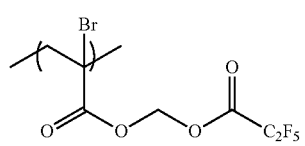
(p-33)
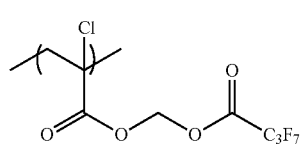
(p-34)
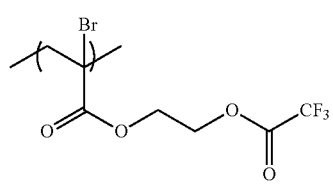
(p-35)
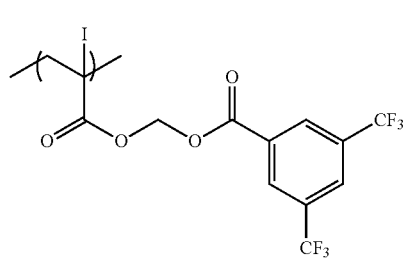
(p-36)
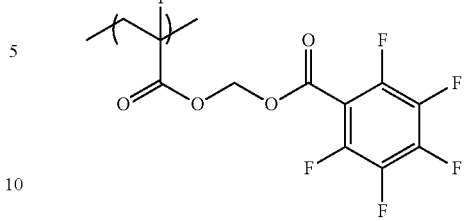
(p-37)
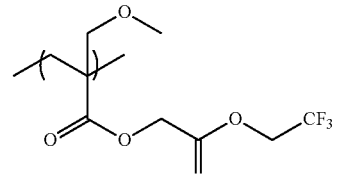
(p-38)
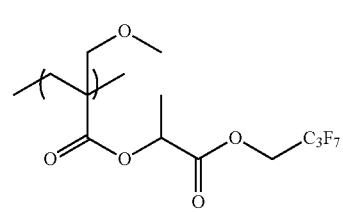
(p-39)
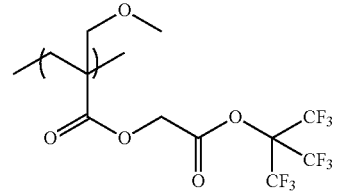
(p-40)
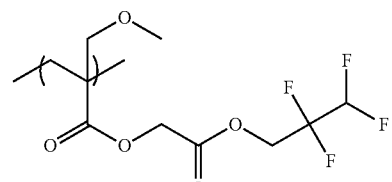
(p-41)
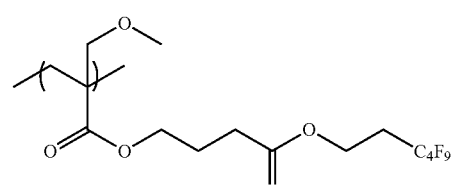
(p-42)
(p-43)

(p-44) 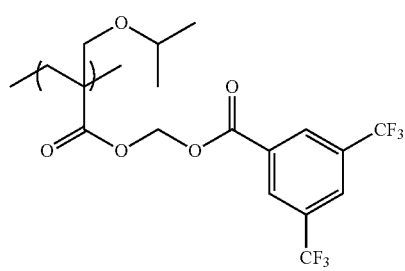
(p-45) 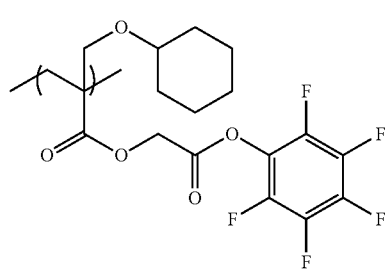
(p-46) 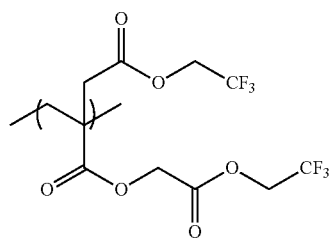
(p-47) 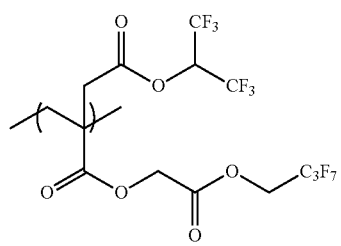
(p-48) 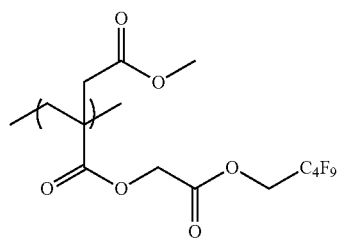
(p-49) 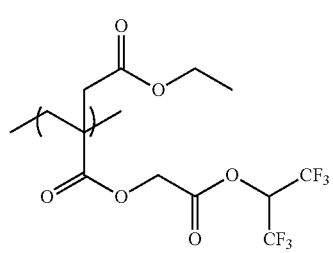
(p-50) 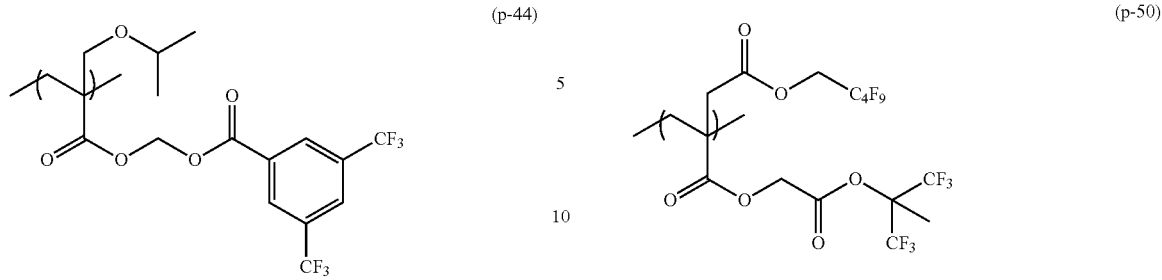
(p-51) 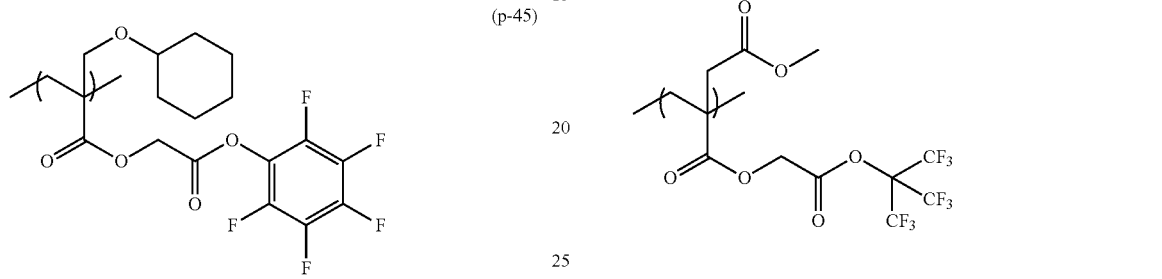
(p-52) 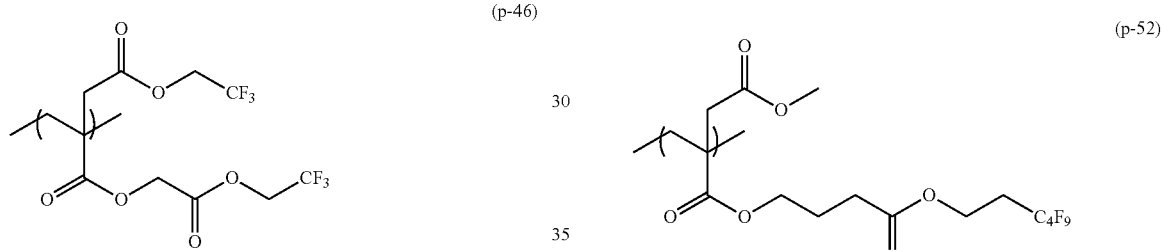
(p-53) 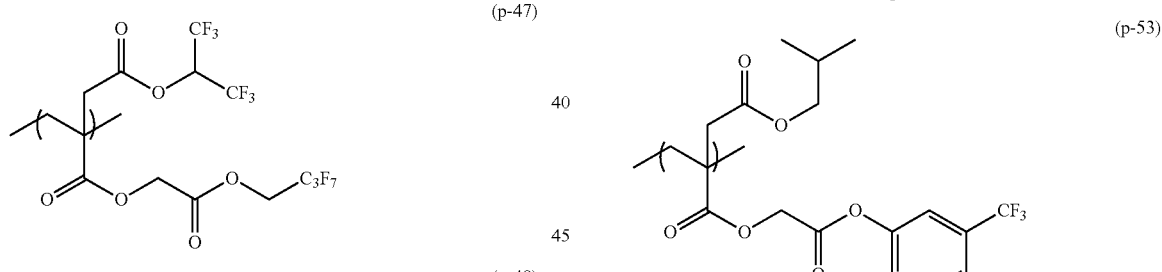
(p-54) 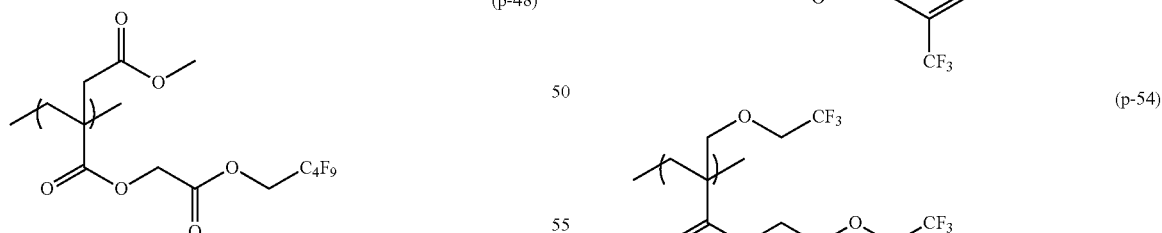
(p-55) 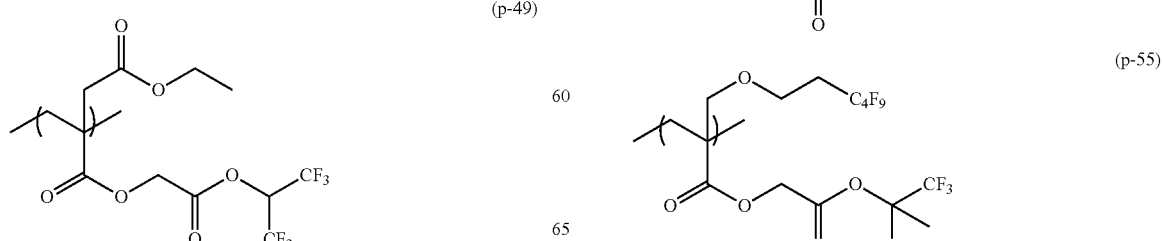

(p-56) 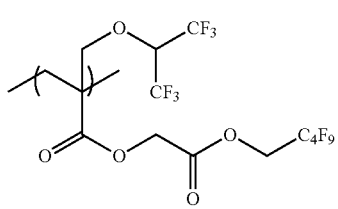
(p-57) 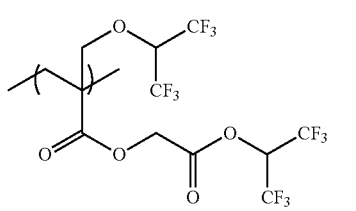
(p-58) 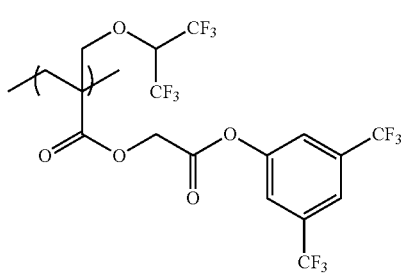
(p-59) 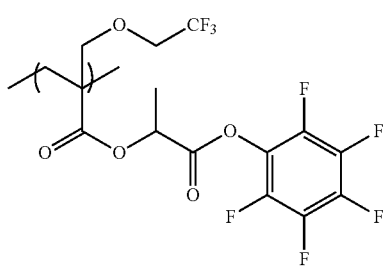
(p-60) 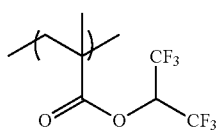
(p-61) 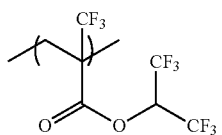
(p-62) 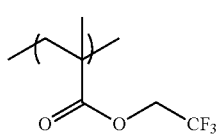
(p-63) 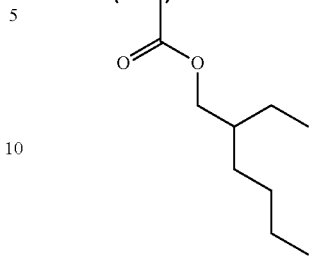
(p-64) 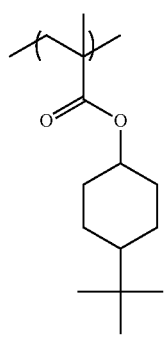
(p-65) 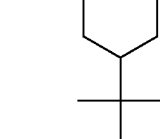
(p-66) 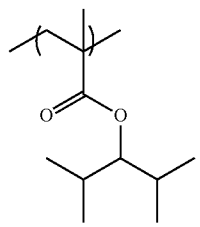
(p-67) 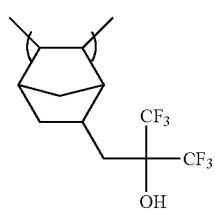
(p-68) 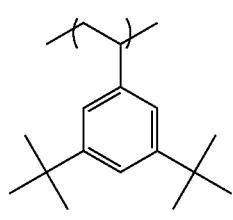

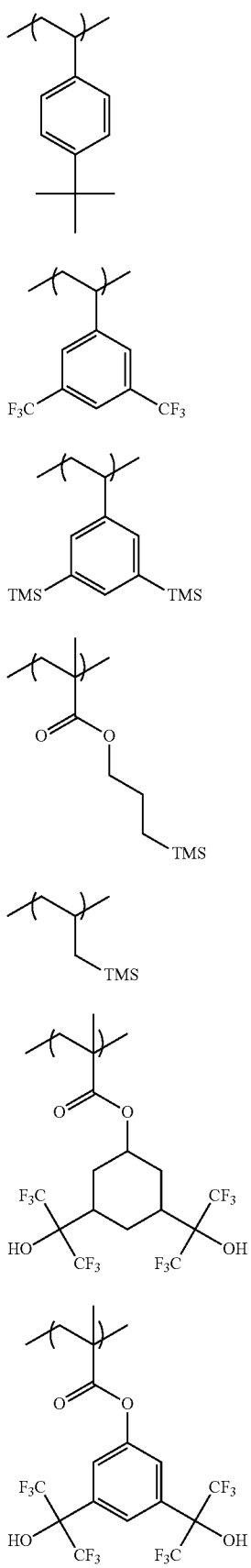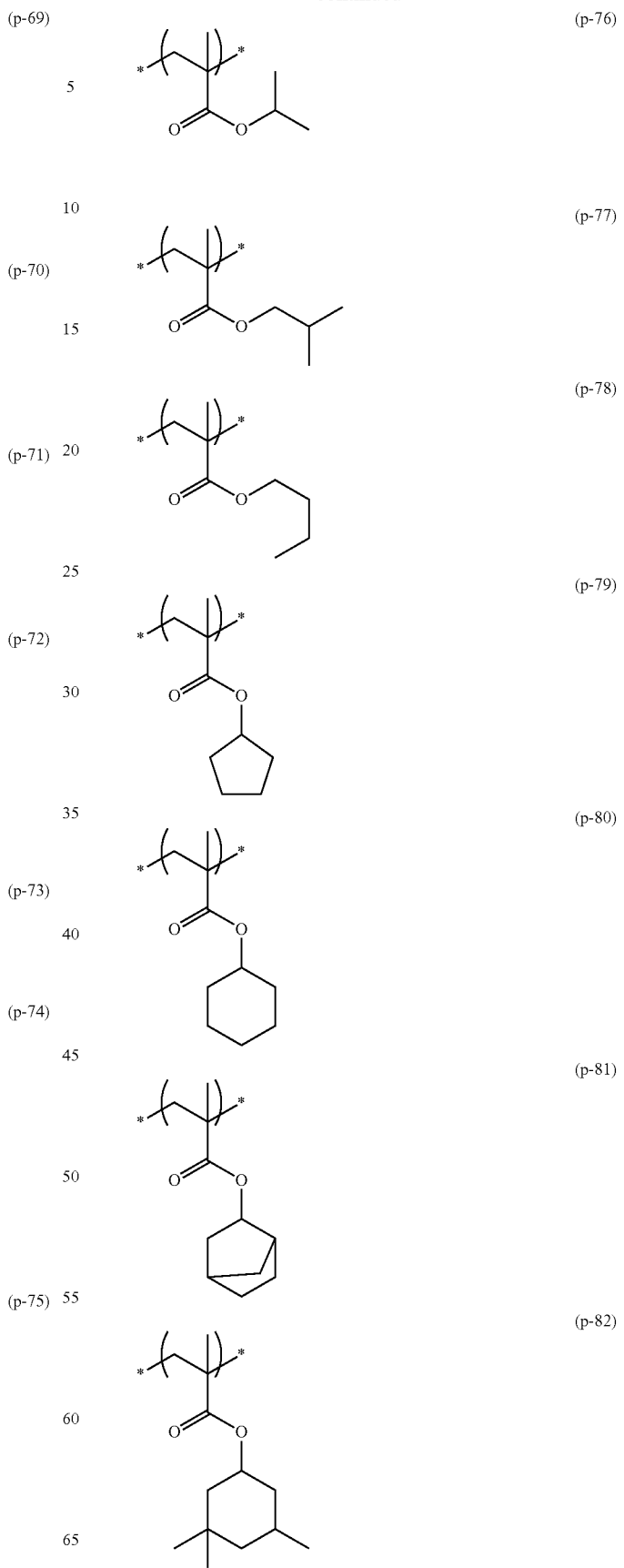

-continued (p-83)
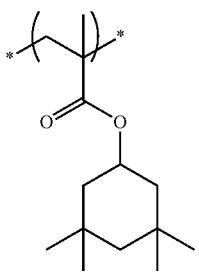

(p-84)
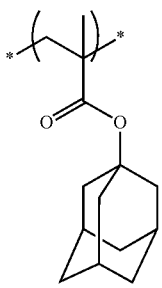

(p-85)
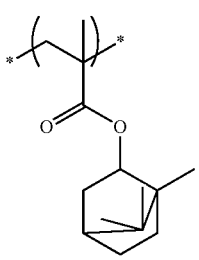

(p-86)
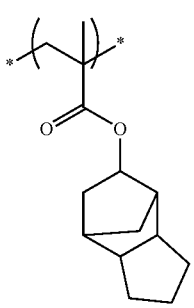

(p-87)
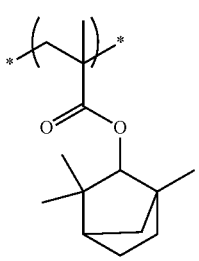

(p-88)
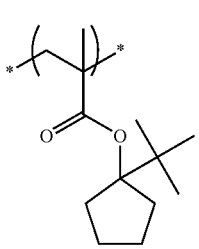

The resin (C) is described above, but the present invention also relates to a compound suitably used for the preparation of the actinic ray-sensitive or radiation-sensitive resin composition, a compound represented by Formula (1M) as a resin, and the resin (C) having a repeating unit represented by Formula (1).

(1M)

In Formula (1M), Z represents a halogen atom, a group represented by $R_{11}OCH_2$—, or a group represented by $R_{12}OC(=O)CH_2$—. $R_{11}$ and $R_{12}$ each independently represent a monovalent substituent. X represents an oxygen atom or a sulfur atom. L represents a (n+1)-valent linking group. R represents a group having a group that is decomposed due to the action of an alkali developer such that solubility increases in an alkali developer. n represents a positive integer. In a case where n is 2 or more, a plurality of R's may be identical to or different from each other.

Specific examples and preferable examples of Z, X, L, R, and n in Formula (1M) are as described as specific examples and preferable examples of Z, X, L, R, and n in Formula (1).

The compound represented by Formula (1M) can be synthesized, for example, by adding the following compounds. The definition of Z, L, R, and n in a raw material are the same as Z, L, R, and n in the compound represented by Formula (1M).

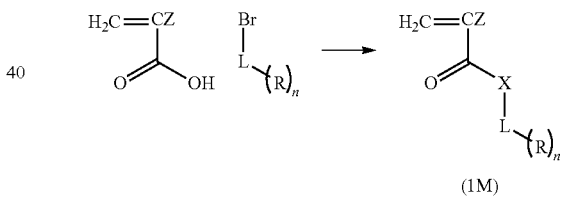

(1M)

The resin (C) can be obtained, for example, by synthesizing the compound represented by Formula (1M) obtained as described above as a monomer by a general method (for example, radical polymerization).

Examples of the general synthesis method include a batch polymerization method in which polymerization is performed by dissolving a monomer species and an initiator in a solvent and heating and a dropwise polymerization method in which a solution of a monomer species and an initiator is added dropwise to the heated solvent over 1 to 10 hours. The dropwise polymerization method is preferable.

Examples of the reaction solvent include ethers such as tetrahydrofuran, 1,4-dioxane, and diisopropyl ether, ketones such as methyl ethyl ketone and methyl isobutyl ketone, an ester solvent such as ethyl acetate, an amide solvent such as dimethylformamide, dimethylacetamide, and N-methyl pyrrolidone, and further a solvent for dissolving the resist composition described below such as propylene glycol monomethyl ether acetate, propylene glycol monomethyl ether, and cyclohexanone. It is more preferable to perform polymerization using the same solvent as the solvent used for the resist composition. As a result, generation of particles during storage can be suppressed.

The polymerization reaction is preferably performed in an inert gas atmosphere such as nitrogen or argon. Polymerization is initiated by using a commercially available radical initiator (azo type initiator, peroxide, and the like) as a polymerization initiator. The radical initiator is preferably an azo-based initiator and more preferably an azo initiator having an ester group, a cyano group, and a carboxyl group. Examples of the preferable initiators include azobisisobutyronitrile, azobisdimethylvaleronitrile, and dimethyl 2,2'-azobis(2-methylpropionate). An initiator is added or an initiator is added in portions as desired, and after completion of the reaction, the initiator is charged in a solvent, and the desired polymer is collected by a method such as powder, solid collection, or the like. The concentration in the reactant is 5 to 50 mass % and preferably 10 to 45 mass %.

The reaction temperature is generally 10° C. to 150° C., preferably 30° C. to 120° C., and even more preferably 60° C. to 100° C.

Purification can be performed by a general method such as a liquid-liquid extraction method in which retained monomers and oligomer components are removed by washing with water or combining appropriate solvents, a purification method in a solution state such as ultrafiltration for extracting and removing only those having a specific molecular weight or less, a reprecipitation method in which a resin solution is added dropwise into a poor solvent so as to solidify a resin in the poor solvent such that a retained monomer or the like is removed, and a purification method in a solid state in which a filtered resin slurry is washed with a poor solvent.

<Hydrophobic Resin (C')>

The composition according to the embodiment of the present invention may contain a hydrophobic resin (C') different from the resin (C). The hydrophobicity resin (C') can have the repeating unit exemplified as the repeating units that may be included in the resin (C), in a case of not having the repeating unit represented by Formula (1), and a preferable range of the content of these repeating units with respect to the total repeating unit of the hydrophobicity resin (C') is as described above in the resin (C).

The weight-average molecular weight, the dispersion degree, and the preferable range of the content of the resin (C) with respect to the total solid content of the composition according to the embodiment of the present invention are the same as described above in the resin (C).

<Resin (E) Having Phenolic Hydroxyl Group>

The composition according to the embodiment of the present invention may contain a resin (E) having a phenolic hydroxyl group different from the resin (C).

The phenolic hydroxyl group in the present invention is a group obtained by substituting a hydrogen atom of an aromatic ring group with a hydroxy group. The aromatic ring of the aromatic ring group is a monocyclic or polycyclic aromatic ring, and examples thereof include a benzene ring and a naphthalene ring. The "aromatic ring" includes an "aromatic hetero ring".

It is preferable that the resin (E) is a resin having a repeating unit represented by Formula (30).

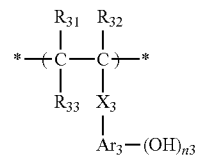
Formula (30)

In Formula (30), $R_{31}$, $R_{32}$, and $R_{33}$ each independently represent a hydrogen atom, an alkyl group, a cycloalkyl group, a halogen atom, a cyano group or an alkoxycarbonyl group. $R_{33}$ may be bonded to $Ar_3$ to form a ring. In this case, $R_{33}$ represents an alkylene group.

$X_3$ represents a single bond or a divalent linking group.

$Ar_3$ represents a (n3+1)-valent aromatic ring group, and in a case where $Ar_3$ is bonded to $R_{33}$ to form a ring, $Ar_3$ represents a (n3+2)-valent aromatic ring group.

n3 represents an integer of 1 to 4.

$Ar_3$ represents a (n3+1)-valent aromatic group. The divalent aromatic ring group in a case where n3 is 1 may have a substituent, and preferable examples thereof include an arylene group having 6 to 18 carbon atoms such as a phenylene group, a tolylene group, a naphthylene group, and an anthracenylene group, and an aromatic ring group including a heterocyclic ring such as thiophene, furan, pyrrole, benzothiophene, benzofuran, benzopyrrole, triazine, imidazole, benzimidazole, triazole, thiadiazole, and triazole.

Specific examples of the (n3+1)-valent aromatic ring group in a case where n3 is an integer of 2 or greater suitably include groups obtained by removing any (n3−1) items of hydrogen atoms from the above specific examples of the divalent aromatic ring group.

The (n3+1)-valent aromatic ring group may further include a substituent.

Examples of the substituent that can have the alkylene group and the (n3+1)-valent aromatic ring group include an alkyl group, an alkoxy group such as a methoxy group, an ethoxy group, a hydroxyethoxy group, a propoxy group, a hydroxypropoxy group, and a butoxy group, and an aryl group such as a phenyl group.

Examples of the divalent linking group of $X_3$ include —COO— or —CONR$_{64}$— (R$_{64}$ represents a hydrogen atom or an alkyl group).

$X_3$ is preferably a single bond, —COO—, and —CONH— and more preferably a single bond and —COO—.

$Ar_3$ is more preferably an aromatic ring group having 6 to 18 carbon atoms which may have a substituent, and a benzene ring group, a naphthalene ring group, and a biphenylene ring group are particularly preferable.

The repeating unit represented by Formula (30) preferably has a hydroxystyrene structure. That is, $Ar_3$ is preferably a benzene ring group.

n3 represents an integer of 1 to 4, preferably represents 1 or 2, and more preferably represents 1.

<Acid Diffusion Control Agent>

The composition of the present invention preferably contains an acid diffusion control agent. The acid diffusion control agent functions as a quencher which traps an acid generated from an acid generator or the like at the time of exposure and suppresses the reaction of the acid-decomposable resin at an unexposed portion due to the excess generated acid. As the acid diffusion control agent, a basic compound, a low molecular weight compound that has a nitrogen atom and has a group that is left due to an action of an acid, a basic compound of which basicity decreases or disappears due to irradiation with an actinic ray or radiation, or an onium salt which becomes a weak acid relatively to an acid generator may be used.

Preferable examples of the basic compound include compounds having structures indicated in Formulae (A) to (E) below.

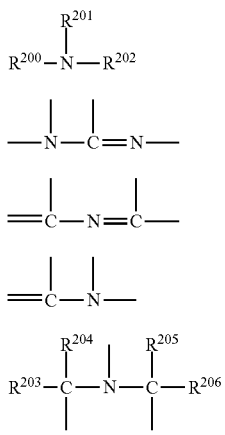

In General Formulae (A) and (E), $R^{200}$, $R^{201}$, and $R^{202}$ may be identical to or different from each other, and represent hydrogen atoms, alkyl groups (preferably having 1 to 20 carbon atoms), cycloalkyl groups (preferably, having 3 to 20 carbon atoms), or aryl groups (having 6 to 20 carbon atoms). Here, $R^{201}$ and $R^{202}$ may be bonded to each other, so as to form a ring.

$R^{203}$, $R^{204}$, $R^{205}$, and $R^{206}$ may be identical to or different from each other, and each represent an alkyl group having 1 to 20 carbon atoms.

With respect to the alkyl group, the alkyl group having the substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in General Formulae (A) and (E) are preferably unsubstituted.

Preferable examples of the compounds include guanidine, aminopyrrolidine, pyrazole, pyrazoline, piperazine, aminomorpholine, aminoalkylmorpholine, and piperidine. More preferable specific examples of the compound include compounds having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond.

Specific examples of the preferable compound include compounds disclosed in <0379> of US2012/0219913A1.

Preferable examples of the basic compound include an amine compound having a phenoxy group, an ammonium salt compound having a phenoxy group, an amine compound having a sulfonic acid ester group, and an ammonium salt compound having a sulfonic acid ester group.

These basic compounds may be used singly or two or more kinds thereof may be used in combination.

The composition according to the embodiment of the present invention may not contain the basic compound, but in a case where the resist composition contains the basic compound, the content ratio of the basic compound is generally 0.001 to 10 mass % and preferably 0.01 to 5 mass % with respect to the solid content of the resist composition.

The use ratio of the acid generator and the basic compound in the composition is preferably 2.5 to 300, more preferably 5.0 to 200, and even more preferably 7.0 to 150 as the acid generator/basic compound (molar ratio).

The low molecular weight compound that has a nitrogen atom and has a group that is left due to an action of an acid (hereinafter, referred to as a "compound (D)") is preferably an amine derivative having a group that is left due to an action of an acid on a nitrogen atom.

The group that is left due to an action of an acid is preferably an acetal group, a carbonate group, a carbamate group, a tertiary ester group, a tertiary hydroxyl group, and a hemiaminal ether group and particularly preferably a carbamate group and a hemiaminal ether group.

The molecular weight of the compound (D) is preferably 100 to 1000, more preferably 100 to 700, and particularly preferably 100 to 500.

The compound (D) may have a carbamate group having a protective group on a nitrogen atom. The protective group constituting the carbamate group can be represented by Formula (d-1).

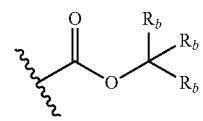

In Formula (d-1),

Rb's each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). Rb's may be linked to each other to form a ring.

The alkyl group, the cycloalkyl group, the aryl group, and the aralkyl group represented by Rb may be substituted with a functional group such as a hydroxyl group, a cyano group, an amino group, a pyrrolidino group, a piperidino group, a morpholino group, and an oxo group, an alkoxy group, or a halogen atom. The same is applied to the alkoxyalkyl group represented by Rb.

Rb is preferably a linear or branched alkyl group, a cycloalkyl group, or an aryl group. Rb is more preferably a linear or branched alkyl group or a cycloalkyl group.

Examples of the ring formed by linking two Rb's to each other include an alicyclic hydrocarbon group, an aromatic hydrocarbon group, a heterocyclic hydrocarbon group, or a derivative thereof.

Examples of the specific structure of the group represented by Formula (d-1) include structures disclosed in <0466> of US2012/0135348A1, but the present invention is not limited thereto.

The compound (D) particularly preferably has a structure represented by Formula (6).

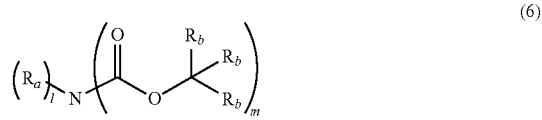

In Formula (6), Ra represents a hydrogen atom, an alkyl group, a cycloalkyl group, an aryl group, or an aralkyl group. In a case where l is 2, the two Ra's may be identical to or different from each other, and the two Ra's may be linked to each other to form a heterocyclic ring together with a nitrogen atom in the formula. The heterocyclic ring may include a hetero atom in addition to the nitrogen atom in the formula.

Rb has the same meaning as Rb in Formula (d-1), and preferable examples thereof are also the same.

l represents an integer of 0 to 2, m represents an integer of 1 to 3, and l+m=3 is satisfied.

In Formula (6), the alkyl group, the cycloalkyl group, the aryl group, and the aralkyl group as Ra may be substituted with the same groups described above as the groups that may be substituted with the alkyl group, the cycloalkyl group, the aryl group, and the aralkyl group as Rb.

Specific examples of the alkyl group, the cycloalkyl group, the aryl group, and the aralkyl group of Ra (the alkyl group, the cycloalkyl group, the aryl group, and the aralkyl group may be substituted with the above groups) include the same groups described above as the specific examples for Rb.

According to the present invention, specific examples of the particularly preferable compound (D) include compounds disclosed in <0475> of US2012/0135348A1, but the present invention is not limited thereto.

The compound represented by Formula (6) can be synthesized based on JP2007-298569A and JP2009-199021A.

According to the present invention, the low molecular weight compound (D) having a group that is left due to an action of an acid on a nitrogen atom can be used singly or two or more kinds thereof may be used in a mixture.

The content of the compound (D) in the composition of the embodiment of the present invention is preferably 0.001 to 20 mass %, more preferably 0.001 to 10 mass %, and even more preferably 0.01 to 5 mass % based on the total solid content of the composition.

Hereinafter, specific examples of the compound (D) in the present invention are provided, but the present invention is not limited thereto.

(D-1)
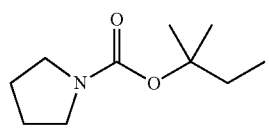

(D-2)
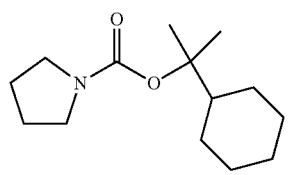

(D-3)
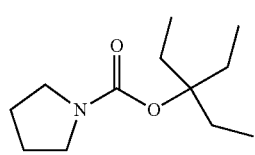

-continued (D-4)
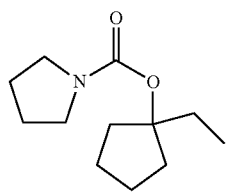

(D-5)
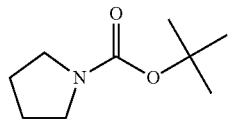

(D-6)
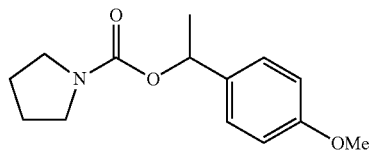

(D-7)
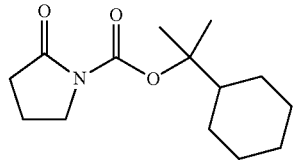

(D-8)
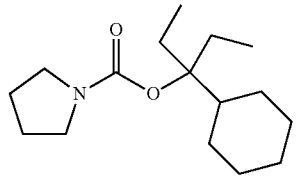

(D-9)
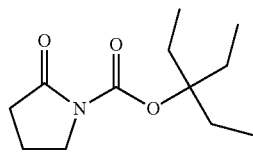

(D-10)
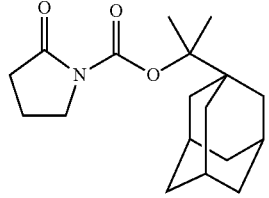

(D-11)
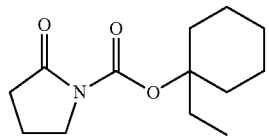

(D-12)
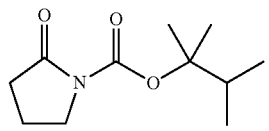

-continued
(D-13)
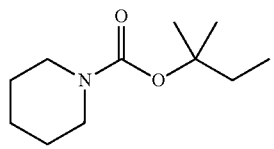
(D-14)
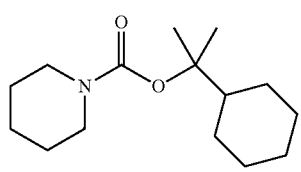
(D-15)
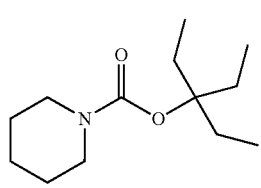
(D-16)
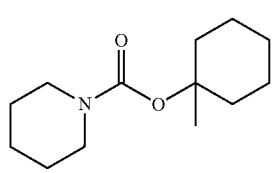
(D-17)
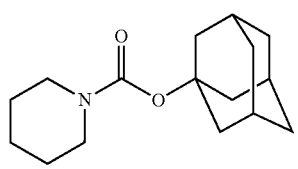
(D-18)
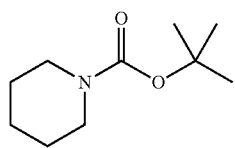
(D-19)
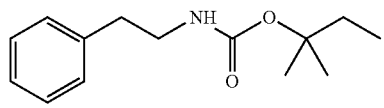
(D-20)
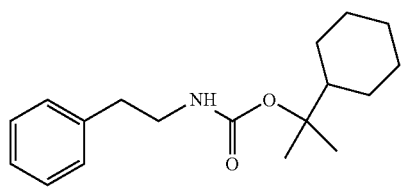
(D-21)
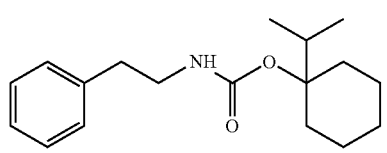
-continued
(D-22)
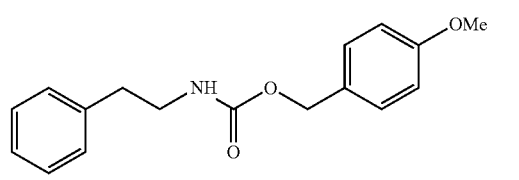
(D-23)
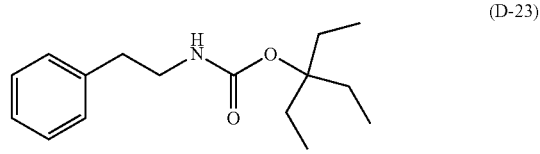
(D-24)
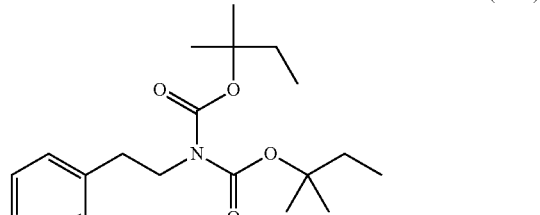
(D-25)
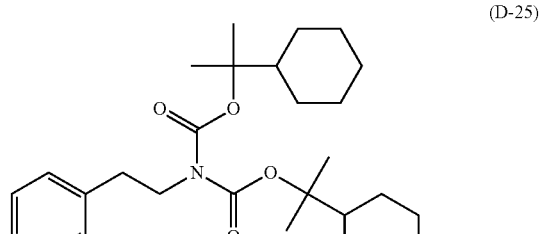
(D-26)
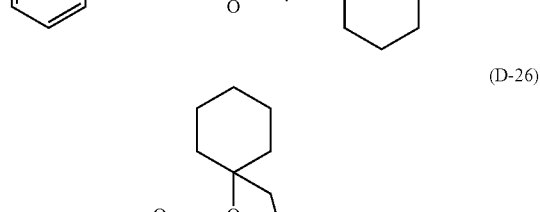
(D-27)
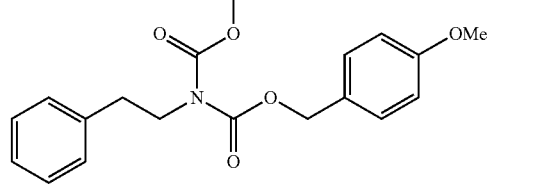

(D-28) 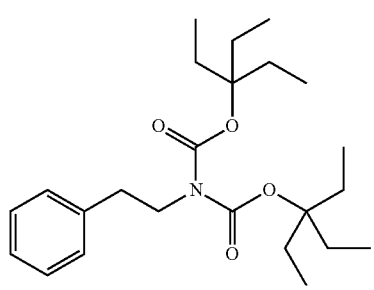
(D-29) 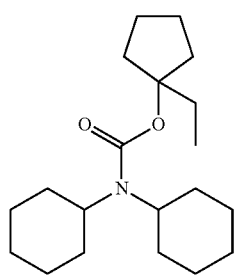
(D-30) 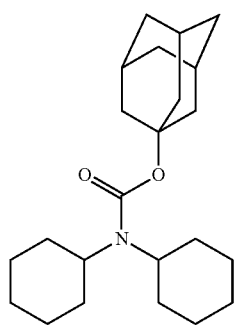
(D-31) 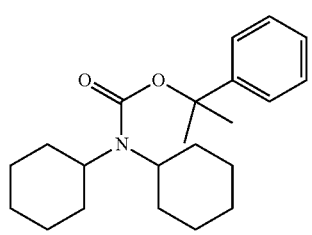
(D-32) 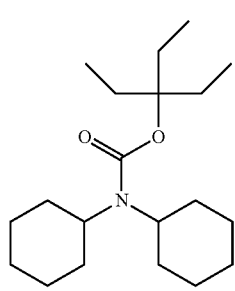
(D-33) 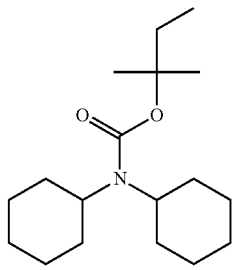
(D-34) 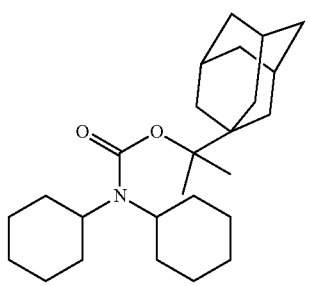
(D-35) 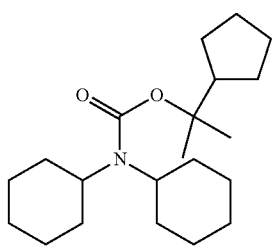
(D-36) 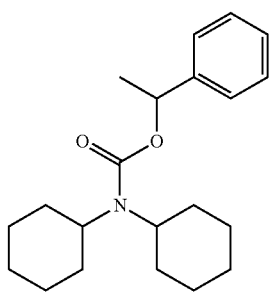
(D-37) 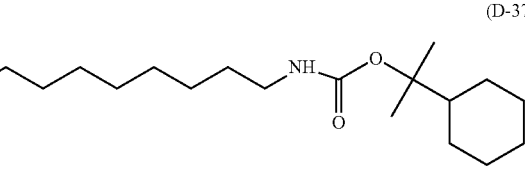
(D-38) 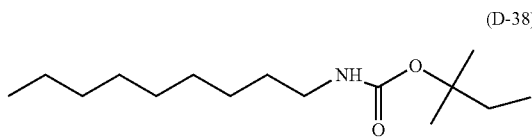
(D-39) 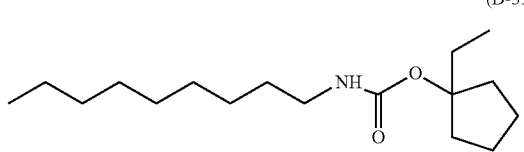

(D-40)
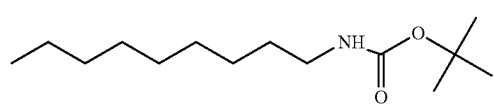
(D-41)
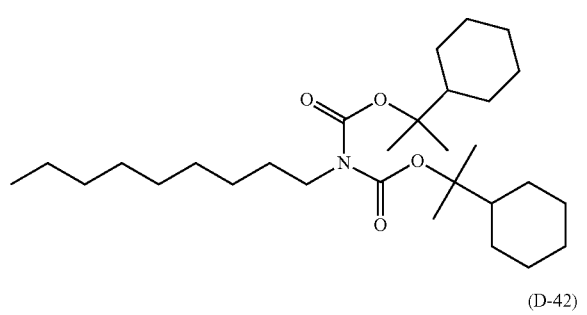
(D-42)
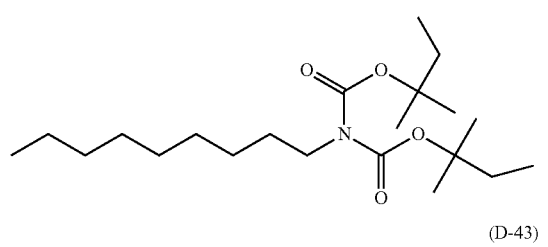
(D-43)
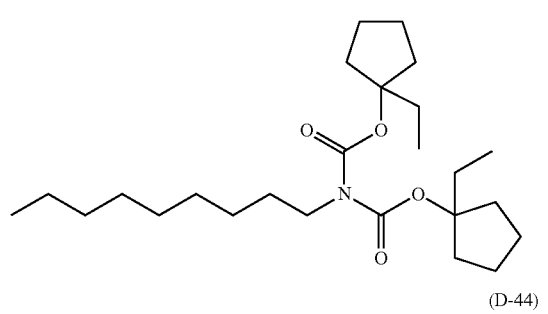
(D-44)
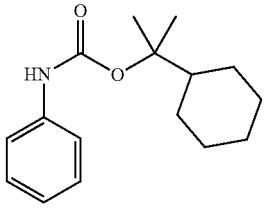
(D-45)
(D-46)
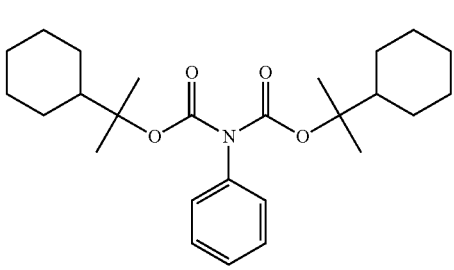
(D-47)
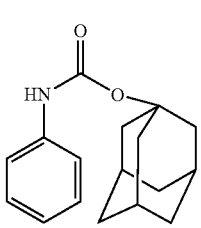
(D-48)
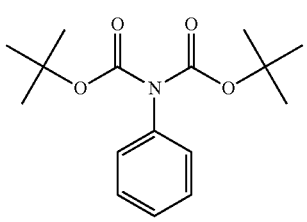
(D-49)
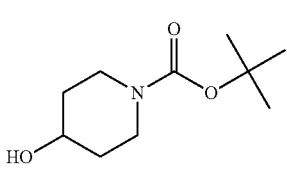
(D-50)
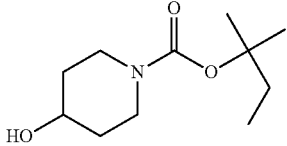
(D-51)
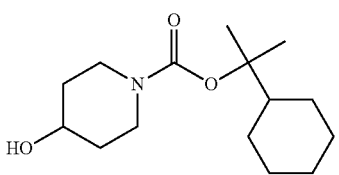
(D-52)
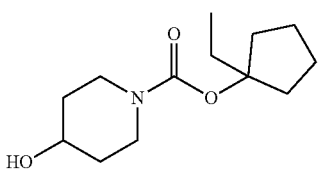
(D-53)
(D-54)

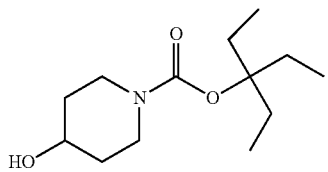

(D-55)

A basic compound (hereinafter sometimes referred to as a "compound PA)") of which basicity decreases or disappears due to irradiation with an actinic ray or radiation is a compound which has a proton acceptor functional group and is decomposed due to irradiation with actinic rays or radiation and in which proton acceptor properties decrease or disappear or proton acceptor properties change to acidity.

The proton acceptor functional group is a group that can electrostatically interacting with a proton or a functional group having an electron and means, for example, a functional group having a macrocyclic structure such as cyclic polyether or a functional group having a nitrogen atom having an unshared electron pair that does not contribute to π conjugation. The nitrogen atom having an unshared electron pair that does not contribute to π conjugation is, for example, a nitrogen atom having a partial structure represented by the following formula.

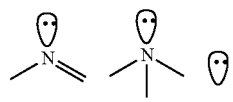

unshared electron pair

Examples of preferable partial structures of the proton acceptor functional group include crown ether, azacrown ether, primary to tertiary amine, pyridine, imidazole, and pyrazine structures.

The compound (PA) is decomposed due to the irradiation with an actinic ray or radiation to generate a compound in which proton acceptor properties decrease or disappear or proton acceptor properties change to acidity. Here, the decrease or disappearance of the proton acceptor properties or the change from proton acceptor properties to acidity is a change in the proton acceptor properties due to the addition of a proton to the proton acceptor functional group, and specifically means that, in a case where a proton adduct is generated from the compound (PA) having a proton acceptor functional group and a proton, an equilibrium constant in the chemical equilibrium thereof decreases.

The proton acceptor properties can be checked by performing pH measurement.

According to the present invention, the acid dissociation constant pKa of the compound generated by decomposing the compound (PA) due to the irradiation with an actinic ray or radiation preferably satisfies pKa<−1, more preferably satisfies −13<pKa<−1, and even more preferably satisfies −13<pKa<−3.

According to the present invention, the acid dissociation constant pKa represents an acid dissociation constant pKa in an aqueous solution and is described in, for example, Chemical Handbook (II) (revised 4th edition, 1993, edited by The Chemical Society of Japan, Maruzen Co., Ltd.), and the lower the value, the higher the acid strength is. Specifically, the acid dissociation constant pKa in an aqueous solution can be actually measured by measuring an acid dissociation constant at 25° C. by using an infinitely diluted aqueous solution, and the Hammett's substituent constant and the value based on the database of values in the well-known documents can also be obtained by calculation by using a software package 1 below. All of the pKa values described in the present specification refer to values obtained by calculation by using this software package.

Software package 1: Advanced Chemistry Development (ACD/Labs) Software V8.14 for Solaris (1994-2007 ACD/Labs).

The compound (PA) generates, for example, a compound represented by the Formula (PA-1) as the proton adduct generated by the decomposition due to the irradiation with an actinic ray or radiation. The compound represented by Formula (PA-1) is a compound that has an acidic group together with a proton acceptor functional group such that the proton acceptor properties decrease or disappear compared with the compound (PA) or proton acceptor properties change to acidity.

$$Q-A-(X)_n-B-R \quad (PA-1)$$

In Formula (PA-1),

Q represents —SO$_3$H, —CO$_2$H, or —W$_1$NHW$_2$R$_f$. Here, R$_f$ represents an alkyl group (preferably having 1 to 20 carbon atoms), a cycloalkyl group (preferably having 3 to 20 carbon atoms), or an aryl group (preferably having 6 to 30 carbon atoms), and W$_1$ and W$_2$ each independently represent —SO$_2$— or —CO—.

A represents a single bond or a divalent linking group.

X represents —SO$_2$— or —CO—.

n represents 0 or 1.

B represents a single bond, an oxygen atom, or —N(R$_x$)R$_y$—, Here, R$_x$ represents a hydrogen atom or a monovalent organic group, and R$_y$ represents a single bond or a divalent organic group. R$_x$ may be bonded to R$_y$ to form a ring, and may be bonded to R to form a ring.

R represents a monovalent organic group having a proton acceptor functional group.

Formula (PA-1) is more specifically described.

The divalent linking group in A is preferably an alkylene group having at least one fluorine atom and more preferably a perfluoroalkylene group such as a perfluoroethylene group, a perfluoropropylene group, and a perfluorobutylene group.

Examples of the monovalent organic group in Rx include an alkyl group, a cycloalkyl group, an aryl group, an aralkyl group, and an alkenyl group, and these may further have a substituent.

The alkyl group in Rx is preferably a linear and branched alkyl group having 1 to 20 carbon atoms and may have an oxygen atom, a sulfur atom, or a nitrogen atom in an alkyl chain.

The cycloalkyl group in Rx is preferably a monocyclic or polycycliccycloalkyl group having 3 to 20 carbon atoms and may have an oxygen atom, a sulfur atom, or a nitrogen atom in the ring.

The amyl group in Rx is preferably an aryl group having 6 to 14 carbon atoms, and examples thereof include a phenyl group and a naphthyl group.

The aralkyl group in Rx is preferably an aralkyl group having 7 to 20 carbon atoms, and examples thereof include a benzyl group and a phenethyl group.

The alkenyl group in Rx is preferably 3 to 20 carbon atoms, and examples thereof include a vinyl group, an allyl group, and a styryl group.

Preferable examples of the divalent organic group in Ry include an alkylene group.

Examples of the ring structure that may be formed by bonding Rx and Ry to each other include a 5-membered to 10-membered ring including a nitrogen atom.

The proton acceptor functional group in R is as described above.

The organic group having this structure is preferably an organic group having 4 to 30 carbon atoms, and examples thereof include an alkyl group, a cycloalkyl group, an aryl group, an aralkyl group, and an alkenyl group.

The alkyl group, the cycloalkyl group, the aryl group, the aralkyl group, and the alkyl group in the alkenyl group and the like including a proton acceptor functional group or an ammonium group in R are the same as the alkyl group and the like described above as Rx.

In a case where B is —N(Rx)Ry-, it is preferable that R and Rx are bonded to each other to form a ring. The number of carbon atoms forming the ring is preferably 4 to 20, and the ring may be monocyclic or polycyclic and may contain an oxygen atom, a sulfur atom, or a nitrogen atom in the ring.

Examples of the monocyclic structure include a 4-membered to 8-membered ring including a nitrogen atom. Examples of the polycyclic structure include a structure completed by combining two or more monocyclic structures.

$R_f$ in —$W_1NHW_2R_f$ represented by Q is preferably a perfluoroalkyl group having 1 to 6 carbon atoms. At least one of $W_1$ or and $W_2$ is preferably —$SO_2$—.

The compound (PA) is preferably an ionic compound. The proton acceptor functional group may be included in either an anion moiety or a cation moiety but is preferably included in an anion moiety.

Preferable examples of the compound (PA) include compounds represented by Formulae (4) to (6).

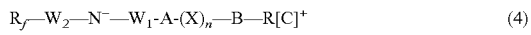  (4)

  (5)

  (6)

In Formulae (4) to (6), A, X, n, B, R, $R_f$, $W_1$, and $W_2$ are the same as those in Formula (PA-1).

$C^+$ indicates a counter cation.

The counter cation is preferably an onium cation. More specifically, preferable examples of the sulfonium cation described as $S^+(R_{201})(R_{202})(R_{203})$ in Formula (ZI) in the acid generator include an iodonium cation described as $I^+(R_{204})(R_{205})$ in Formula (ZII).

Specific examples of the compound (PA) include compounds exemplified in <0280> of US2011/0269072A1.

According to the present invention, the compound (PA) other than the compound that generates a compound represented by Formula (PA-1) can be appropriately selected. For example, a compound which is an ionic compound and has a proton acceptor moiety in the cation moiety may be used. More specifically, examples thereof include compounds represented by Formula (7).

  (7)

In the formula, A represents a sulfur atom or an iodine atom.

m represents 1 or 2, and n represents 1 or 2. Here, in a case where A is a sulfur atom, m+n=3, and in a case where A is an iodine atom, m+n=2.

R represents an aryl group.

$R_N$ represents an aryl group substituted with a proton acceptor functional group. $X^-$ represents a counter anion.

Specific examples of $X^-$ include those which are the same as the anions of the acid generator described above.

Specific examples of the preferable aryl group of R and $R_N$ include a phenyl group.

Specific examples of the proton acceptor functional group included in $R_N$ are the same as the proton acceptor functional groups described in Formula (PA-1).

Hereinafter, specific examples of the ionic compound having a proton acceptor moiety in a cation moiety include compounds exemplified in <0291> of US2011/0269072A1.

The compound can be synthesized with reference to methods described in JP2007-230913A and JP2009-122623A.

The compound (PA) may be used singly or two or more kinds thereof may be used in combination.

The content of the compound (PA) is preferably 0.1 to 10 mass % and more preferably 1 to 8 mass % based on the total solid content of the composition.

In the composition of the embodiment of the present invention, an onium salt which becomes a weak acid relatively to the acid generator can be used as an acid diffusion control agent.

In the case where an acid generator and an onium salt which generates an acid which is relatively weak acid compared with the acid generated from the acid generator are mixed to be used, in a case where an acid generated from the acid generator due to the irradiation with an actinic ray or radiation collides with an onium salt having an unreacted weak acid anion, a weak acid is left due to salt exchange to generate an onium salt having a strong acid anion. In this process, since a strong acid is exchanged with a weak acid having lower catalytic activity, so that the acid is apparently inactivated and the acid diffusion can be controlled.

The onium salt which becomes a relatively weak acid to the acid generator is preferably a compound represented by Formulae (d1-1) to (d1-3).

  (d1-1)

  (d1-2)

  (d1-3)

In the formula, $R^{51}$ is a hydrocarbon group which may have a substituent, $Z^{2c}$ is a hydrocarbon group having 1 to 30 carbon atoms which may have a substituent (it is assumed that a fluorine atom is not substituted for the carbon adjacent to S), $R^{52}$ is an organic group, $Y^3$ is a linear, branched, or cyclic alkylene group or arylene group, Rf is a hydrocarbon group including a fluorine atom, and $M^+$'s each independently represent a sulfonium or iodonium cation.

Preferable examples of the sulfonium cation or the iodonium cation represented by $M^{30}$ include sulfonium cations exemplified in Formula (ZI) and iodonium cations exemplified in Formula (ZII).

Preferable examples of the anion moiety of the compound represented by Formula (d1-1) include structures exemplified in paragraph [0198] of JP2012-242799A.

Preferable examples of the anion moiety of the compound represented by Formula (d1-2) include structures exemplified in paragraph [0201] of JP2012-242799A.

Preferable examples of the anion moiety of the compound represented by Formula (d1-3) include structures exemplified in paragraphs [0209] and [0210] of JP2012-242799A.

An onium salt which becomes a relatively weak acid compared with the acid generator may be a compound (C) (hereinafter, also referred to as a "compound (CA)") which has a cation site and an anion site in the same molecule and in which the cation site and the anion site are linked by a covalent bond.

The compound (CA) is preferably a compound represented by any one of Formulae (C-1) to (C-3).

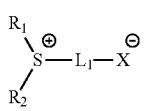

(C-1)

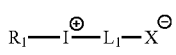

(C-2)

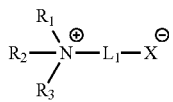

(C-3)

Formulae (C-1) to (C-3), $R_1$, $R_2$, and $R_3$ each represent a substituent having one or more carbon atoms.

$L_1$ represents a divalent linking group linking the cation site and the anion site or a single bond.

—$X^-$ represents an anionic moiety selected from —COO$^-$, —SO$_3^-$, —SO$_2^-$, and —N$^-$—R$_4$. R$_4$ represents a monovalent substituent having a carbonyl group: —C(=O)—, a sulfonyl group: —S(=O)$_2$—, and a sulfinyl group: —S(=O)— at a connecting site to an adjacent N atom.

$R_1$, $R_2$, $R_3$, $R_4$, and $L_1$ may be bonded to each other to form a ring structure. In (C-3), two of $R_1$ to $R_3$ may be combined with each other to form a double bond with a N atom.

Examples of the substituent having one or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The substituent is preferably an alkyl group, a cycloalkyl group, and an aryl group.

Examples of $L_1$ as the divalent linking group include a linear or branched alkylene group, a cycloalkylene group, an arylene group, a carbonyl group, an ether bond, an ester bond, an amide bond, a urethane bond, a urea bond, and a group obtained by combining two or more of these groups. $L_1$ is more preferably an alkylene group, an arylene group, an ether bond, an ester bond, or a group formed by combining two or more of these groups.

Preferable examples of the compound represented by Formula (C-1) include compounds exemplified in paragraphs [0037] to [0039] of JP2013-006827A and paragraphs [0027] to [0029] of JP2013-008020A.

Preferable examples of the compound represented by Formula (C-2) include compounds exemplified in paragraphs [0012] to [0013] of JP2012-189977A.

Preferable examples of the compound represented by Formula (C-3) include compounds exemplified in paragraphs [0029] to [0031] of JP2012-252124A.

The content of the onium salt which becomes a relatively weak acid compared with the acid generator is preferably 0.5 to 10.0 mass %, more preferably 0.5 to 8.0 mass %, and even more preferably 1.0 to 8.0 mass % based on the solid content of the composition.

The composition of the embodiment of the present invention may contain one or more kinds selected from the acid diffusion control agent described above.

<Compound (F) of Which Dissolution Rate in alkali Developer Decreases Due to Action of Acid>

The composition according to the embodiment of the present invention may contain a compound (F) of which a dissolution rate in an alkali developer decreases due to an action of an acid.

The compound may be a polymer compound and may be a low molecular weight compound.

In view of reactivity and developability, it is preferable that the compound (F) is a phenol derivatives.

Suitable examples of the low molecular weight compound include a compound that crosslinks the resin (E) having a phenolic hydroxyl group (hereinafter, also referred to as a "crosslinking agent"). Here, it is possible to effectively use the well-known crosslinking agent.

The crosslinking agent is, for example, a compound having a crosslinking group that crosslinks the resin (E) having a phenolic hydroxyl group, and is preferably a compound having two or more hydroxymethyl groups, alkoxymethyl groups, acyloxymethyl groups, or alkoxymethyl ether groups, or an epoxy compound.

It is more preferable that the crosslinking agent is alkoxymethylated or acyloxymethylated melamine compounds, alkoxymethylated or acyloxymethylated urea compounds, hydroxymethylated or alkoxymethylated phenolic compounds, and alkoxymethyl etherified phenolic compounds.

Epoxy compounds disclosed in paragraphs <0196> to <0200> (<0271> to <0277> of corresponding US2014/0178634A) of JP2013-064998A and oxetane compounds disclosed in paragraph <0065> of JP2013-258332A can be referred to, and the contents thereof are incorporated to the present specification.

The crosslinking agent preferably has a structure represented by Formula (1).

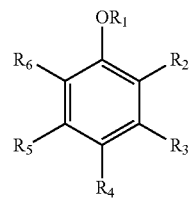

(1)

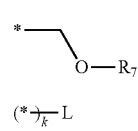

(2)

(3)

In Formula (1), $R_1$ to $R_6$ each independently represent a hydrogen atom, an inorganic group having 1 to 50 carbon atoms or a linking group or a bonding site to a single bond which is represented by L in Formula (3). Here, at least one of $R_2, \ldots,$ or $R_6$ has a structure represented by Formula (2).

In Formula (2), $R_7$ represents a hydrogen atom or an inorganic group having 1 to 30 carbon atoms. * represents a bonding site to any one of $R_2, \ldots,$ or $R_6$.

In Formula (3), L represents a linking group or single bond, * represents a bonding site in any one of $R_1, \ldots,$ or $R_6$, and k represents an integer of 2 to 5.

In a case where a crosslinking agent is a compound represented by Formula (1), $R_1$ to $R_6$ each independently represent a hydrogen atom or an organic group having 1 to 50 carbon atoms. Examples of the organic group having 1 to 50 carbon atoms include an alkyl group, a cycloalkyl group, or an amyl group, or a group obtained by linking these groups to an alkylene group, an arylene group, a carboxylic acid ester bond, a carbonic acid ester bond, an ether bond, a thioether bond, a sulfo group, a sulfone group, a urethane bond, a urea bond, or a group obtained by combining these.

At least one of $R_2, \ldots,$ or $R_6$ is a structure represented by Formula (2). Examples of the organic group having 1 to 30 carbon atoms represented by $R_7$ in Formula (2) include specific examples which are the same as the organic group represented by $R_1$ to $R_6$. It is preferable that two or more structures represented by Formula (2) are included in one molecule.

<Solvent>

The composition of the embodiment of the present invention generally contains a solvent.

Examples of the solvent that can be used in preparing the composition include organic solvents such as alkylene glycol monoalkyl ether carboxylate, alkylene glycol monoalkyl ether, lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkyl alkoxyacetate, and alkyl pyruvate.

Specific examples of these solvents include solvents disclosed in <0441> to <0455> of US2008/0187860A.

According to the present invention, a mixed solvent obtained by mixing a solvent containing a hydroxyl group in a structure and a solvent not containing a hydroxyl group may be used as the organic solvent.

As the solvent containing a hydroxyl group in a structure and the solvent not containing a hydroxyl group, the example compounds described above can be appropriately selected, but the solvent containing a hydroxyl group is preferably alkylene glycol monoalkyl ether and lactic acid alkyl ester and more preferably propylene glycol monomethyl ether (PGME, also known as 1-methoxy-2-propanol), methyl 2-hydroxyisobutyrate, and ethyl lactate. As the solvent not containing a hydroxyl group, alkylene glycol monoalkyl ether acetate, alkyl alkoxy propionate, a monoketone compound that may contain a ring, cyclic lactone, and alkyl acetate are preferable. Among these, propylene glycol monomethyl ether acetate (PGMEA, also referred to as 1-methoxy-2-acetoxypropane), ethyl ethoxypropionate, 2-heptanone, γ-butyrolactone, cyclohexanone, and butyl acetate are more preferable, and propylene glycol monomethyl ether acetate, γ-butyrolactone, ethyl ethoxypropionate, and 2-heptanone are even more preferable.

The mixing ratio (mass) of the solvent containing a hydroxyl group and the solvent not containing a hydroxyl group is 1/99 to 99/1, preferably 10/90 to 90/10, and more preferably 20/80 to 60/40. A mixed solvent containing 50 mass % or more of the solvent not containing a hydroxyl group is particularly preferable in view of coating uniformity.

The solvent preferably includes propylene glycol monomethyl ether acetate and is preferably a single solvent of propylene glycol monomethyl ether acetate or a mixed solvent of two or more kinds containing propylene glycol monomethyl ether acetate.

<Other Additives>

(Surfactant)

The composition of the embodiment of the present invention may not further contain a surfactant, but in a case where the composition contains a surfactant, and a fluorine-based and/or silicon-based surfactant (fluorine-based surfactant, silicon-based surfactant, and surfactant having both of fluorine atom and silicon atom) are preferable.

In a case where the composition of the embodiment of the present invention contains a surfactant, in a case where an exposure light source having 250 nm or lower, particularly 220 nm or lower is used, a resist pattern having adhesive properties and fewer development defects can be applied at favorable sensitivity and resolutions.

Examples of the fluorine-based and/or silicon-based surfactants include surfactants disclosed in paragraph <0276> of US2008/0248425A.

According to the present invention, surfactants other than fluorine-based and/or silicon-based surfactants disclosed in paragraph <0280> of US2008/0248425A can be used.

These surfactants may be used singly, or several types thereof may be used in combination.

In a case where the composition of the embodiment of the present invention contains a surfactant, the used amount of the surfactant is preferably 0.0001 to 2 mass % and more preferably in the range of 0.0005 to 1 mass % with respect to the total solid content of the composition.

Meanwhile, in a case where the addition amount of the surfactant is 10 ppm or lower with respect to the total amount (except for the solvent) of the resist composition, the uneven distribution properties of the surface of the hydrophobic resin increase, and accordingly, the surface of the actinic ray-sensitive or radiation-sensitive film can become more hydrophobic, and water followability in a case of liquid immersion exposure can be improved.

(Carboxylic Acid Onium Salt)

The resist composition of the embodiment of the present invention may contain carboxylic acid onium salt. Examples of the carboxylic acid onium salt include a product disclosed in paragraphs <0605> to <0606> of US2008/0187860A.

These carboxylic acid onium salts can be synthesized by reacting sulfonium hydroxide, iodonium hydroxide, ammonium hydroxide, and carboxylic acid with silver oxide in an appropriate solvent.

In a case where the composition of the embodiment of the present invention contains carboxylic acid onium salt, the content thereof is generally 0.1 to 20 mass %, preferably 0.5 to 10 mass %, and more preferably 1 to 7 mass % with respect to the total solid content of the composition.

(Other Additives)

In the composition of the embodiment of the present invention, if necessary, an acid proliferation agent, a dye, a plasticizer, a photosensitizer, a light absorber, an alkali-soluble resin, a dissolution inhibitor, a compound (for example, a phenol compound having a molecular weight of 1000 or lower, alicyclic or aliphatic compound having a carboxyl group) that promotes solubility in the developer, and the like can be further contained.

The phenol compound having a molecular weight of 1000 or less can be easily synthesized by those skilled in the art, for example, with reference to methods disclosed in JP1992-122938A (JP-H04-122938A), JP1990-028531A (JP-H02-028531A), U.S. Pat. No. 4,916,210A, and EP219294B.

Specific examples of alicyclic or aliphatic compounds having a carboxy group include a carboxylic acid derivative that has a steroid structure such as cholic acid, deoxycholic acid, and lithocholic acid, an adamantanecarboxylic acid derivative, adamantanedicarboxylic acid, cyclohexanecarboxylic acid, and cyclohexane dicarboxylic acid.

<Preparation Method>

In view of resolving power improvement, with the composition according to the embodiment of the present invention, it is preferable to form an actinic ray-sensitive or radiation-sensitive film having a film thickness of 90 nm or less and preferably having a film thickness of 85 nm or less. In a case where coatability and film forming properties are improved by setting the concentration of the solid content in the composition to an appropriate range such that the composition has an appropriate viscosity, the film thickness can be obtained.

The concentration of the solid content of the composition according to the embodiment of the present invention is generally 1.0 to 10 mass %, preferably 2.0 to 5.7 mass %, and more preferably 2.0 to 5.3 mass %. By causing the concentration of the solid content of to be in the above range, the substrate can be uniformly coated with the resist solution, and also an excellent resist pattern can be formed by LWR. Although the reason is unclear, it is considered that, by setting the concentration of the solid content to 10 mass % or less and preferably 5.7 mass % or less, the aggregation of the material, particularly, the photoacid generator in the resist solution is suppressed, and as a result, a uniform actinic ray-sensitive or radiation-sensitive film can be formed.

The concentration of the solid content is a mass percentage of a mass of the other resist components excluding the solvent with respect to the total mass of the composition.

The composition according to the embodiment of the present invention can be used by dissolving the above components in a predetermined organic solvent, preferably the mixed solvent, performing filter filtration, and applying on a predetermined support (substrate). The pore size of the filter used in the filter filtration is 0.1 µm or lower, more preferably 0.05 µm or lower, and even more preferably 0.03 µm or lower, and preferably made of polytetrafluoroethylene, polyethylene, or nylon. In the filter filtration, for example, as disclosed in JP2002-062667A, cyclical filtration may be performed, or filtration may be performed by connecting plural kinds of filters in series or in parallel. In addition, the composition may be filtrated a plurality of times. Before or after the filter filtration, a deaeration treatment or the like may be performed on the composition.

<Application>

The resist composition of the embodiment of the present invention relates to an actinic ray-sensitive or radiation-sensitive resin composition of which properties change in reaction to the irradiation with an actinic ray or radiation. More specifically, the present invention relates to an actinic ray-sensitive or radiation-sensitive resin composition used in a step of manufacturing a semiconductor such as an IC, the manufacturing of a circuit substrate such as a liquid crystal and a thermal head, the manufacturing of a mold structure for imprinting, a photofabrication step, a lithographic printing plate, and an acid curable composition.

[Pattern Forming Method]

The present invention also relates to a pattern forming method using the actinic ray-sensitive or radiation-sensitive resin composition. Subsequently, the pattern forming method according to the embodiment of the present invention is described. In addition to the description of the pattern forming method, the actinic ray-sensitive or radiation-sensitive film (typically a resist film) of the embodiment of the present invention is also described.

The pattern forming method according to the embodiment of the present invention includes (i) a step of forming an actinic ray-sensitive or radiation-sensitive film by an actinic ray-sensitive or radiation-sensitive resin composition described above;

(ii) a step of irradiating the actinic ray-sensitive or radiation-sensitive film with actinic rays or radiation (exposure step), and (iii) a step of developing the actinic ray-sensitive or radiation-sensitive film irradiated with actinic rays or radiation with a developer.

The pattern forming method according to the embodiment of the present invention is not particularly limited, as long as the method includes the steps of (i) to (iii) and may further have the following steps.

In the pattern forming method according to the embodiment of the present invention, the exposure method in (ii) the exposure step is preferably immersion exposure.

The pattern forming method according to the embodiment of the present invention preferably includes (iv) a prebaking step before (ii) the exposure step.

The pattern forming method according to the embodiment of the present invention preferably includes (v) a postexposure baking step after (ii) the exposure step.

The pattern forming method according to the embodiment of the present invention may include (ii) the exposure step a plurality of times.

The pattern forming method according to the embodiment of the present invention may include (iv) the prebaking step a plurality of times.

The pattern forming method according to the embodiment of the present invention may include (v) the postexposure baking step a plurality of times.

The actinic ray-sensitive or radiation-sensitive film according to the embodiment of the present invention is a film formed of the actinic ray-sensitive or radiation-sensitive resin composition, and is preferably a film formed by coating a substrate with the composition, specifically.

In the pattern forming method according to the embodiment of the present invention, (i) the actinic ray-sensitive or radiation-sensitive film forming step, (ii) the exposure step, and (iii) the development step can be performed by well-known methods.

If necessary, the antireflection film may be formed between an actinic ray-sensitive or radiation-sensitive film and a substrate. As the antireflection film, well-known organic and inorganic antireflection films can be appropriately used.

The substrate is not particularly limited, and a substrate that is generally used in a step of manufacturing a semiconductor such as IC, a step of manufacturing a circuit board of a liquid crystal, a thermal head, or the like, a lithography step of photo fabrication, or the like can be used, and specific examples thereof include an inorganic substrate such as silicon, $SiO_2$, or SiN or a coating type inorganic substrate such as Spin On Glass (SOG).

As described above, the pattern forming method according to the embodiment of the present invention preferably includes (iv) a prebaking (PB) step after (i) the actinic ray-sensitive or radiation-sensitive film forming step and before (ii) the exposure step.

It is preferable to include (v) the postexposure baking (PEB) step after (ii) the exposure step and before (iii) the development step.

The baking as described above accelerates the reaction of the exposed portion and improves sensitivity and/or pattern profile.

In both cases of PB and PEB, the heating time is not particularly limited, but is preferably 70° C. to 130° C. and more preferably 80° C. to 120° C.

In both cases of PB and PEB, the temperature of the heat treatment is preferably 30 to 300 seconds, more preferably 30 to 180 seconds, and even more preferably 30 to 90 seconds.

The heating can be performed by means included in a general exposure machine and a general developing machine and may be performed by using a hot plate or the like.

There is no limitation on the light source wavelength used in the exposure device, but examples thereof include infrared light, visible light, ultraviolet light, far ultraviolet light, extreme ultraviolet light, X-rays, and electron beams, and far ultraviolet light having a wavelength of preferably 250 nm or less, more preferably 220 nm or less, and even more preferably 1 to 200 nm, specifically, KrF excimer laser (248 nm), ArF excimer laser (193 nm), excimer laser (157 nm), X-rays, EUV (13 nm), or electron beams ArF excimer laser. ArF excimer laser, EUV, or electron beams are preferable, and ArF excimer laser is more preferable.

In the pattern forming method according to the embodiment of the present invention, in the (ii) exposure step, a liquid immersion exposure method can be applied. The liquid immersion exposure method can be combined with super-resolution techniques such as a phase shift method and a deformed illumination method. The immersion exposure can be performed, for example, by a method described in paragraphs <0594> to <0601> of JP2013-242397A.

In (iii) the developing step, an alkali developer or a developer (hereinafter also referred to as an organic developer) containing an organic solvent may be used, an alkali developer is preferably used.

As an alkali developer, generally, a quaternary ammonium salt represented by tetramethylammonium hydroxide is used, but in addition to this, an alkali aqueous solution of inorganic alkali, primary to tertiary amine, alcohol amine, cyclic amine, or the like can be also used.

Specifically, as the alkali developer, for example, alkali aqueous solutions of inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyl diethylamine; alcohol amines such as dimethylethanolamine and triethanolamine; a quaternary ammonium salt such as tetramethylammonium hydroxide and tetraethylammonium hydroxide; cyclic amines such as pyrrole and piperidine; and the like can be used. Among these, an aqueous solution of tetraethylammonium hydroxide is preferably used.

Further, alcohols and a surfactant may be added in an appropriate amount to the alkali developer. The alkali concentration of the alkali developer is generally 0.1 to 20 mass %. pH of the alkali developer is generally 10.0 to 15.0.

The time for performing the development by using an alkali developer is generally 10 to 300 seconds.

The alkali concentration (and pH) and the developing time of the alkali developer can be appropriately adjusted according to a pattern to be formed.

As an organic developer, a polar solvent such as a ketone-based solvent, an ester-based solvent, an alcohol-based solvent, an amide-based solvent, and an ether-based solvent or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

Examples of the alcohol-based solvent include alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methylbutanol.

In addition to the above glycol ether-based solvent, examples of the ether solvent include dioxane or tetrahydrofuran.

As the amide-based solvent, for example, N-methyl-2-pyrrolidone, N,N-dimethyl acetamide, N,N-dimethylformamide, hexamethylphosphoric triamide, and 1,3-dimethyl-2-imidazolidinone can be used.

Examples of the hydrocarbon solvent include an aromatic hydrocarbon solvent such as toluene and xylene; and an aliphatic hydrocarbon solvent such as pentane, hexane, octane, and decane.

The aliphatic hydrocarbon-based solvent which is a hydrocarbon-based solvent may be a mixture of compounds having the same number of carbon atoms and different structures. For example, in a case where decane is used as the aliphatic hydrocarbon-based solvent, 2-methylnonane, 2,2-dimethyloctane, 4-ethyloctane, isooctane and, the like which are compounds having the same number of carbon atoms and different structures may be included in the aliphatic hydrocarbon-based solvent.

The compounds having the same number of carbon atoms and different structures may be included singly, or a plurality of kinds thereof may be included as described above.

The plurality of kinds of the solvents may be mixed or may be mixed with a solvent other than the above or water. In order to sufficiently obtain the effect of the present invention, the moisture content of the developer as a whole is preferably less than 10 mass %, and it is more preferable that substantially no moisture is contained.

That is, the content of the organic solvent with respect to the organic developer is preferably 90 mass % to 100 mass % and more preferably 95 mass % to 100 mass % with respect to the total amount of the developer.

Particularly, the organic developer is preferably a developer containing at least one kind of organic solvent selected from the group consisting of a ketone-based solvent, an ester-based solvent, an alcohol-based solvent, an amide-based solvent, and an ether-based sol vent.

The vapor pressure of the organic developer is preferably 5 kPa or lower, more preferably 3 kPa or lower, and even more preferably 2 kPa or lower at 20° C. In a case where the vapor pressure of the organic developer is 5 kPa or lower, the evaporation of the developer on the substrate or in a development cup is suppressed, and thus the temperature uniformity in the wafer surface increases, and as a result, the dimension uniformity in the wafer surface improves.

An appropriate amount of a surfactant can be added to the organic developer, if necessary.

The surfactant is not particularly limited but, for example, ionic or nonionic fluorine-based and/or silicon-based surfactants and the like can be used. Examples of the fluorine-based and/or silicon-based surfactants include surfactants disclosed in JP1987-036663A (JP-S62-036663A), JP1986-226746A (JP-S61-226746A), JP1986-226745A (JP-S61-226745A), JP1987-170950A (JP-S62-170950A), JP1988-034540A (JP-S63-034540A), JP1995-230165 A (JP-H07-230165A), JP 1996-062834A (JP-H08-062834A), JP 1997-054432A (JP-H09-054432A), JP1997-005988A (JP-H09-005988A), U.S. Pat. Nos. 5,405,720B, 5,360,692B, U.S. 5,529,881B, U.S. Pat. Nos. 5,296,330B, 5,436,098B, 5,576,143B, 5,294,511B, and 5,824,451B, and a nonionic surfactant is preferable. The nonionic surfactant is not particularly limited, but it is more preferable to use a fluorine-based surfactant or a silicon-based surfactant.

The usage amount of the surfactant is generally 0.001 to 5 mass %, preferably 0.005 to 2 mass %, and more preferably 0,01 to 0,5 mass % with respect to the total amount of the developer.

The organic developer may include a basic compound. Examples of the basic compound include an amine compound, an amide group-containing compound, a urea compound, and a nitrogen-containing heterocyclic compound. Examples of the basic compound include those described in the basic compound that can be included in the composition which are described above as the acid diffusion control agent.

As the developing method, for example, a method of immersing a substrate in a tank filled with a developer for a predetermined period of time (dipping method), a developing method by raising the developer by surface tension on the surface of a substrate for a certain period of time (paddle method), a method of spraying a developer to the surface of a substrate (spraying method), and a method of continuously discharging a developer while scanning a developer discharging nozzle at a constant speed on a substrate rotating at a constant speed (dynamic dispensing method) can be applied. The suitable range of the discharge pressure of the discharged developer and the method of adjusting the discharge pressure of the developer are not particularly limited. For example, ranges and methods disclosed in paragraphs <0631> to <0636> of JP2013-242397A can be used in the present invention.

In the pattern forming method of the embodiment of the present invention, a development step (organic solvent developing step) by using a developer including an organic solvent and a development step (alkali development step) by using an alkali aqueous solution may be used in combination. Accordingly, a finer pattern can be formed.

According to the present invention, a portion of weak exposure intensity is removed by the organic solvent developing step, but by further performing the alkali developing step, a portion with high exposure intensity is also removed. Since the pattern formation can be performed without dissolving only an area of the intermediate exposure intensity by the multiple development process in which the development is performed a plurality of times in this manner, it is possible to form a pattern finer than usual (the same mechanism as in <0077> of JP2008-292975A).

After (iii) the development step (after (V) the postexposure baking step in a case where (V) the postexposure baking step is performed), it is preferable to include a step (rinsing step) of performing rinsing with a rinsing solution.

As the rinsing solution used in the rinsing step after the step of performing development with an alkali developer, pure water can be used, and an appropriate amount of a surfactant can be added to be used. After the developing treatment or the rinse treatment, a treatment of removing the developer or the rinsing solution deposited to the pattern by supercritical fluid can be performed. After a rinsing treatment or a treatment by a supercritical fluid, a heat treatment can be performed in order to remove moisture remaining in the pattern.

The rinsing solution used in the rinse step after the step of performing the development with a developer including an organic solvent is not particularly limited as long as the rinsing solution does not dissolve the resist pattern, and a solution containing a general organic solvent can be used. It is more preferable to use a rinsing solution containing at least one kind of organic solvent selected from the group consisting of a hydrocarbon-based solvent, a ketone-based solvent, an ester-based solvent, an alcohol-based solvent, an amide-based solvent, and an ether-based solvent, as the rinsing solution.

Specific examples of the hydrocarbon-based solvent, the ketone-based solvent, the ester-based solvent, the alcohol-based solvent, the amide-based solvent, and the ether-based solvent include the same solvents as described for the developer including an organic solvent.

It is more preferable to perform a washing step by using a rinsing solution containing at least one organic solvent selected from the group consisting of a ketone-based solvent, an ester-based solvent, an alcohol-based solvent, an amide-based solvent, and a hydrocarbon-based solvent after the developing step by using a developer including an organic solvent, it is even more preferable to perform a washing step by using a rinsing solution containing an alcohol-based solvent or an ester-based solvent, it is particularly preferable to perform a washing step by using a rinsing solution containing monohydric alcohol, and it is most preferable to perform a washing step by using a rinsing solution containing monohydric alcohol having 5 or more carbon atoms.

Here, examples of the monohydric alcohol used in the rinsing step include linear, branched, or cyclic monohydric alcohol. Specific examples include 1-butanol, 2-butanol, 3-methyl-1-butanol, tort-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The rinsing solution containing a hydrocarbon-based solvent is preferably a hydrocarbon compound having 6 to 30 carbon atoms, more preferably a hydrocarbon compound having 8 to 30 carbon atoms, and particularly preferably a hydrocarbon compound having 10 to 30 carbon atoms. Among them, by using a rinsing solution including decane and/or undecane, pattern collapse is suppressed.

In a case where an ester-based solvent is used as a rinsing solution, (one or more kinds of) a glycol ether-based solvent may be used in addition to the ester-based solvent. Specific examples of this case include using an ester-based solvent (preferably butyl acetate) as a main component and a glycol ether-based solvent (preferably propylene glycol monomethyl ether (PGME)) as an auxiliary component. Thereby, residue defects can be suppressed.

A plurality of components may be mixed or may be mixed with an organic solvent other than the above to be used.

The moisture content in the rinsing solution is preferably 10 mass % or less, more preferably 5 mass % or less, and even more preferably 3 mass % or less. In a case where the moisture content is caused to be 10 mass % or less, satisfactory developing characteristics can be obtained.

The vapor pressure of the rinsing solution used in the developing step using a developer including an organic solvent at 20° C. is preferably 005 kPa to 5 kPa, more preferably 0.1 kPa to 5 kPa. and even more preferably 0.12 kPa to 3 kPa. By setting the vapor pressure of the rinsing solution to 0.05 kPa to 5 kPa, temperature uniformity in the wafer surface is improved, swelling due to permeation of the rinsing solution is suppressed, and dimensional uniformity in the wafer surface becomes satisfactory.

An appropriate amount of a surfactant may be added to the rinsing solution to be used.

In the rinsing step, the wafer that has been developed by using a developer including an organic solvent is subjected to a washing treatment by using the above rinsing solution including an organic solvent. The method of washing treatment is not particularly limited, and for example, a method of continuously discharging the rinsing solution to the substrate rotating at a constant speed (spin coating method), a method of immersing a substrate in a tank filled with the rinsing solution for a predetermined period of time (dipping method), a method of spraying a rinsing solution to the surface of a substrate (spraying method), and the like can be applied. Among these, it is preferable that a washing treatment is performed by a spin coating method, and after washing, the substrate is rotated at a rotation speed of 2,000 rpm to 4,000 rpm to remove the rinsing solution from the substrate. It is also preferable to include a baking step (post bake) after the rinsing step. The developer and the rinsing solution retained between the patterns and inside the pattern are removed by baking. The baking step after the rinsing step is performed generally at 40° C. to 160° C. and preferably 70° C. to 95° C., and generally for 10 seconds to 3 minutes and preferably 30 seconds to 90 seconds.

The actinic ray-sensitive or radiation-sensitive resin composition according to the embodiment of the present invention and various materials (for example, a resist solvent, a developer, a rinsing solution, an antireflection film forming composition, or a topcoat forming composition) used in the pattern forming method according to the embodiment of the present invention do not preferably include impurities such as metal. The content of impurities included in these materials is preferably 1 ppm or less, more preferably 100 ppt or less, and even more preferably 10 ppt or less, and it is particularly preferable that impurities are not substantially included (the content is equal to or less than a detection limit of a determination device).

Examples of the method for removing impurities such as metals from various materials include filtration using a filter. The pore size of the filter is preferably 10 nm or less, more preferably 5 nm or less, and even more preferably 3 nm or less. The material of the filter is preferably polytetrafluoroethylene, polyethylene, or nylon. As the filter, a filter washed with an organic solvent in advance may be used. In the filter filtration step, a plurality of kinds of filters may be connected in series or juxtaposition, to be used. In a case where a plurality of kinds of filters are used, filters having different pore sizes and/or different materials may be used in combination. In addition, a variety of materials may be used in filtration in a plurality of steps, and the filtration in the plurality of steps may be a circulating filtration step.

Examples of the method for reducing impurities such as metal included in the aforementioned various materials include methods such as selecting raw materials having a less metal content as raw materials for forming various materials, performing filter filtration on raw materials for forming various materials, or performing distillation under conditions where contamination is suppressed as much as possible by lining the inside of a device with TEFLON (registered trademark). Preferable conditions for filter filtration performed on raw materials for forming various materials are the same as the aforementioned conditions.

In addition to the filter filtration, impurities may be removed by an adsorbent, and a filter filtration and an adsorbent may be combined to be used. As the adsorbent, well-known adsorbents may be used, and for example, an inorganic adsorbent such as silica gel and zeolite and an organic adsorbent such as activated carbon may be used.

A method of improving the surface roughness of the pattern may be applied to the pattern formed by the pattern forming method of the embodiment of the present invention. Examples of a method for improving the surface roughness of the pattern include a method of treating a resist pattern by plasma of gas containing hydrogen disclosed in WO2014/002808A1. Well-known methods as disclosed in JP2004-235468A, US2010/0020297A, JP2009-019969A, and Proc. of SPIE Vol. 8328 83280N-1 "EUV Resist Curing Technique for LWR Reduction and Etch Selectivity Enhancement" may be applied.

The pattern forming method of the embodiment of the present invention can be used in a guide pattern formation (for example, see ACS Nano Vol. 4 No. 8 Pages 4815 to 4823) in Directed Self-Assembly (DSA).

The resist pattern formed, for example, by the above method can be used as a core of a spacer process disclosed in JP1991-270227A (JP-H3-270227A)) and JP 2013-164509A.

[Method of Manufacturing Electronic Device]

The present invention also relates to a method of manufacturing an electronic device including the pattern forming method according to the embodiment of the present invention. The electronic device manufactured by the method of manufacturing the electric device according to the embodiment of the present invention can be appropriately mounted on electric or electronic apparatuses (for example, household electric devices, office automation (OA)-related apparatuses, or media-related apparatuses, optical apparatuses, and telecommunication apparatuses).

EXAMPLES

Hereinafter, the present invention is specifically described with reference to the examples. A material, an amount used, a treatment detail, a treatment order, and the like provided in the following examples can be suitably changed without departing from the gist of the present invention. Accordingly, the scope of the present invention should not be construed in a limited manner by the following examples.

Synthesis Example 1; Synthesis of Compound M1-1

(Synthesis of Compound (i))

13.9 g of trifluoroethanol (1) was dissolved in 250 g of dehydrated methylene chloride and cooled to 0° C. At 0° C., 13.3 g of diisopropylethylamine was added, and subsequently 25.0 g of bromoacetic acid bromide (2) was dropwise added. The solution after the dropwise addition was stirred at 25° C. for two hours under the nitrogen atmosphere. The reaction was stopped by adding 100 g of water, and then the organic layer was washed five times with 100 g of water. The concentrated solution of the obtained organic layer was subjected to distillation under reduced pressure so as to obtain 6.55 g of a compound (i).

(Synthesis of Compound M1-1)

5.85 g of α-chloroacrylic acid (3) was dissolved in 80.0 g of acetonitrile, and further 5.33 g of diisopropylethylamine was added. 1.00 g of the compound (i) was added thereto, and then the solution was stirred at 60° C. for one hour. The reaction was stopped by adding 50.0 g of water, and then the organic layer was washed three times with 100 g of water. The concentrate was purified by column chromatography so as to obtain 2.21 g of a compound (M1-1). ($^1$H-NMR (CDCl$_3$): δ ppm 5.88-5.76 (1H, m), 5.50-5.46 (1H, m), 4.95 (2H, s), 4.85-4.70 (2H, s))

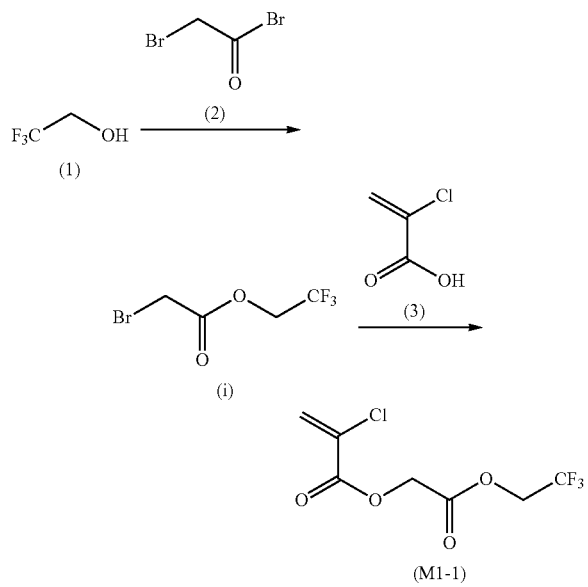

Synthesis Example 2; Synthesis of Compound M1-2

(Synthesis of Compound (ii))

12.8 g of hexafluoroisopropanol (4) was dissolved in 200 g of dehydrated methylene chloride and cooled to 0° C. 6.93 g of pyridine was added at 0° C., and subsequently 20.0 g of bromoacetic acid bromide (2) was dropwise added. The solution after the dropwise addition was stirred at 25° C. for one hour under the nitrogen atmosphere. The reaction was stopped by adding 100 g of water, and then the organic layer was washed five times with 100 g of water. The organic layer after washing was concentrated so as to obtain 15.6 g of a crude product of the compound (ii).

(Synthesis of Compound M1-2)

8.00 g of sodium a-fluoroacrylate (5) was dissolved in 71.4 g of acetonitrile, and 3.45 g of tetrabutylammonium bromide was further added thereto. Subsequently, 19.6 g of the compound (ii) was added and then was stirred at 65° C. for one hour. The reaction was stopped by adding 50.0 g of water, and then the organic layer was washed three times with 100 g of water. The concentrated solution of the obtained organic layer was subjected to distillation under reduced pressure so as to obtain 13.1 g of the compound (M1-2). ($^1$H-NMR (CDCl$_3$): δ ppm 5.88-5.76 (2H, m), 5.50-5.46 (1H, m), 4.95 (2H, s))

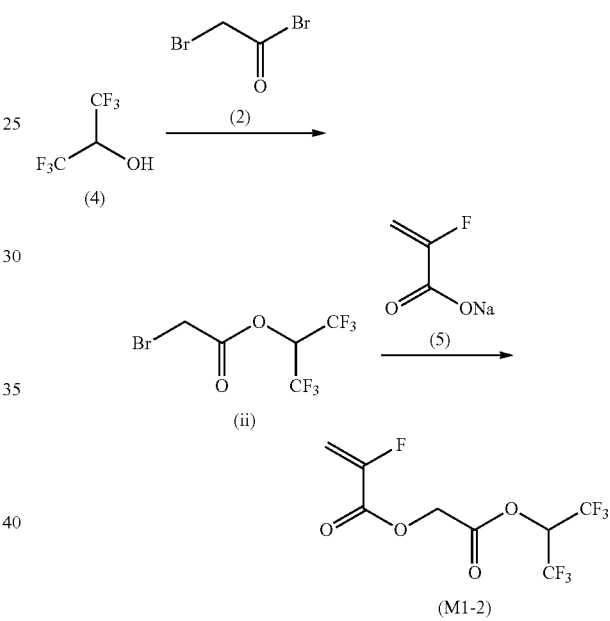

Synthesis Example 3; Synthesis of Resin P-59

1.47 g of the compound (M1-1) and 0.03 g of the polymerization initiator V-601 (manufactured by Wako Pure Chemical Industries, Ltd.) were dissolved in 2.33 g of cyclohexanone. 0.44 g of cyclohexanone was placed in a reaction vessel and dropwise added to the solution at 85° C. in a nitrogen gas atmosphere over four hours. The reaction solution was heated and stirred for two hours and then allowed to cool to room temperature.

The solution after being allowed to cool was dropwise added to 30 g of methanol/water=9/1 (mass ratio) so as to precipitate the polymer and filtration was performed. The filtered solid was washed by using 6 g of methanol/water=9/1 (mass ratio). Thereafter, the washed solid was reduced pressure-dried so as to obtain 0.89 g of a resin (P-59).

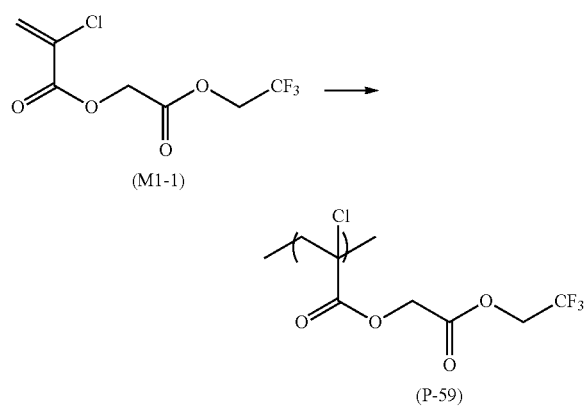

(M1-1)

(P-59)

Resins (P-1) to (P-158) were synthesized in the same manner as the synthesis of the resin (P-59).

In the same manner, the following resins (P'-1) to (P'-6) were synthesized.

The structure, the compositional ratio (molar ratio), the weight-average molecular weight, and the dispersion degree of the resins (P-1) to (P-158) are as described above.

The structure, the compositional ratio (molar ratio), the weight-average molecular weight, and the dispersion degree of the resins (P'-1) to (P'-6) are as below.

(P'-1)

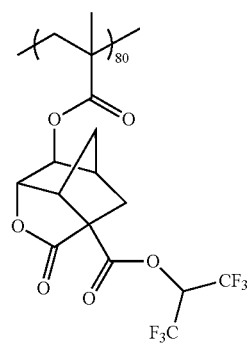

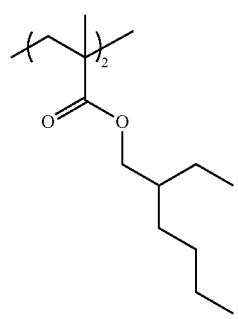

Mw: 6000
Mw/Mn: 1.5

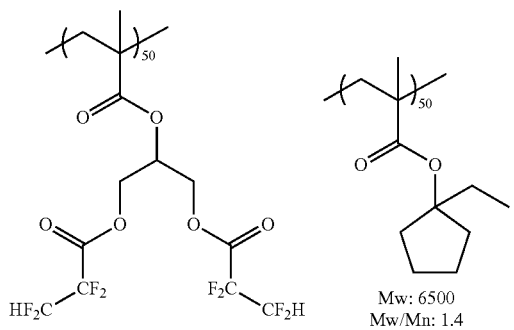

(P'-2)

Mw: 6500
Mw/Mn: 1.4

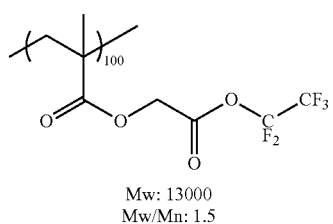

(P'-3)

Mw: 13000
Mw/Mn: 1.5

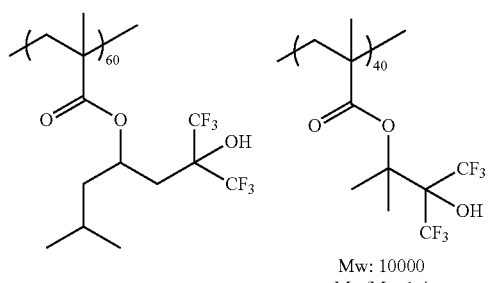

(P'-4)

Mw: 10000
Mw/Mn: 1.4

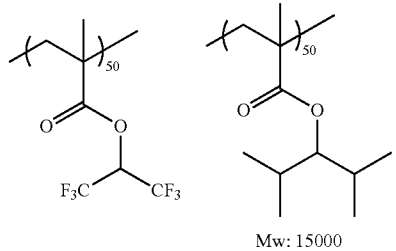

(P'-5)

Mw: 15000
Mw/Mn: 1.5

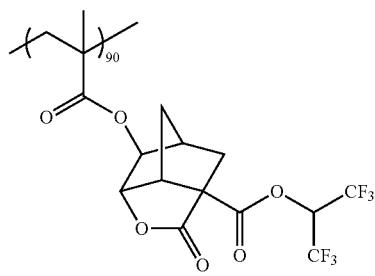

(P'-6)

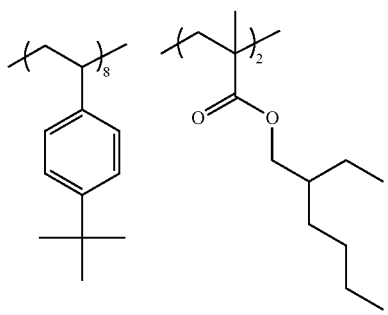

Mw: 12000
Mw/Mn: 1.7

Synthesis Example 4: Synthesis of Resin (1)

Under a nitrogen stream, 8.6 g of cyclohexanone was placed in a three-necked flask and heated to 80° C. A solution obtained by dissolving 9.8 g of 2-adamantyl isopropyl methacrylate, 4.4 g of dihydroxyadamantyl methacrylate, 8.9 g of norbomane lactone methacrylate, and 8 mol % of a polymerization initiator V-601 (manufactured by Wako Pure Chemical Industries, Ltd.) based on the monomer in 79 g of cyclohexanone was dropwise added over 6 hours. After completion of the dropwise addition, the reaction was further performed at 80° C. for two hours. The reaction solution was allowed to cool and then was dropwise added to a mixed solution of 800 ml of hexane/200 ml of ethyl acetate over 20 minutes, and the precipitated powder was collected by filtration. Subsequently, the powder was dried so as to obtain 19 g of a resin (1). The weight-average molecular weight of the obtained resin (1) was 8,800 in terms of standard polystyrene and the dispersion degree (Mw/Mn) was 1.9.

Another resin (A) as below was synthesized in the same manner as the synthesis of the resin (1).

The molar ratios (in an order from the left in the structural formula), the weight-average molecular weight (Mw), and the dispersion degree (Mw/Mn) of the repeating units in each resin are shown in Table 4 below.

(1)

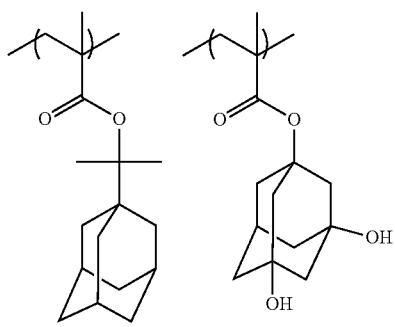

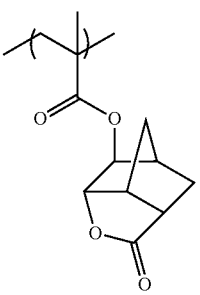

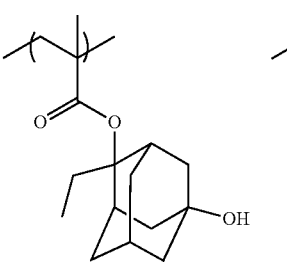

(2)

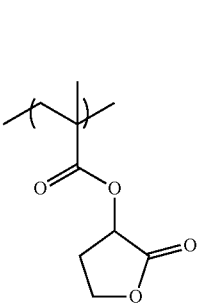

(3)

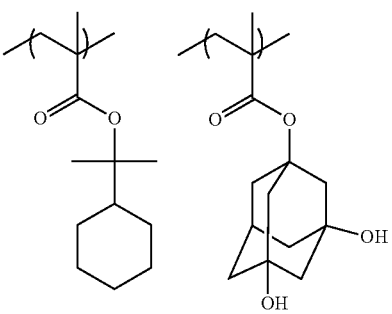

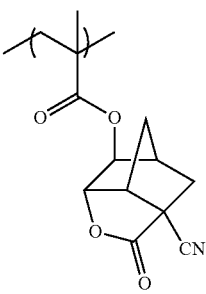

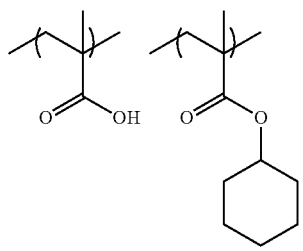

-continued
(4)
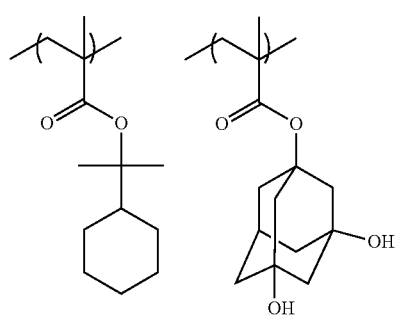
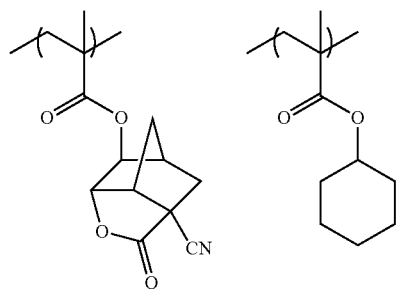
(5)
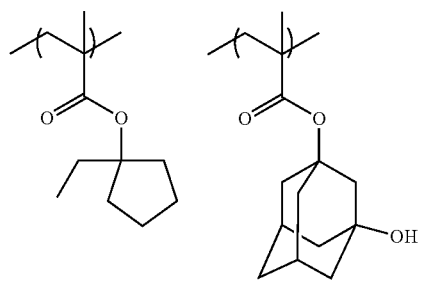
(6)
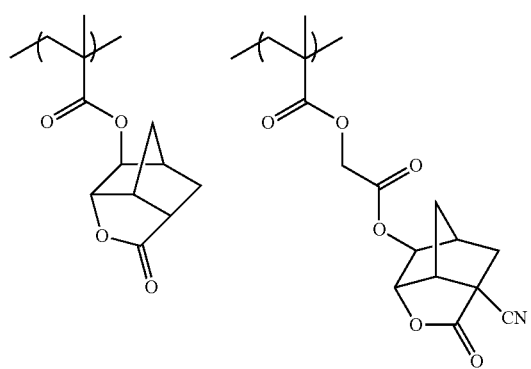
-continued
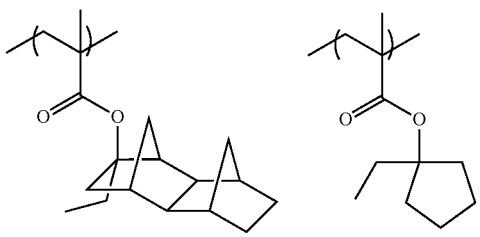
(7)
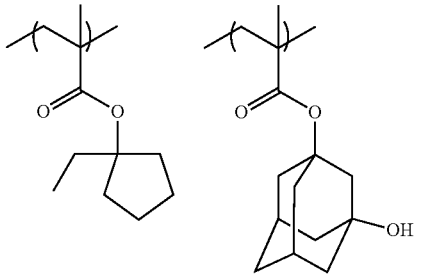
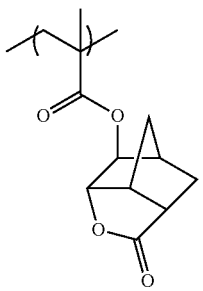
(8)
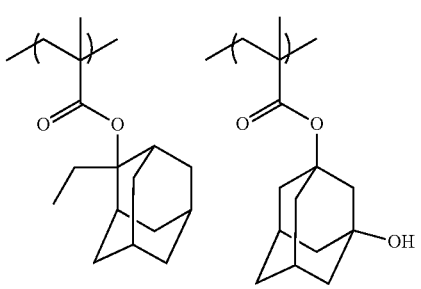
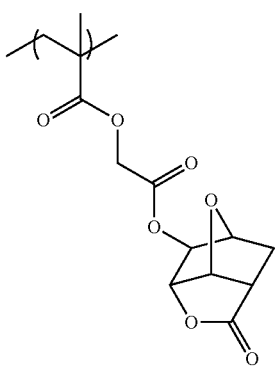

(9)
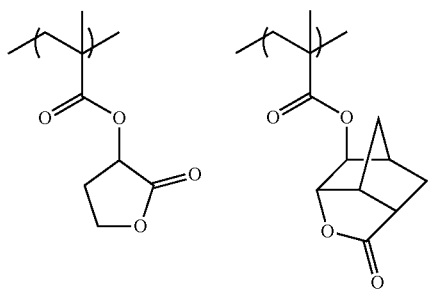
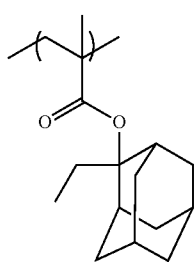
(10)
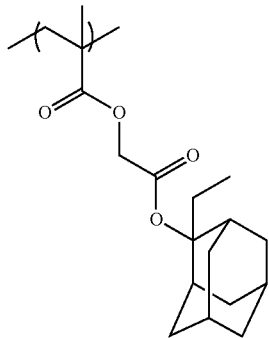
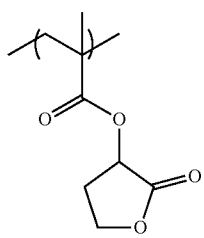
(11)
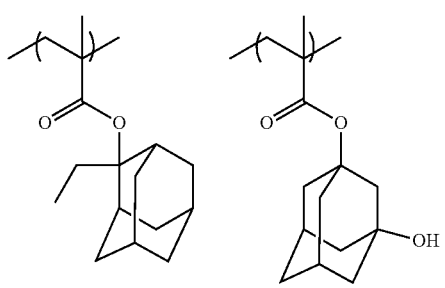
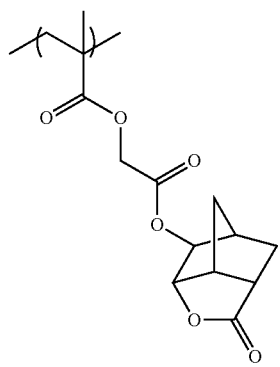
(12)
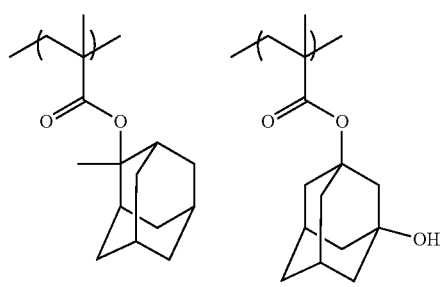
(13)
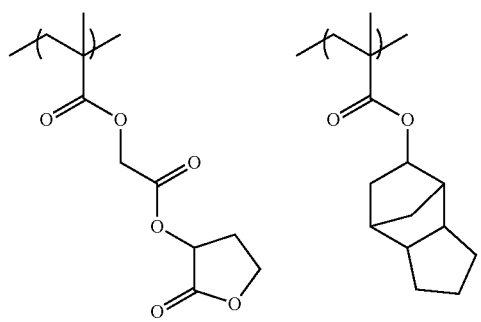
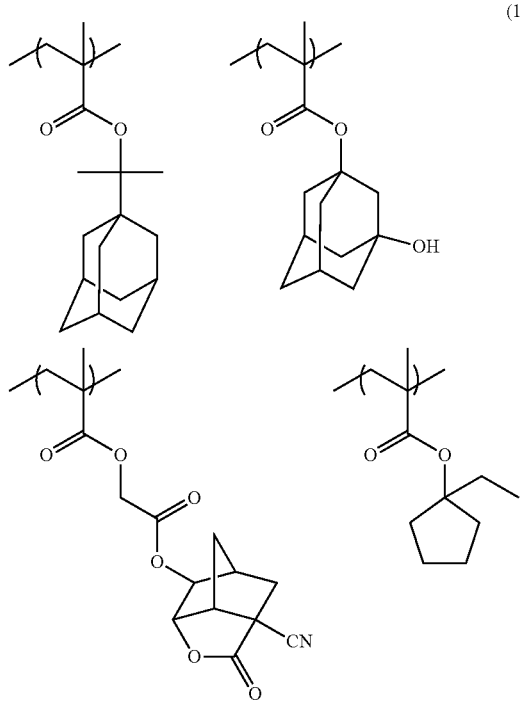

(14)
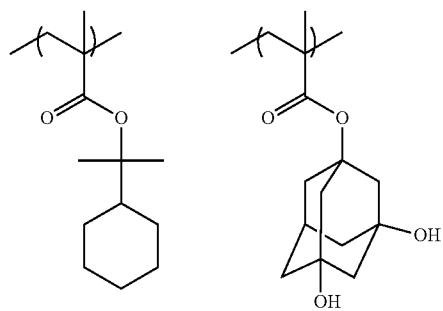
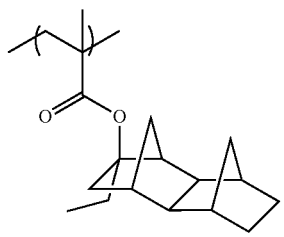
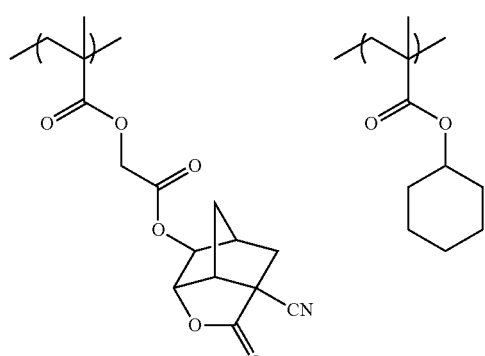
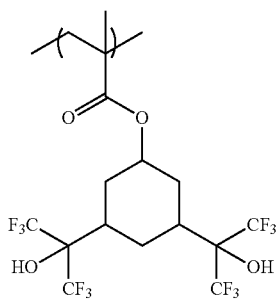
(15)
(17)
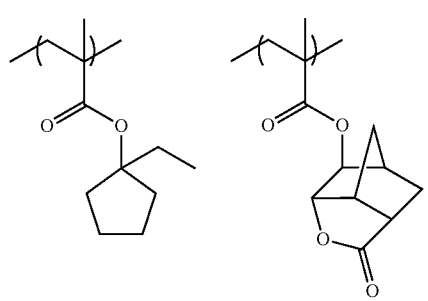
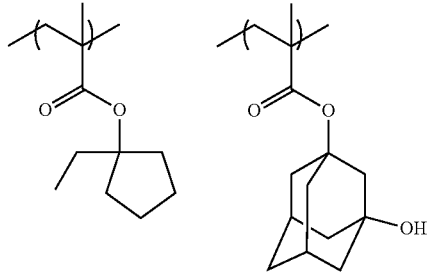
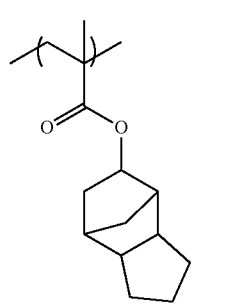
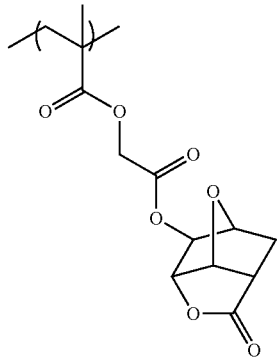
(16)
(18)
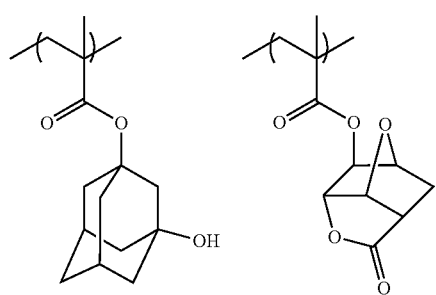
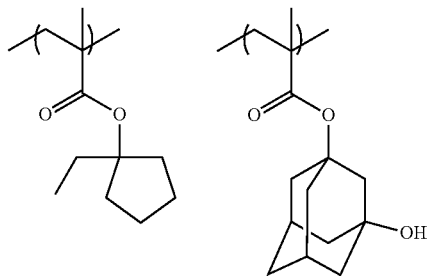

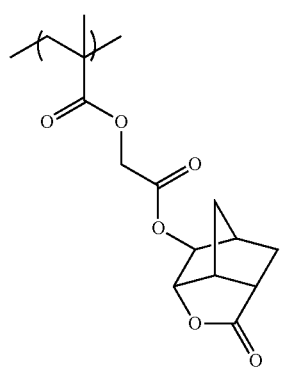
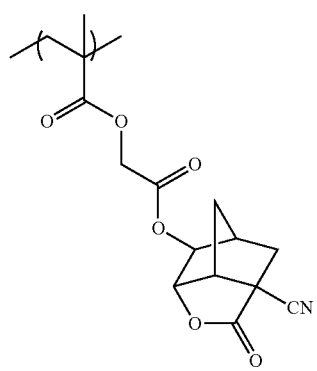
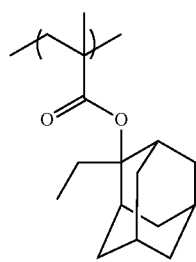 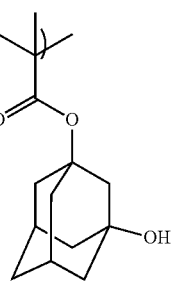
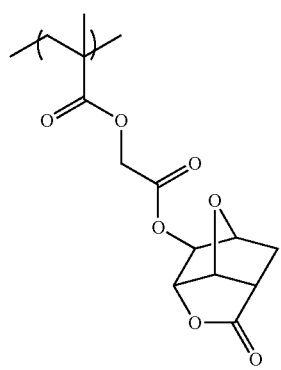
(20)
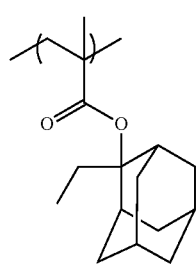 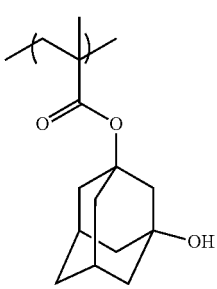
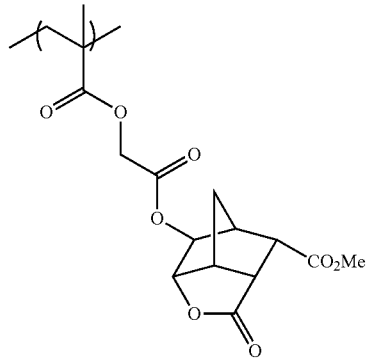
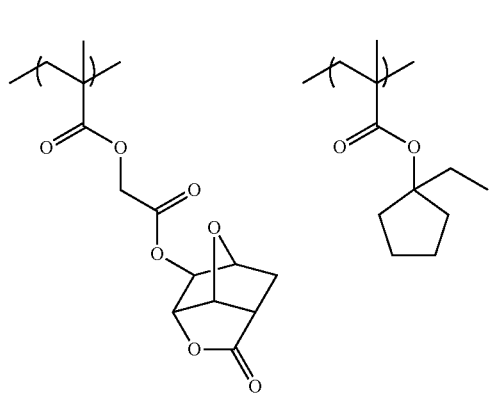
(21)
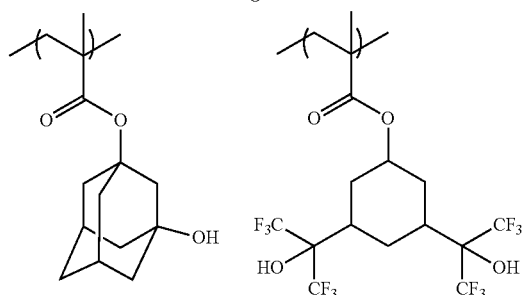
(22)
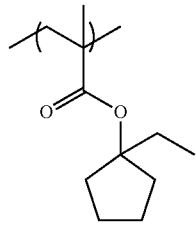
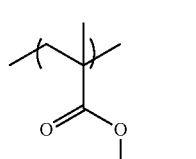
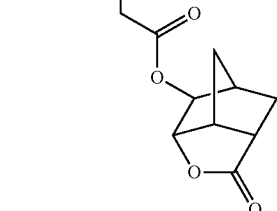 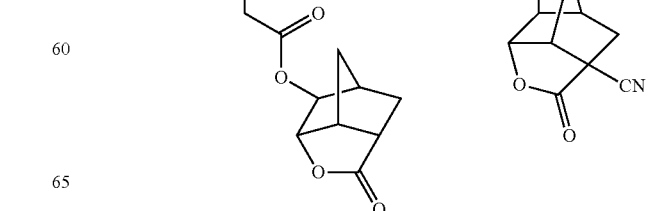

(23)
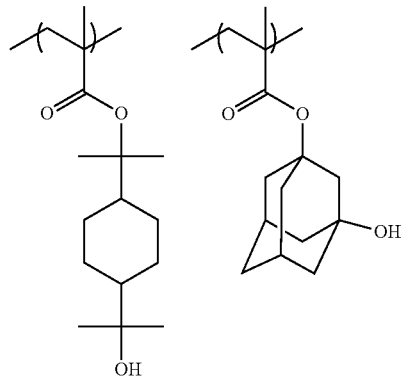
(25)
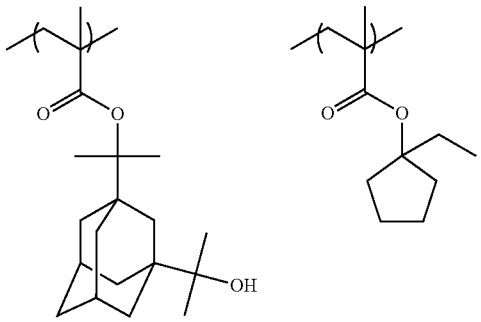
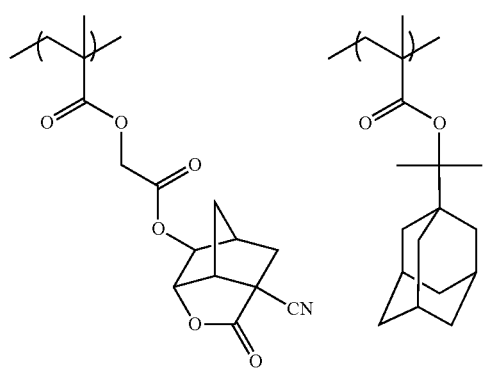
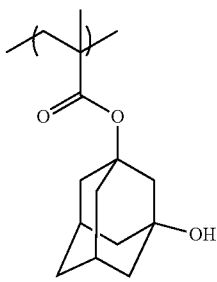
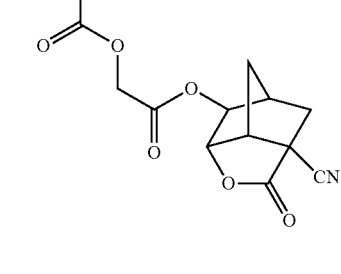
(24)
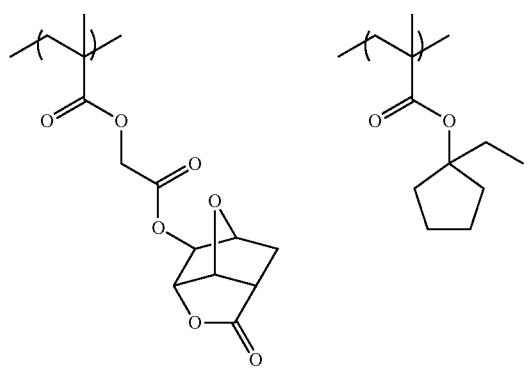
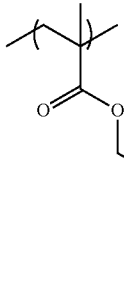
(26)
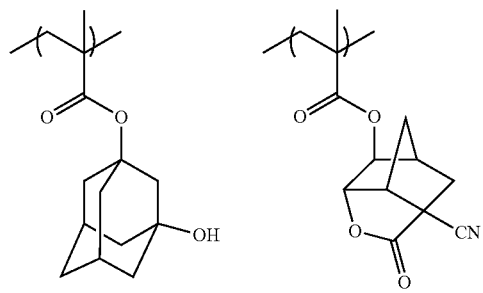
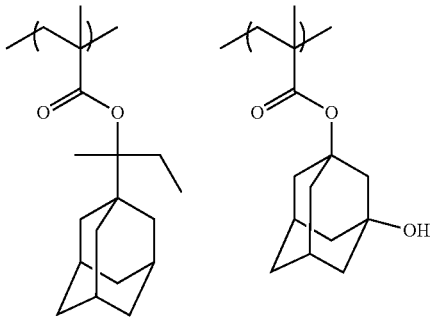

-continued
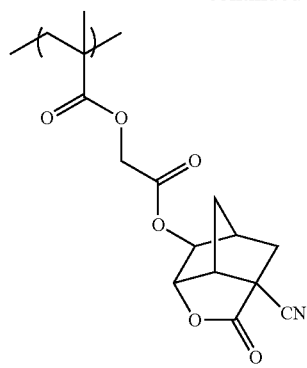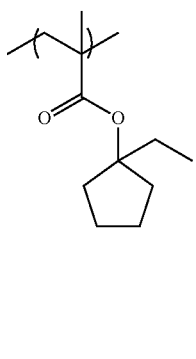
(27)
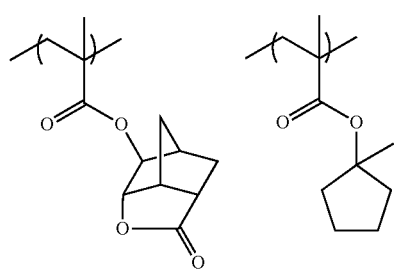
(28)
(29)
(30)
-continued
(31)
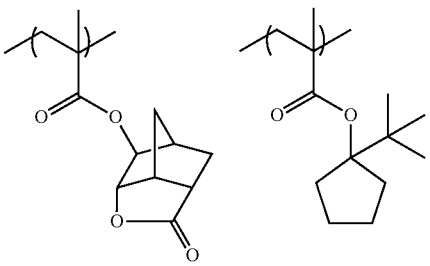
(32)
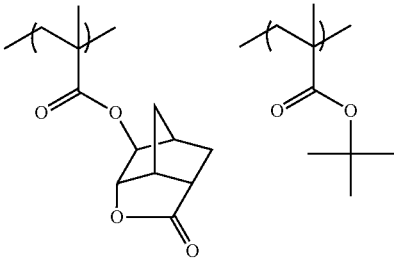
(33)
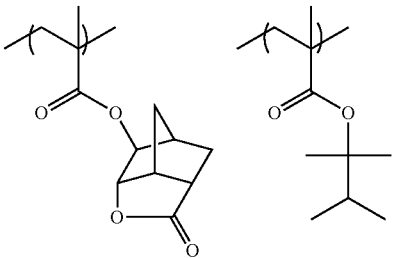
(34)
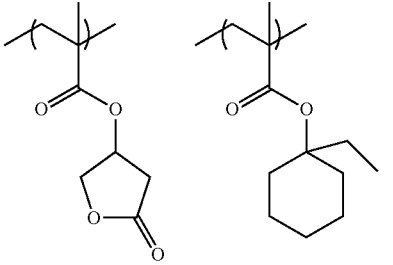
(35)
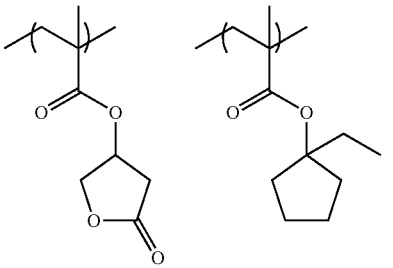
(36)
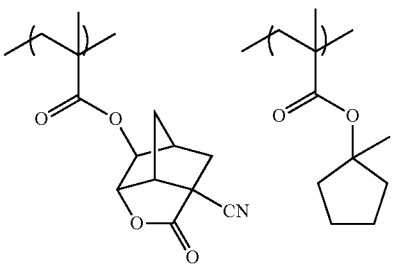

(37)
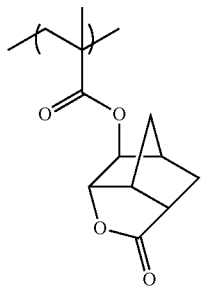 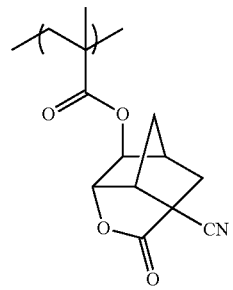
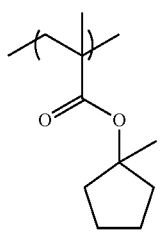
(38)
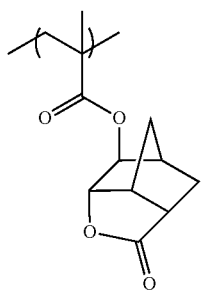 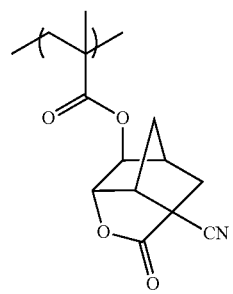
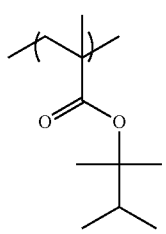
(39)
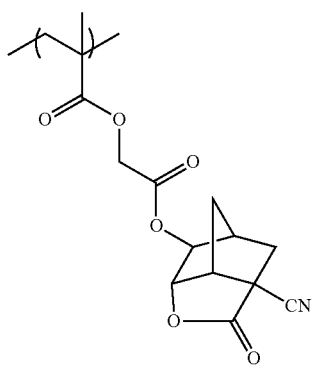
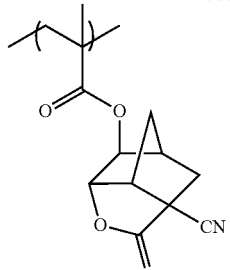
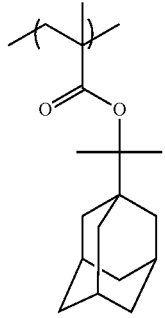 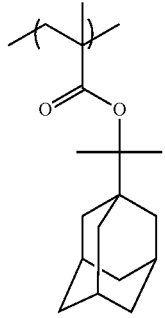
(40)
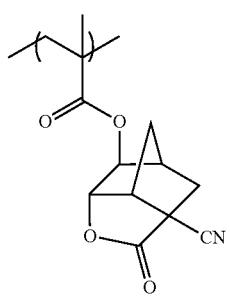 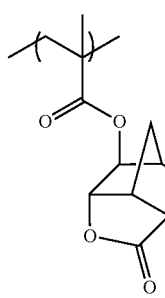
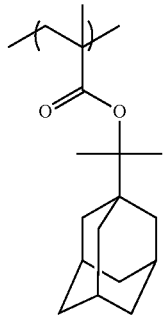 
TABLE 4
| Resin (A) | Composition (molar ratio) | Mw | Mw/Mn |
|---|---|---|---|
| 1 | 50/10/40 | 8800 | 1.9 |
| 2 | 40/20/40 | 7000 | 1.6 |
| 3 | 40/10/35/5/10 | 10000 | 1.7 |
| 4 | 40/10/40/10 | 11000 | 1.8 |
| 5 | 40/15/20/25 | 8500 | 1.6 |
| 6 | 10/40/25/25 | 12000 | 1.8 |
| 7 | 50/20/30 | 6500 | 1.6 |
| 8 | 40/10/50 | 8000 | 1.7 |
| 9 | 25/25/50 | 9000 | 1.8 |
| 10 | 50/10/40 | 11000 | 1.8 |
| 11 | 50/10/40 | 8000 | 1.7 |
| 12 | 40/10/40/10 | 7000 | 1.7 |
| 13 | 20/15/35/30 | 10000 | 1.7 |
| 14 | 45/10/35/10 | 8500 | 1.7 |
| 15 | 50/40/10 | 10000 | 1.6 |

TABLE 4-continued

| Resin (A) | Composition (molar ratio) | Mw | Mw/Mn |
|---|---|---|---|
| 16 | 10/40/40/10 | 9000 | 1.8 |
| 17 | 55/10/35 | 12000 | 1.8 |
| 18 | 40/15/20/25 | 9000 | 1.7 |
| 19 | 40/15/30/15 | 7500 | 1.6 |
| 20 | 40/15/45 | 8000 | 1.6 |
| 21 | 40/40/10/10 | 9500 | 1.8 |
| 22 | 35/15/25/25 | 10000 | 1.7 |
| 23 | 20/15/45/20 | 8000 | 1.6 |
| 24 | 25/35/15/25 | 9000 | 1.8 |
| 25 | 10/30/10/30/20 | 10000 | 1.7 |
| 26 | 20/10/40/30 | 10500 | 1.6 |

TABLE 5

| Resin (A) | Composition (molar ratio) | Mw | Mw/Mn |
|---|---|---|---|
| 27 | 50/50 | 10000 | 1.7 |
| 28 | 40/60 | 9000 | 1.6 |
| 29 | 40/60 | 11000 | 1.5 |
| 30 | 30/70 | 12000 | 1.5 |
| 31 | 45/55 | 10000 | 1.6 |
| 32 | 40/60 | 14000 | 1.7 |
| 33 | 50/50 | 12000 | 1.6 |
| 34 | 40/60 | 8500 | 1.6 |
| 35 | 35/65 | 9000 | 1.7 |
| 36 | 50/50 | 11000 | 1.6 |
| 37 | 20/20/60 | 8000 | 1.5 |
| 38 | 25/25/50 | 10000 | 1.8 |
| 39 | 25/30/25/20 | 9000 | 1.6 |
| 40 | 20/35/20/25 | 8500 | 1.6 |

Examples 1-A to 75-A and Comparative Examples 1-A' to 4-A' (ArF Immersion Exposure)

(1) Preparation and Application of Resist Composition

A silicon wafer was coated with an organic antireflection film forming composition ARC29SR (manufactured by Brewer Science Inc.) and was baked at 205° C. for 60 seconds so as to form an antireflection film having a film thickness of 98 nm. The antireflection film was coated with the resist compositions presented in Tables 6 to 8 and was baked at 100° C. (here, temperatures presented in Table 9 for Examples 60-A to 75-A) for 60 seconds, so as to form a resist film having a film thickness of 90 nm. The resist composition was obtained by preparing a solution having a concentration of solid content of 4 mass % and filtrating the solution with a polyethylene filter having a pore size of 0.05 μm. The resin (C) and the resin (C') were used in the contents presented in Tables 6 to 8 (expressed in mass % with respect to the total solid content of the composition).

(2) ArF Exposure and Development

Exposure was performed by using an ArF excimer laser immersion scanner (manufactured by ASML Netherlands B.V; XT1700i, NA 1.20, C-Quad, outer sigma 0.730, inner sigma 0.630, XY deflection) through a 6% half tone mask with a 1:1 line and space pattern having a line width of 75 nm. As the immersion liquid, ultrapure water was used. Thereafter, baking was performed at 120° C. (here, temperatures presented in Table 9 for Examples 60-A to 75-A) for 60 seconds, development was performed for 30 seconds with a tetramethylammonium hydroxide aqueous solution (2.38 mass %), and the resultant was rinsed with pure water and spin-dried so as to obtain a resist pattern.

(3) Evaluation of Resist Pattern

Scum, development defects, and receding contact angles (RCA) of the obtained resist pattern were evaluated with a scanning electron microscope (S-9220 manufactured by Hitachi, Ltd.). The results thereof are presented in Tables 6 to 8.

[Scum (Immersion Defect)]

The development residues (scum) in the resist pattern with a line width of 75 nm were observed with a scanning electron microscope (S-9220 manufactured by Hitachi, Ltd.). Scum was evaluated based on the following evaluation standard in a case where the scanning speed of the exposure was set to 550 mm/s and a case where the scanning speed was set to 700 mm/s.

A: No scum was observed.

B: Scum was observed in a line width near the critical resolving power.

C: Scum was observed in a line width wider than the critical resolution.

D: Scum was observed almost over the entire area.

[Development Defect]

The number of the development defects on the pattern (at a scanning speed of the exposure of 700 mm/s) formed as above on a silicon wafer (12-inch aperture) was measured with a detect inspection device KLA2360 (manufactured by KLA-Tencor Corporation). The measurement was performed in random mode with the pixel size of the defect inspection device set to 0.16 μm and the threshold set to 20. Development defects extracted from differences caused by overlaying comparison images by pixel units were detected and the number of development defects per unit area (number/$cm^2$) was calculated. One inch is 0.0254 m. A pattern having less than 0.5 development defects was evaluated as A, a pattern having 0.5 or more and less than 0.7 development defects was evaluated as B, a pattern having 0.7 or more and less than 1.0 development detects was evaluated as C, and a pattern having 1.0 or more development defects was evaluated as D. As the number of development defects is smaller, the performance is better.

[Receding Contact Angle (RCA)]

A silicon wafer (8-inch aperture) was coated with the prepared resist composition and was baked at 120° C. for 60 seconds so as to form a resist film having a film thickness of 120 nm. The receding contact angle of the water droplet on the resist film was measured by an expansion/contraction method of the contact angle determination device (manufactured by Kyowa Interface Science Co., Ltd.). The initial liquid droplet size of 35 μL was aspirated at a rate of 6 μL/second for 5 seconds, and a value at which a dynamic contact angle during aspiration became stable was taken as the receding contact angle. The measurement environment was 23° C. and the relative humidity was 45%. As the numerical value of the receding contact angle is greater, the followability of water to the high scanning speed is higher.

TABLE 6

| | Resist composition | | | | | | | Performance | | | |
|---|---|---|---|---|---|---|---|---|---|---|---|
| | Resin (A) (1 g) | Solvent (mass ratio) | Photoacid generator (mg) | Basic compound (mg) | Resin (C) (mass %) | Resin (C') (mass %) | Surfactant (mg) | Scum (550 mm/s) | Scum (700 mm/s) | Development defect | RCA (°) |
| Example 1-A | 1 | SL-1/SL-2 60/40 | PAG-1 100.0 | N-2 70 | P-110 4.0 | — | W-1 1 | A | A | A | 75 |
| Example 2-A | 2 | SL-2/SL-5 97/3 | PAG-3 100.0 | N-5/N-1 50/50 | P-54 2.0 | — | W-2 1 | A | A | A | 80 |
| Example 3-A | 3 | SL-1/SL-2 60/40 | PAG-1 100.0 | N-3 70 | P-13 4.0 | P'-2 2.0 | W-3 2 | A | A | A | 75 |
| Example 4-A | 4 | SL-2/SL-4 60/40 | PAG-5 100.0 | N-5 70 | P-93 4.0 | P'-1 2.0 | W-4 2 | A | A | A | 80 |
| Example 5-A | 5 | SL-1/SL-2 97/3 | PAG-8 100.0 | N-1/N-8 70/2 | P-96 3.0 | — | W-2 1 | A | A | A | 80 |
| Example 6-A | 6 | SL-2/SL-4 60/40 | PAG-1 125.0 | N-1 60 | P-109 2.0 | — | W-3 2 | A | A | B | 80 |
| Example 7-A | 7 | SL-2/SL-4 60/40 | PAG-7 100.0 | N-6 100 | P-25 3.0 | — | — | A | A | A | 80 |
| Example 8-A | 8 | SL-2/SL-4 60/40 | PAG-3 100.0 | N-4 70 | P-21 4.0 | — | W-2 1 | A | B | A | 75 |
| Example 9-A | 9 | SL-2/SL-4 60/40 | PAG-1 100.0 | N-3 70 | P-91 4.0 | — | W-3 2 | A | A | A | 80 |
| Example 10-A | 10 | SL-2/SL-4 60/40 | PAG-3 100.0 | N-5/N-1 30/30 | P-100 3.0 | — | W-4 2 | A | A | A | 80 |
| Example 11-A | 13 | SL-2/SL-5 90/10 | PAG-2 100.0 | N-3/N-8 35/35 | P-93 5.0 | P'-6 1.0 | — | A | A | A | 87 |
| Example 12-A | 11 | SL-2/SL-4 60/40 | PAG-8 100.0 | N-8/N-1 40/40 | P-83 4.0 | — | W-5 2 | A | A | A | 75 |
| Example 13-A | 12 | SL-1/SL-3 60/40 | PAG-5 100.0 | N-3 70 | P-98 4.0 | — | W-2 1 | A | A | A | 75 |
| Example 14-A | 13 | SL-2/SL-5 80/20 | PAG-2 100.0 | N-1/N-8 70/2 | P-47 4.0 | — | — | A | A | A | 85 |
| Example 15-A | 14 | SL-2/SL-4 60/40 | PAG-6 100.0 | N-8 70 | P-2 4.0 | — | W-6 2 | A | A | A | 85 |
| Example 16-A | 15 | SL-2/SL-4 60/40 | PAG-6 100.0 | N-1 60 | P-78 2.0 | — | — | A | A | A | 75 |
| Example 17-A | 16 | SL-2/SL-4/SL-5 60/37/3 | PAG-9 100.0 | N-1 60 | P-14 3.0 | — | W-6 3 | A | A | A | 75 |
| Example 18-A | 17 | SL-2/SL-4/SL-5 60/37/3 | PAG-8 100.0 | N-3 70 | P-115 4.0 | — | W-3 2 | A | A | A | 80 |
| Example 19-A | 18 | SL-2/SL-4 60/40 | PAG-3 100.0 | N-3 70 | P-52 4.0 | — | W-4 2 | A | A | B | 75 |
| Example 20-A | 19 | SL-2/SL-5 97/3 | PAG-11 100.0 | N-8/N-1 70/8 | P-81 4.0 | — | W-5 1 | A | A | A | 80 |
| Example 21-A | 20 | SL-2/SL-5 97/3 | PAG-3 100.0 | N-4/N-1 70/10 | P-50 4.0 | — | W-6 1 | A | A | A | 80 |
| Example 22-A | 13 | SL-2/SL-5 93/7 | PAG-2 100.0 | N-3/N-5 35/35 | P-93 3.0 | P'-6 2.0 | — | A | A | A | 86 |
| Example 23-A | 21 | SL-2/SL-4 60/40 | PAG-11 100.0 | N-6 100 | P-11 3.0 | — | W-3 1 | A | B | A | 75 |
| Example 24-A | 22 | SL-2/SL-4 60/40 | PAG-1 100.0 | N-6 100 | P-36 4.0 | — | W-4 2 | A | A | A | 75 |
| Example 25-A | 23 | SL-2/SL-4 60/40 | PAG-1 90.0 | N-8/N-1 70/20 | P-66 4.0 | — | W-3 2 | A | A | A | 80 |
| Example 26-A | 24 | SL-2/SL-4 60/40 | PAG-9 100.0 | N-7 100 | P-1 4.0 | — | W-4 1 | A | A | A | 80 |
| Example 27-A | 25 | SL-2/SL-4/SL-5 60/37/3 | PAG-10 100.0 | N-5/N-1 60/60 | P-92 3.0 | — | W-5 1 | A | A | B | 80 |
| Example 28-A | 26 | SL-2/SL-4 60/40 | PAG-10 100.0 | N-5/N-1 50/50 | P-85 3.0 | — | W-2 1 | A | B | A | 75 |
| Example 29-A | 1 | SL-2/SL-4/SL-6 40/59/1 | PAG-12 100.0 | N-5/N-1 70/5 | P-84 3.0 | — | W-3 2 | A | A | A | 75 |
| Example 30-A | 1 | SL-2/SL-4 60/40 | PAG-4 100.0 | N-3 70 | P-77 2.0 | — | W-6 1 | A | A | A | 80 |
| Example 31-A | 5 | SL-2/SL-4/SL-5 60/37/3 | PAG-1 100.0 | N-8/N-1 70 | P-30 4.0 | — | — | A | A | A | 85 |
| Example 32-A | 5 | SL-2/SL-4 60/40 | PAG-3 110.0 | N-5/N-7 70/5 | P-62 4.0 | — | W-6 2 | A | A | A | 75 |
| Example 33-A | 13 | SL-2/SL-4/SL-5 60/37/3 | PAG-8 100.0 | N-1/N-8 70/2 | P-28 2.0 | P'-3 2.0 | — | A | A | A | 85 |
| Example 34-A | 7 | SL-2/SL-4 60/40 | PAG-3 100.0 | N-5 70 | P-19 3.0 | — | W-1 1 | A | A | A | 80 |
| Example 35-A | 16 | SL-2/SL-4 60/40 | PAG-5 100.0 | N-5 70 | P-117 4.0 | — | W-3 1 | A | A | A | 80 |
| Example 36-A | 22 | SL-2/SL-5 97/3 | PAG-10 100.0 | N-8/N-1 50/50 | P-92 4.0 | — | W-5 2 | A | A | B | 80 |
| Example 37-A | 15 | SL-2/SL-4/SL-5 60/37/3 | PAG-11 100.0 | N-8/N-1 35/35 | P-23 2.0 | — | W-6 1 | A | A | A | 75 |

TABLE 6-continued

| | Resist composition | | | | | | | Performance | | | |
|---|---|---|---|---|---|---|---|---|---|---|---|
| | Resin (A) (1 g) | Solvent (mass ratio) | Photoacid generator (mg) | Basic compound (mg) | Resin (C) (mass %) | Resin (C') (mass %) | Surfactant (mg) | Scum (550 mm/s) | Scum (700 mm/s) | Development defect | RCA (°) |
| Example 38-A | 8 | SL-2/SL-4 60/40 | PAG-8 100.0 | N-3 70 | P-12 2.0 | — | W-1 1 | A | A | A | 75 |
| Comparative Example 1-A' | 1 | SL-2/SL-5 97/3 | PAG-1 100.0 | N-5/N-1 40/40 | — | P'-3 2.0 | W-6 1 | B | C | A | 65 |
| Comparative Example 2-A' | 5 | SL-2/SL-4 60/40 | PAG-3 100.0 | N-3 70 | — | P'-4 4.0 | — | B | C | C | 70 |
| Comparative Example 3-A' | 16 | SL-1/SL-2 60/40 | PAG-6 100.0 | N-3 70 | — | P'-2 2.0 | W-3 2 | D | D | A | 55 |
| Comparative Example 4-A' | 18 | SL-2/SL-4 60/40 | PAG-8 100.0 | N-6 100 | — | P'-5 3.0 | — | A | A | D | 80 |

TABLE 7

| | Resist composition | | | | | | | Performance | | | |
|---|---|---|---|---|---|---|---|---|---|---|---|
| | Resin (A) (1 g) | Solvent (mass ratio) | Photoacid generator (mg) | Basic compound (mg) | Resin (C) (mass %) | Resin (C') (mass %) | Surfactant (mg) | Scum (550 mm/s) | Scum (700 mm/s) | Development defect | RCA (°) |
| Example 39-A | 3 | SL-1/SL-2 60/40 | PAG-3 100.0 | N-3 70 | P-153 4.0 | — | W-1 1 | A | A | A | 80 |
| Example 40-A | 6 | SL-2/SL-5 97/3 | PAG-1 100.0 | N-5/N-1 30/30 | P-148 2.0 | P'-1 2.0 | W-2 1 | A | A | A | 80 |
| Example 41-A | 3 | SL-1/SL-2 60/40 | PAG-3 100.0 | N-8/N-1 50/30 | P-120 4.0 | P'-2 2.0 | W-3 2 | A | A | A | 80 |
| Example 42-A | 1 | SL-2/SL-5 90/10 | PAG-8 100.0 | N-5 70 | P-133 4.0 | P'-1 2.0 | W-4 2 | A | A | A | 85 |
| Example 43-A | 9 | SL-1/SL-2 97/3 | PAG-6 100.0 | N-1/N-8 70/2 | P-131 3.0 | — | W-2 1 | A | A | A | 80 |
| Example 44-A | 12 | SL-2/SL-4 60/40 | PAG-6 100.0 | N-1 60 | P-150 2.0 | — | W-3 2 | A | A | B | 80 |
| Example 45-A | 5 | SL-2/SL-4 60/40 | PAG-9 100.0 | N-1/N-8 70/2 | P-125 3.0 | — | — | A | A | A | 85 |
| Example 46-A | 16 | SL-2/SL-4 60/40 | PAG-8 100.0 | N-4 70 | P-127 4.0 | P'-1 2.0 | W-2 1 | A | A | A | 80 |
| Example 47-A | 17 | SL-2/SL-4 60/40 | PAG-11 100.0 | N-3 70 | P-156 5.0 | — | W-3 2 | A | A | A | 80 |
| Example 48-A | 9 | SL-2/SL-5 90/10 | PAG-3 100.0 | N-5/N-1 30/30 | P-129 3.0 | — | W-4 2 | A | A | A | 80 |
| Example 49-A | 2 | SL-2/SL-4 60/40 | PAG-7 100.0 | N-8 60 | P-29 4.0 | — | W-5 2 | A | A | A | 75 |
| Example 50-A | 13 | SL-1/SL-3 60/40 | PAG-5 100.0 | N-3 70 | P-135 4.0 | P'-1 2.0 | W-2 1 | A | A | A | 85 |
| Example 51-A | 1 | SL-2/SL-5 90/10 | PAG-2 100.0 | N-1/N-8 70/2 | P-124 5.0 | P'-1 1.0 | — | A | A | A | 85 |
| Example 52-A | 22 | SL-2/SL-4 60/40 | PAG-6 100.0 | N-8 70 | P-128 4.0 | — | W-6 2 | A | A | A | 85 |
| Example 53-A | 23 | SL-2/SL-4 60/40 | PAG-2 100.0 | N-1 60 | P-155 2.0 | — | — | A | A | A | 75 |
| Example 54-A | 11 | SL-2/SL-4/SL-5 60/37/3 | PAG-9 100.0 | N-1 60 | P-153 3.0 | — | W-6 3 | A | A | A | 75 |
| Example 55-A | 7 | SL-2/SL-4/SL-5 60/37/3 | PAG-8 100.0 | N-3 70 | P-141 4.0 | — | W-3 2 | A | A | B | 80 |
| Example 56-A | 7 | SL-2/SL-5 90/10 | PAG-12 100.0 | N-1 70 | P-143 4.0 | P'-1 2.0 | W-4 2 | A | A | A | 75 |
| Example 57-A | 20 | SL-2/SL-5 97/3 | PAG-11 100.0 | N-8/N-1 70/8 | P-139 4.0 | P'-1 2.0 | W-5 1 | A | A | A | 80 |
| Example 58-A | 16 | SL-2/SL-5 97/3 | PAG-3 100.0 | N-4/N-1 70/10 | P-136 4.0 | — | W-6 1 | A | A | A | 80 |
| Example 59-A | 17 | SL-2/SL-4 60/40 | PAG-5 100.0 | N-1/N-8 70/2 | P-159 4.0 | — | W-3 2 | A | B | A | 80 |

TABLE 8

| | Resist composition | | | | | | | Performance | | | |
|---|---|---|---|---|---|---|---|---|---|---|---|
| | Resin (A) (1 g) | Solvent (mass ratio) | Photoacid generator (mg) | Basic compound (mg) | Resin (C) (mass %) | Resin (C') (mass %) | Surfactant (mg) | Scum (550 mm/s) | Scum (700 mm/s) | Development defect | RCA (°) |
| Example 60-A | 39 | SL-2/SL-5 90/10 | PAG-2 100.0 | N-13 60 | P-144 2.5 | — | W-6 1 | A | A | A | 75 |
| Example 61-A | 27 | SL-2/SL-4 60/40 | PAG-4/PAG-13 50.0/50.0 | N-5 70 | P-86 5.0 | P'-6 2.0 | — | A | A | A | 80 |
| Example 62-A | 33 | SL-2/SL-5 97/3 | PAG-15 100.0 | N-7 50 | P-47 4.0 | — | — | A | A | A | 80 |
| Example 63-A | 37 | SL-2/SL-4/SL-5 60/37/3 | PAG-3/PAG-15 50.0/50.0 | N-11 65 | P-16 3.5 | — | W-2 1 | A | A | A | 80 |
| Example 64-A | 32 | SL-1/SL-2 70/30 | PAG-17 100.0 | N-10 50 | P-10 3.0 | P'-1 2.0 | — | A | A | A | 75 |
| Example 65-A | 40 | SL-2/SL-5 95/5 | PAG-1 100.0 | N-14 55 | P-75 4.0 | — | — | A | A | A | 80 |
| Example 66-A | 35 | SL-1/SL-2 97/3 | PAG-12 100.0 | N-1/N-8 60/10 | P-159 5.0 | — | — | A | A | A | 80 |
| Example 67-A | 34 | SL-2/SL-5 90/10 | PAG-8 100.0 | N-13 50 | P-79 5.0 | P'-6 1.0 | W-3 1 | A | A | A | 80 |
| Example 68-A | 34/36 (0.5 g/0.5 g) | SL-2/SL-5 90/10 | PAG-18 100.0 | N-4 60 | P-93 3.0 | — | W-5 2 | A | A | A | 75 |
| Example 69-A | 30 | SL-2/SL-4/SL-5 65/30/5 | PAG-14 100.0 | N-9 70 | P-30 4.0 | — | — | A | A | A | 80 |
| Example 70-A | 35 | SL-2/SL-4 80/20 | PAG-16 100.0 | N-3 60 | P-5 4.5 | — | W-4 2 | A | A | A | 80 |
| Example 71-A | 38 | SL-2/SL-5 90/10 | PAG-2/PAG-15 50.0/50.0 | N-12/N-6 40/20 | P-63 5.0 | — | W-1 1 | A | A | A | 85 |
| Example 72-A | 28 | SL-2/SL-4/SL-5 80/15/5 | PAG-9 100.0 | N-6 70 | P-159 5.0 | P'-2 1.0 | — | A | A | A | 80 |
| Example 73-A | 31 | SL-2/SL-5 90/10 | PAG-5 100.0 | N-8 70 | P-80 2.0 | — | — | A | A | A | 75 |
| Example 74-A | 30 | SL-1/SL-2 97/3 | PAG-4/PAG-9 50.0/50.0 | N-1 60 | P-143 40 | — | — | A | A | A | 80 |
| Example 75-A | 29 | SL-2/SL-4 60/40 | PAG-3 100.0 | N-12 50 | P-124 5.0 | P'-6 3.0 | — | A | A | A | 80 |

TABLE 9

| | Baking condition | |
|---|---|---|
| | Baking temperature during coating | Baking temperature after exposure |
| Example 60-A | 105 | 90 |
| Example 61-A | 100 | 95 |
| Example 62-A | 105 | 100 |
| Example 63-A | 110 | 90 |
| Example 64-A | 90 | 85 |
| Example 65-A | 95 | 90 |
| Example 66-A | 100 | 95 |
| Example 67-A | 130 | 100 |
| Example 68-A | 105 | 105 |
| Example 69-A | 100 | 85 |
| Example 70-A | 120 | 95 |
| Example 71-A | 130 | 95 |
| Example 72-A | 80 | 100 |
| Example 73-A | 85 | 80 |
| Example 74-A | 100 | 90 |
| Example 75-A | 100 | 95 |

The photoacid generators, the acid diffusion control agents (basic compounds and the like), the surfactants, and the solvents in Tables 6 to 8 are as follows.

[Photoacid Generator]

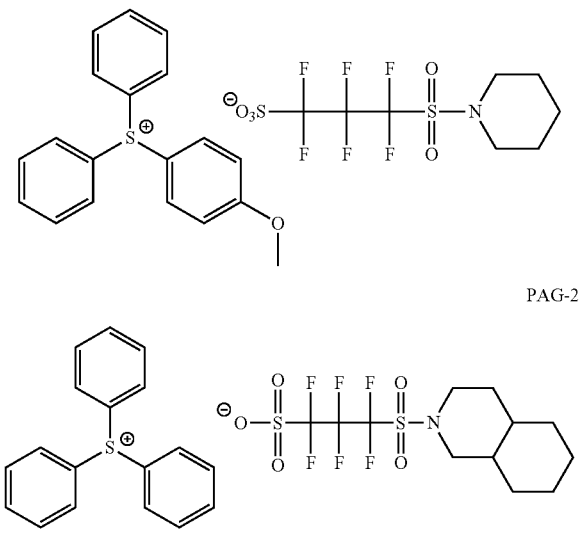

PAG-1

PAG-2

PAG-3
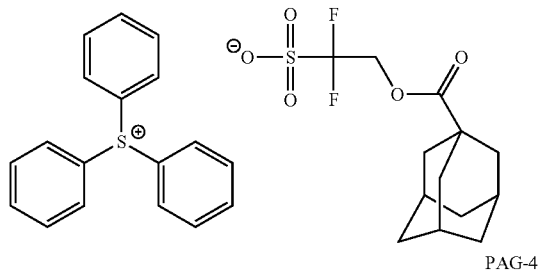
PAG-4
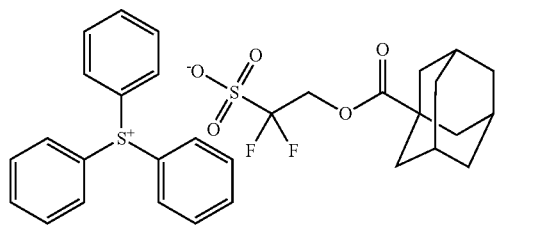
PAG-5
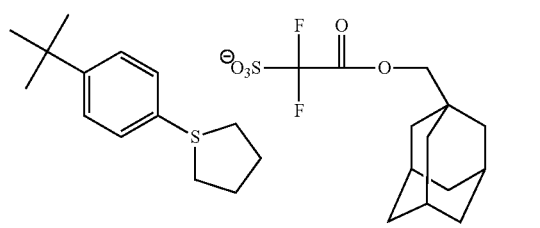
PAG-6
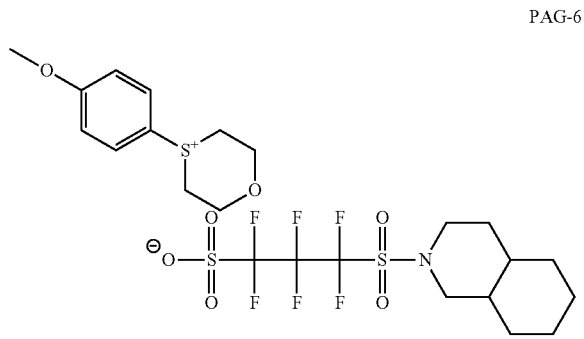
PAG-7
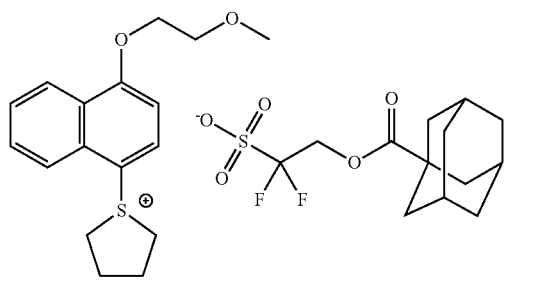
PAG-8
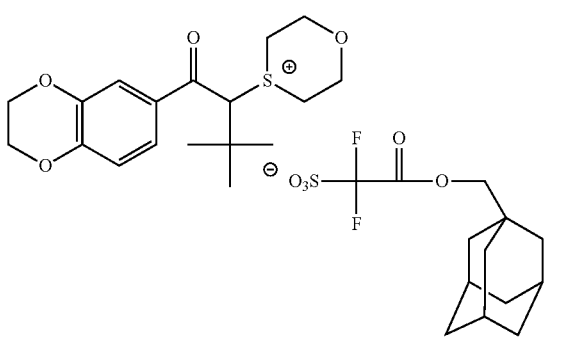
PAG-9
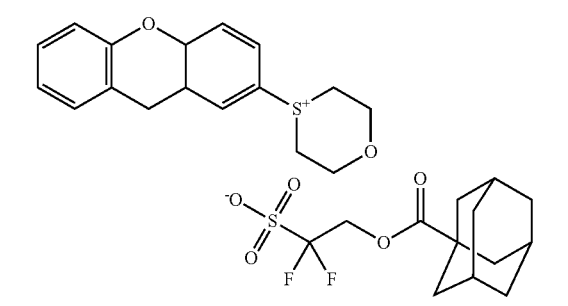
PAG-10
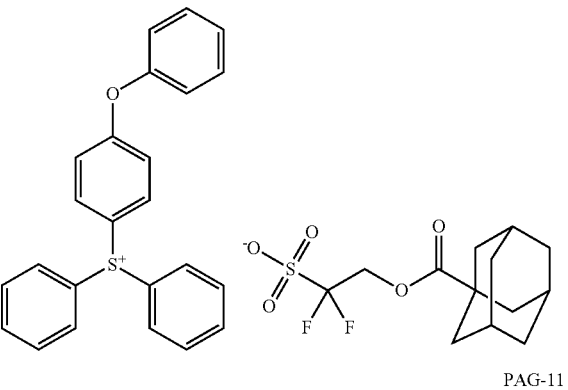
PAG-11
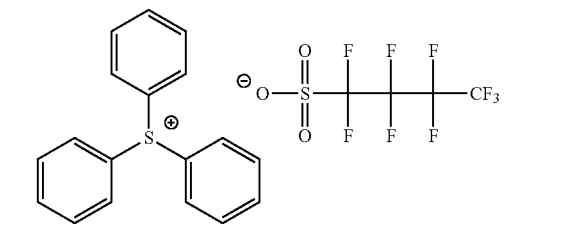
PAG-12
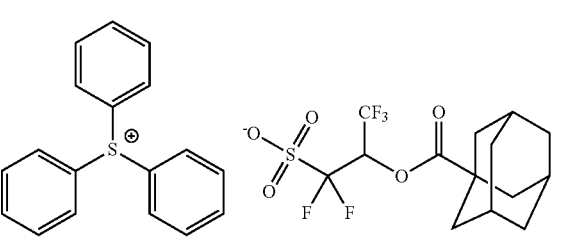

PAG-13
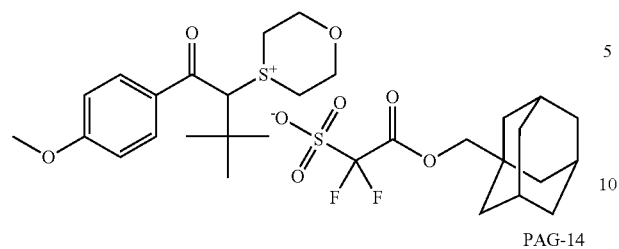
PAG-14
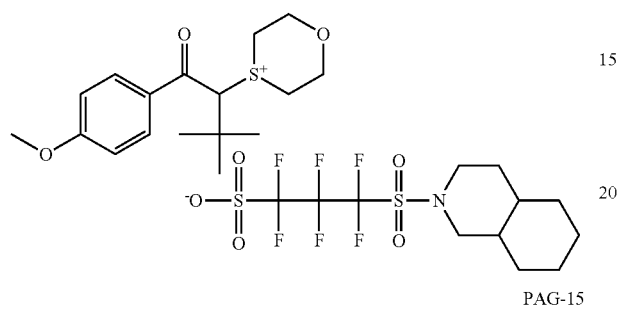
PAG-15
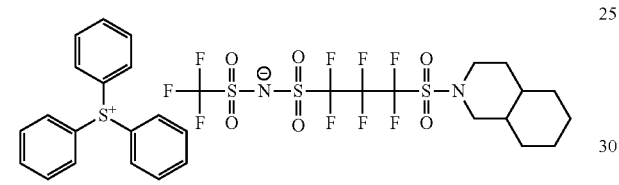
PAG-16
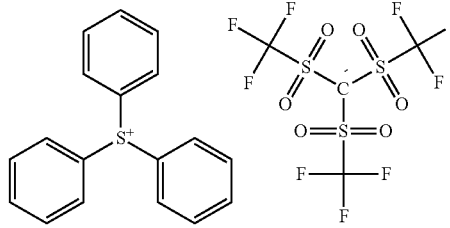
PAG-17
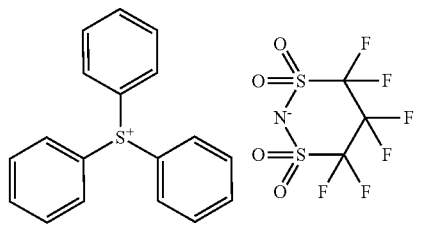
PAG-18
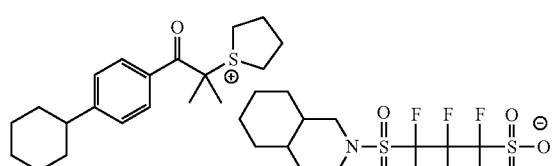
[Acid Diffusion Control Agent (Basic Compound and the Like)]
N-1
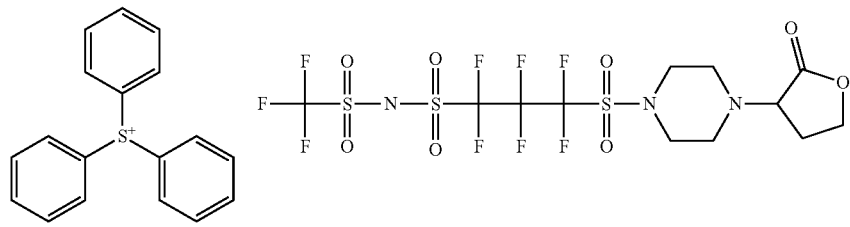
N-2
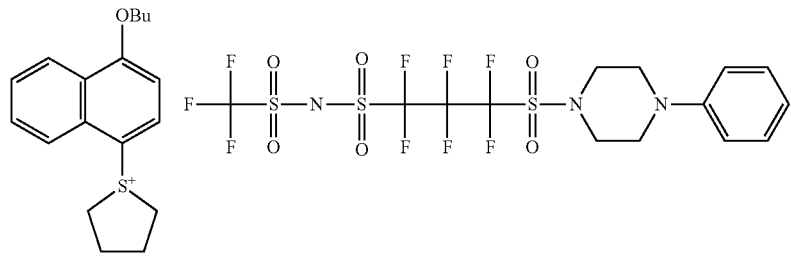
N-3
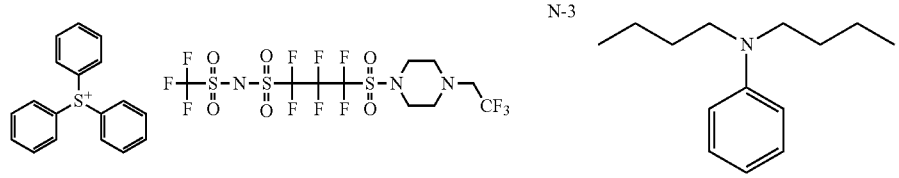
N-4
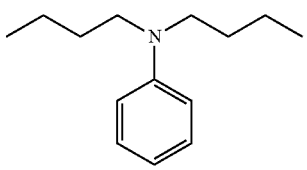

-continued
N-5
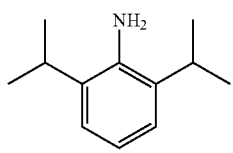
N-6
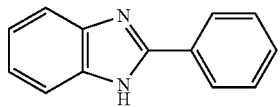
N-7
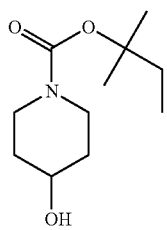
N-8
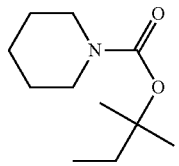
N-9
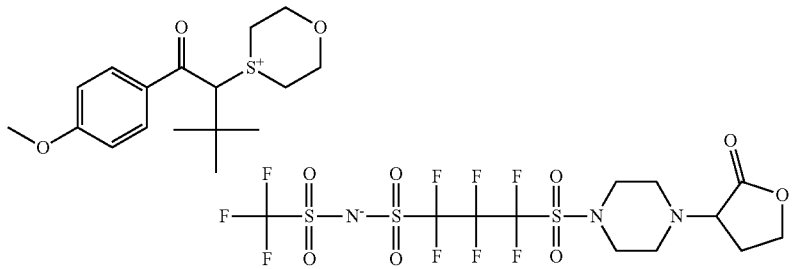
N-10
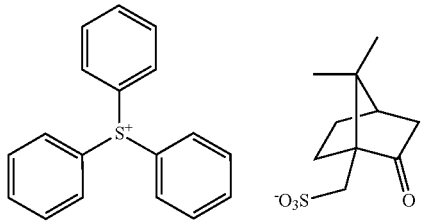
N-11
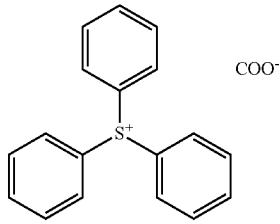
N-12
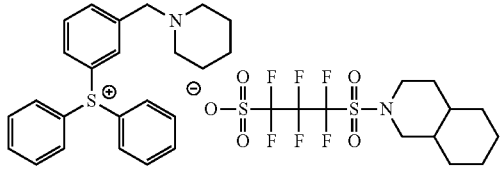
N-13
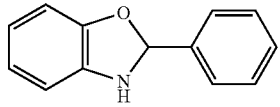
N-14
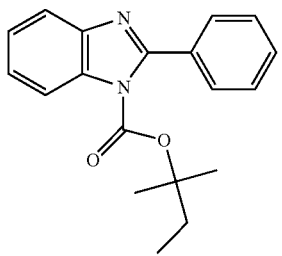

[Surfactant]

W-1: MEGAFACE F176 (manufactured by DIC Corporation, fluorine-based)

W-2: MEGAFACE R08 (manufactured by DIC Corporation, fluorine and silicon-based)

W-3: Polysiloxane polymer KP-341 (manufactured by Shin-Etsu Chemical Co., Ltd., silicon-based)

W-4: Troysol 5-366 manufactured by Troy Corporation)

W-5: PF656 (manufactured by OMNOVA Solutions Inc., fluorine-based)

W-6: PF6320 (manufactured by OMNOVA Solutions Inc., fluorine-based)

[Solvent]

SL-1: Cyclohexanone

SL-2: Propylene glycol monomethyl ether acetate (PGMEA: 1-methoxy-2-acetoxypropane)

SL-3: Ethyl lactate

SL-4: Propylene glycol monomethyl ether (PGME: 1-methoxy-2-propanol)

SL-5: γ-Butyrolactone

SL-6: Propylene carbonate

From the results of Tables 6 to 8, it is understood that compared with the comparative examples using the composition not containing the resin (C), in the examples using the composition containing the resin (C), followability of the immersion liquid to the exposure device was high and also excellent performance evaluation on scum (immersion defects) and development defects were exhibited. The followability of the immersion liquid in the examples in using the composition containing the resin (C) was satisfactory not only in a case where a scanning speed of the exposure was high speed (550 mm/s) but also in a case where a scanning speed of the exposure was ultrahigh speed (700 mm/s).

Examples 1-B to 6-B and Comparative Examples 1-B' to 2-B' (EB Exposure)

(1) Preparation and Application of Resist Composition

As a support, a 6-inch silicon wafer (subjected to a shielding film treatment used for a normal photomask blank) on which Cr oxide was vapor-deposited was prepared. Components presented in Table 10 were dissolved in a solvent and were filtrated through a polytetrafluoroethylene filter having a pore size of 0.04 μm so as to prepare a resist solution. A resist solution was applied on the 6-inch wafer with a spin coater Mark8 manufactured by Tokyo Electron Limited and dried on a hot plate at 110° C. for 90 seconds so as to obtain a resist film having a film thickness of 50 nm. That is, a resist-coated mask blank was obtained.

One inch is 25.4 mm.

(2) EB Exposure and Development

Pattern irradiation was performed on this resist film by using an electron beam drawing device (manufactured by Elionix Inc.; ELS-7500, acceleration voltage: 50 keV). The resist film after irradiation was heated on a hot plate at 110° C. for 90 seconds and immersed in a 2.38 mass % tetramethyl ammonium hydroxide (TMAH) aqueous solution for 60 seconds. Subsequently, the resist film was rinsed with water for 30 seconds and dried so as to obtain a resist pattern.

(3) Evaluation of Resist Pattern

Scum of the obtained resist pattern was evaluated using a scanning electron microscope (S-9220 manufactured by Hitachi, Ltd.). The results are presented in Table 10 below.

[Scum]

The exposure amount in a case where the 1:1 line and space resist pattern with a line width of 50 nm was resolved was set as sensitivity, and in the evaluation of the resolving power of the isolated space (line:space=100:1) at the above sensitivity, the scum was evaluated as follows.

A: No scum was observed.

B: Scum was observed in a line width near the critical resolving power.

C: Scum was observed in a line width wider than the critical resolution.

TABLE 10

| | Resist composition | | | | | | | | |
|---|---|---|---|---|---|---|---|---|---|
| | Resin (E) (10 g) | Solvent (mass ratio) | Photoacid generator (g) | Basic compound (mg) | Resin (C) (mg) | Resin (C') (mg) | Compound (F) (g) | Surfactant (mg) | Performance Scum |
| Example 1-B | E-1 | SL-2/SL-4 80/20 | PAG-2 2.6 | N-1/N-15 70/2 | P-14 120.0 | — | F-1 2.0 | W-6 50 | A |
| Example 2-B | E-2 | SL-2/SL-4 80/20 | PAG-6 1.8 | N-16 70 | P-2 150.0 | — | F-2 1.8 | — | A |
| Example 3-B | E-3 | SL-2-SL-4 80/20 | PAG-12 2.3 | N-17 60 | P-78 300.0 | — | F-3 3.1 | W-6 50 | A |
| Example 4-B | E-1 | SL-2/SL-4 80/20 | PAG-9 2.3 | N-15 60 | P-47 250.0 | — | F-1 2.5 | W-6 50 | A |
| Example 5-B | E-1 | SL-2/SL-4 80/20 | PAG-8 2.0 | N-18 70 | P-30 120.0 | — | F-2 2.2 | W-3 40 | A |
| Example 6-B | E-4 | SL-2/SL-4 80/20 | PAG-3 2.5 | N-15 70 | P-126 120.0 | — | F-3 1.7 | W-6 50 | A |
| Comparative Example 1-B' | E-2 | SL-2/SL-4 80/20 | PAG-11 1.9 | N-8/N-16 70/8 | — | P'-2 200.0 | F-1 1.9 | W-5 50 | B |
| Comparative Example 2-B' | E-3 | SL-2/SL-4 80/20 | PAG-12 3.0 | N-18/N-15 70/10 | — | P'-5 120.0 | F-3 2.0 | W-6 50 | C |

The resin (E), the compound (F), and the acid diffusion control agent (basic compound or the like) in Table 10 are as described above. Compositional ratios of the respective repeating units of the resins are indicated by molar ratios.
[Resin (E)]
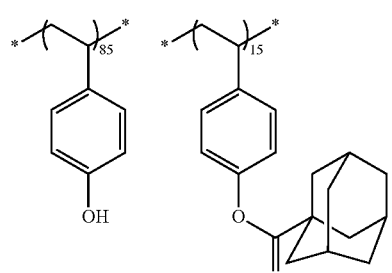
(E-1)
Mw: 4600
Mw/Mn: 1.2
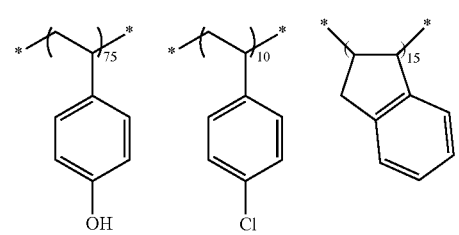
(E-2)
Mw: 7200
Mw/Mn: 1.5
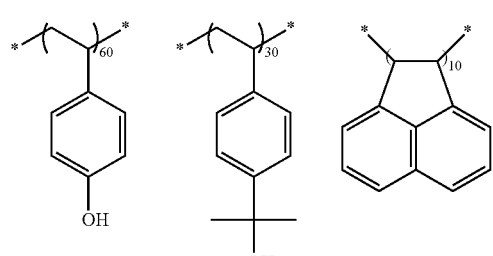
(E-3)
Mw: 3300
Mw/Mn: 1.6
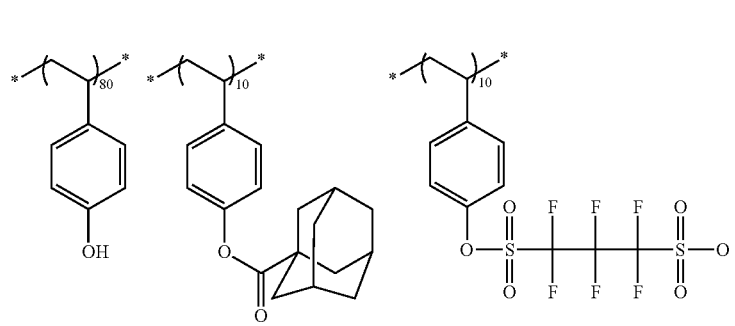
(E-4)
Mw: 4600
Mw/Mn: 1.2

[Compound (F)]

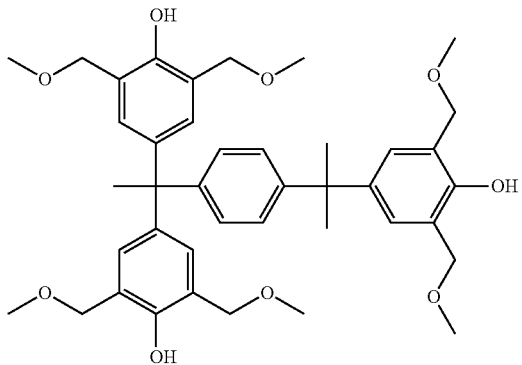

(F-1)

(F-2)

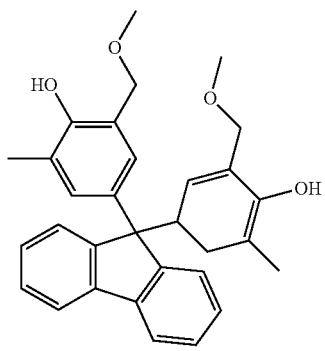

(F-3)

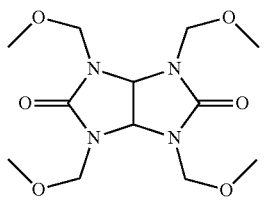

[Acid Diffusion Control Agent (Basic Compound or the Like)]

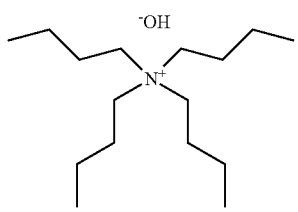

(N-15)

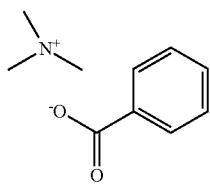

(N-16)

-continued

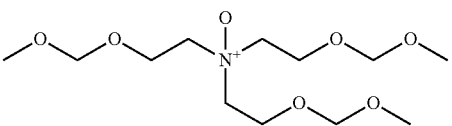

(N-17)

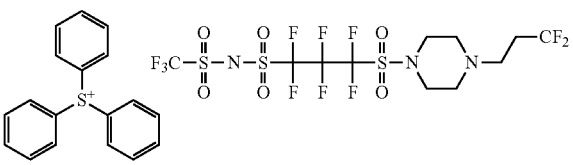

(N-18)

As shown in Table 10, compared with the comparative examples using the composition not containing the resin (C), in Examples using the composition containing the resin (C), the scum was able to be reduced.

Examples 1-C to 5-C and Comparative Examples 1-C' to 2-C' (EUV Exposure)

(1) Preparation and Application of Resist Composition

A silicon wafer subjected to a hexamethyl disilazane (HMDS) treatment was coated with each of the obtained resist compositions and baked at 120° C. for 60 seconds so as to obtain a resist film having a film thickness of 50 nm.

(2) EUV Exposure and Development

Pattern irradiation was performed on this resist film with an EUV exposure device (manufactured by ASML Netherlands B.V., NXE3300, lens numerical aperture NA 0.33, Dipole illumination, σ=0.902/0.671). The resist film after irradiation was heated on a hot plate at 100° C. for 60 seconds and immersed in a 2.38 mass % tetramethyl ammonium hydroxide (TMAH) aqueous solution for 60 seconds. The resist film was rinsed with water for 30 seconds and dried so as to obtain a resist pattern having a line width of 20 nm.

(3) Evaluation of Resist Pattern

Scum of the obtained resist pattern was evaluated with a scanning electron microscope (CG-4100 manufactured by Hitachi, Ltd.). The results are presented in Table 11 below.

[Scum]

An exposure amount in a case where a 1:1 line and space resist pattern with a line width of 20 nm was resolved is set as a sensitivity, and with respect to the resolving power evaluation of the line (line:space=1:1) at the above sensitivity, the scum was evaluated as follows.

A: No scum was observed.

B: Scum was observed in a line width near the critical resolving power.

C: Scum was observed in a line width wider than the critical resolution.

TABLE 11

| | Resin (E) (10 g) | Solvent (mass ratio) | Photoacid generator (g) | Basic compound (mg) | Resin (C) (mass %) | Resin (C') (mass %) | Surfactant (mg) | Performance Scum |
|---|---|---|---|---|---|---|---|---|
| Example 1-C | E-5 | SL-2/SL-4 70/30 | PAG-4 1.4 | N-19 60 | P-124 1.0 | — | W-3 50 | A |
| Example 2-C | E-6 | SL-2/SL-3 70/30 | PAG-4 2.0 | N-19 70 | P-124 3.2 | — | — | A |
| Example 3-C | E-7 | SL-2/SL-5 97/3 | PAG-4 1.8 | N-19 70 | P-124 2.4 | — | W-6 50 | A |
| Example 4-C | E-8 | SL-2/SL-5 90/10 | PAG-4 2.4 | N-19 60 | P-124 5.0 | — | — | A |
| Example 5-C | E-9 | SL-2/SL-3 70/30 | PAG-4 3.0 | N-19 70 | P-124 4.8 | P'-6 1.0 | — | A |
| Comparative Example 1-C' | E-5 | SL-2/SL-4 70/30 | PAG-4 2.5 | N-19 60 | — | P'-2 2.0 | W-5 50 | B |
| Comparative Example 2-C' | E-6 | SL-2/SL-5 90/10 | PAG-4 1.6 | N-19 60 | — | P'-5 1.2 | — | C |

The resin (E) and the basic compounds in Table 11 were as follows. The compositional ratio of each repeating unit of the following resins is indicated by a molar ratio.

[Resin (E)]

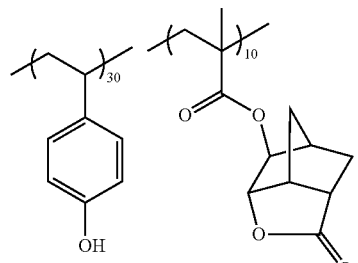

(E-5)

Mw: 5500
Mw/Mn: 1.5

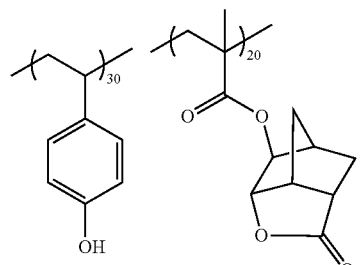

(E-6)

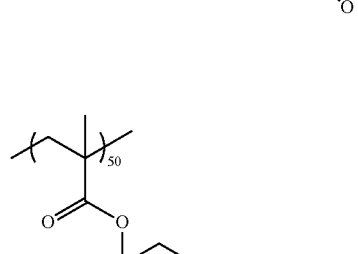

Mw: 6000
Mw/Mn: 1.6

-continued

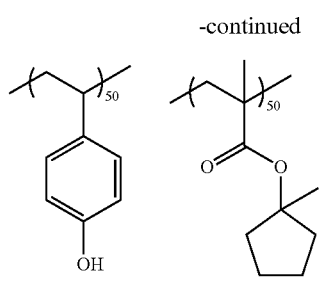

(E-7)

Mw: 6500
Mw/Mn: 1.4

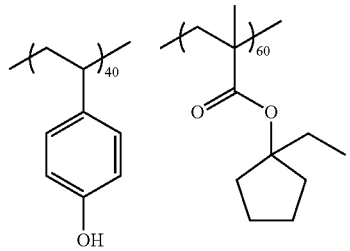

(E-8)

Mw: 5000
Mw/Mn: 1.6

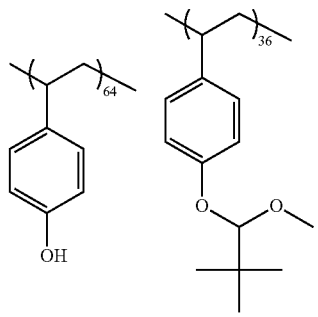

(E-9)

Mw: 4500
Mw/Mn: 1.4

[Basic Compound]

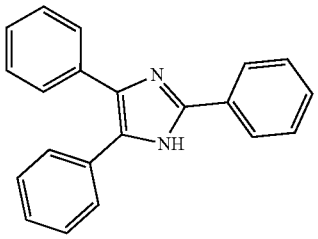

N-19

As can be seen from Table 11, compared with the comparative example using the composition not containing the resin (C), in the examples using the composition containing the resin (C), the scum was able to be reduced.

What is claimed is:

1. An actinic ray-sensitive or radiation-sensitive resin composition comprising: a resin (C) having a repeating unit represented by Formula (1),

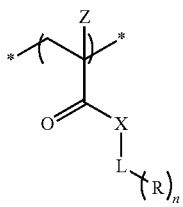

(1)

in Formula (1), Z represents a halogen atom, a group represented by $R_{11}OCH_2$—, or a group represented by $R_{12}OC(=O)CH_2$—, $R_{11}$ and $R_{12}$ each independently represents a monovalent substituent, X represents an oxygen atom or a sulfur atom, L represents a (n+1)-valent linking group, R represents a group having a group that is decomposed due to the action of an alkali developer to increase solubility in an alkali developer, n represents an integer of 1 or more, and when n is 2 or more, a plurality of R's may be identical to or different from each other, wherein R is represented by Formula (A),

—Y-EWG (A)

in Formula (A), Y represents a carboxylic acid ester group: —COO— or —OCO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—, EWG represents an electron withdrawing group represented by Formula (EW),

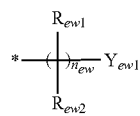

(EW)

in Formula (EW), * represents a bonding hand directly connected to the group Y in Formula (A), $n_{ew}$ is the number of repetitions of a linking group represented by $C(R_{ew1})(R_{ew2})$ and represents an integer of 0 or 1, and when $n_{ew}$ is 0, $n_{ew}$ represents a single bond, $Y_{ew1}$ represents a halogen atom, a cyano group, a nitro group, a halo(cyclo)alkyl group represented by —$C(R_{f1})(R_{f2})$—$R_{f3}$, a haloaryl group, a sulfinyl group, or a combination thereof, $R_{ew1}$ and $R_{ew2}$ each independently represents a substituent, $R_{f1}$ represents a halogen atom, a perhaloalkyl group, a perhalocycloalkyl group, or a perhaloaryl group, $R_{f2}$ and $R_{f3}$ each independently represents a hydrogen atom, a halogen atom, or an organic group, and when $R_{f2}$ and $R_{f3}$ each independently represents an organic group, $R_{f2}$ and $R_{f3}$ may be linked to each other to form a ring, and the content of the resin (C) is 0.01 to 10 mass % with respect to the total solids content of the actinic ray-sensitive or radiation-sensitive resin composition.

2. The actinic ray-sensitive or radiation-sensitive resin composition according to claim 1, wherein in the Formula (1), L represents a linear aliphatic group or an aromatic group.

3. The actinic ray-sensitive or radiation-sensitive resin composition according to claim 1, wherein the repeating unit represented by Formula (1) is a repeating unit represented by Formula (2) or (3),

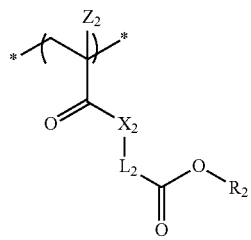

(2)

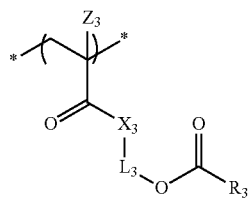

(3)

in Formula (2), $R_2$ represents an electron withdrawing group, $L_2$ represents a divalent linking group, $X_2$ represents an oxygen atom or a sulfur atom, and $Z_2$ represents a halogen atom, in Formula (3), $R_3$ represents an electron withdrawing group, $L_3$ represents a divalent linking group, $X_3$ represents an oxygen atom or a sulfur atom, and $Z_3$ represents a halogen atom.

4. The actinic ray-sensitive or radiation-sensitive resin composition according to claim 1, wherein the repeating unit represented by Formula (1) is a repeating unit represented by Formula (4),

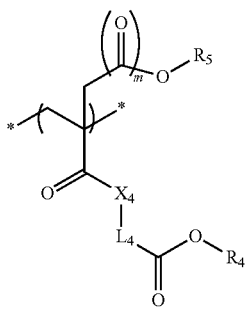

(4)

in Formula (4), R$_4$ represents an electron withdrawing group, R$_5$ represents a hydrogen atom, an alkyl group, or an aryl group, L$_4$ represents a divalent linking group, X$_4$ represents an oxygen atom or a sulfur atom, and m represents 0 or 1.

5. The actinic ray-sensitive or radiation-sensitive resin composition according to claim 1, wherein the repeating unit represented by Formula (1) is a repeating unit represented by Formula (5),

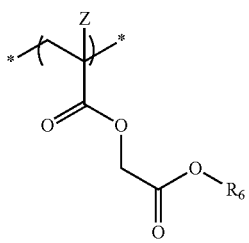

(5)

in Formula (5), Z represents a halogen atom, a group represented by R$_{11}$OCH$_2$—, or a group represented by R$_{12}$OC(=O)CH$_2$—, Ru and Rig each independently represents a monovalent substituent, and R$_6$ represents an electron withdrawing group.

6. The actinic ray-sensitive or radiation-sensitive resin composition according to claim 1, wherein, when an actinic ray-sensitive or radiation-sensitive film is formed, a receding contact angle of water on the actinic ray-sensitive or radiation-sensitive film is 75° or more.

7. An actinic ray-sensitive or radiation-sensitive film formed of the actinic ray-sensitive or radiation-sensitive resin composition according to claim 1.

8. A pattern forming method comprising:
(i) forming an actinic ray-sensitive or radiation-sensitive film with the actinic ray-sensitive or radiation-sensitive resin composition according to claim 1;
(ii) irradiating the actinic ray-sensitive or radiation-sensitive film with actinic rays or radiation; and
(iii) developing the actinic ray-sensitive or radiation-sensitive film irradiated with actinic ray or radiation with a developer.

9. The pattern forming method according to claim 8, wherein the developer is an alkali developer.

10. A method of manufacturing an electronic device, comprising: the pattern forming method according to claim 8.

11. The pattern forming method according to claim 8, wherein (ii) irradiating the actinic ray-sensitive or radiation-sensitive film includes an EUV exposure.

12. The actinic ray-sensitive or radiation-sensitive resin composition according to claim 1, further comprising a resin (A) being decomposed due to an action of an acid and of which solubility increases in an alkali developer, and
wherein the resin (A) includes a repeating unit (a) having an aromatic hydrocarbon group.

13. A compound represented by Formula (1M),

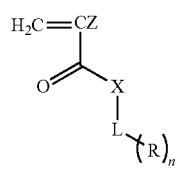

(1M)

in Formula (1M), Z represents a halogen atom, a group represented by R$_{11}$OCH$_2$—, or a group represented by R$_{12}$OC(=O)CH$_2$—, R$_{11}$ and R$_{12}$ each independently represents a monovalent substituent, X represents an oxygen atom or a sulfur atom, L represents a (n+1)-valent linking group, R represents a group having a group that is decomposed due to the action of an alkali developer to increase solubility in an alkali developer, n represents an integer of 1 or more, and when n is 2 or more, a plurality of R's may be identical to or different from each other,
wherein R is represented by Formula (A),

—Y-EWG (A)

in Formula (A), Y represents a carboxylic acid ester group: —COO— or —OCO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—, EWG represents an electron withdrawing group represented by Formula (EW),

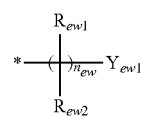

(EW)

in Formula (EW), * represents a bonding site directly connected to the group Y in Formula (A),
n$_{ew}$ is the number of repetitions of a linking group represented by C(R$_{ew1}$)(R$_{ew2}$) and represents an integer of 0 or 1, and when n$_{ew}$ is 0, n$_{ew}$ represents a single bond,
Y$_{ew1}$ represents a halogen atom, a cyano group, a nitro group, a halo(cyclo)alkyl group represented by —C(R$_{f1}$)(R$_{f2}$)—R$_{f3}$, a haloaryl group, a sulfinyl group, or a combination thereof,
R$_{ew1}$ and R$_{ew2}$ each independently represents a substituent,
R$_{f1}$ represents a halogen atom, a perhaloalkyl group, a perhalocycloalkyl group, or a perhaloaryl group, and
R$_{f2}$ and R$_{f3}$ each independently represents a hydrogen atom, a halogen atom, or an organic group, and when $R_{f2}$ and $R_{f3}$ each independently represents an organic group, $R_{f2}$ and $R_{f3}$ may be linked to each other to form a ring.

14. The compound according to claim 13, wherein in the Formula (1M), L represents a linear aliphatic group or an aromatic group.

15. A resin having: a repeating unit represented by Formula (1),

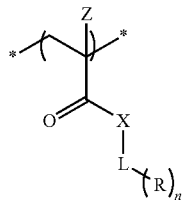
(1)

in Formula (1), Z represents a halogen atom, a group represented by $R_{11}OCH_2$—, or a group represented by $R_{12}OC(=O)CH_2$—, $R_{11}$ and $R_{12}$ each independently represents a monovalent substituent, X represents an oxygen atom or a sulfur atom, L represents a (n+1)-valent linking group, R represents a group having a group that is decomposed due to the action of an alkali developer to increase solubility in an alkali developer, n represents an integer of 1 or more, and when n is 2 or more, a plurality of R's may be identical to or different from each other, wherein R is represented by Formula (A),

—Y-EWG (A)

in Formula (A), Y represents a carboxylic acid ester group: —COO— or —OCO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—, EWG represents an electron withdrawing group represented by Formula (EW),

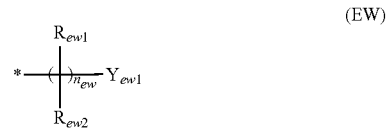
(EW)

in Formula (EW), * represents a bonding site directly connected to the group Y in Formula (A), $n_{ew}$ is the number of repetitions of a linking group represented by $C(R_{ew1})(R_{ew2})$ and represents an integer of 0 or 1, $Y_{ew1}$ represents a halogen atom, a cyano group, a nitro group, a halo(cyclo)alkyl group represented by —$C(R_{f1})(R_{f2})$—$R_{f3}$, a haloaryl group, a sulfinyl group, or a combination thereof, $R_{ew1}$ and $R_{ew2}$ each independently represents a substituent, $R_{f1}$ represents a halogen atom, a perhaloalkyl group, a perhalocycloalkyl group, or a perhaloaryl group, and $R_{f2}$ and $R_{f3}$ each independently represents a hydrogen atom, a halogen atom, or an organic group, and when $R_{f2}$ and $R_{f3}$ each independently represents an organic group, $R_{f2}$ and $R_{f3}$ may be linked to each other to form a ring.

16. The resin composition according to claim 15, wherein in the Formula (1), L represents a linear aliphatic group or an aromatic group.

* * * * *